United States Patent
Itonaga et al.

(10) Patent No.: US 9,049,392 B2
(45) Date of Patent: Jun. 2, 2015

(54) SOLID-STATE IMAGING DEVICE AND ELECTRONIC APPARATUS

(71) Applicant: Sony Corporation, Tokyo (JP)

(72) Inventors: Kazuichiro Itonaga, Tokyo (JP); Shizunori Matsumoto, Kanagawa (JP)

(73) Assignee: SONY CORPORATION (JP)

( * ) Notice: Subject to any disclaimer, the term of this patent is extended or adjusted under 35 U.S.C. 154(b) by 0 days.

(21) Appl. No.: 14/107,839

(22) Filed: Dec. 16, 2013

(65) Prior Publication Data

US 2014/0184864 A1    Jul. 3, 2014

Related U.S. Application Data

(62) Division of application No. 13/609,596, filed on Sep. 11, 2012, now Pat. No. 8,638,382, which is a division of application No. 12/684,445, filed on Jan. 8, 2010, now Pat. No. 8,314,870.

(30) Foreign Application Priority Data

Jan. 15, 2009    (JP) .................................. 2009-006892

(51) Int. Cl.
| H04N 5/374 | (2011.01) |
| H01L 27/146 | (2006.01) |
| H04N 5/357 | (2011.01) |
| H04N 5/3745 | (2011.01) |
| H04N 9/04 | (2006.01) |

(52) U.S. Cl.
CPC .......... *H04N 5/374* (2013.01); *H01L 27/14603* (2013.01); *H01L 27/14607* (2013.01); *H01L 27/14609* (2013.01); *H01L 27/14625* (2013.01); *H01L 27/14632* (2013.01); *H01L 27/14643* (2013.01); *H01L 27/14647* (2013.01); *H04N 5/357* (2013.01); *H04N 5/3745* (2013.01); *H04N 9/045* (2013.01); *H01L 27/14612* (2013.01); *H01L 27/14629* (2013.01); *H01L 27/14641* (2013.01)

(58) Field of Classification Search
USPC ................ 257/288–293; 250/208.1; 348/266, 348/272–283, 294–324, 332
See application file for complete search history.

(56) References Cited

U.S. PATENT DOCUMENTS

| 6,657,665 | B1 * | 12/2003 | Guidash | 348/308 |
| 7,321,110 | B2 * | 1/2008 | Okita et al. | 250/208.1 |
| 7,417,273 | B2 * | 8/2008 | Inoue et al. | 257/292 |
| 7,443,437 | B2 * | 10/2008 | Altice et al. | 348/296 |
| 8,111,311 | B2 * | 2/2012 | Iwane | 348/294 |

(Continued)

FOREIGN PATENT DOCUMENTS

| EP | 1017106 | 7/2000 |
| JP | 2004-071931 | 3/2004 |

(Continued)

OTHER PUBLICATIONS

European Search Report for European Patent Application No. 10000118.9 dated Dec. 13, 2013, 3 pages.

(Continued)

*Primary Examiner* — Michael Osinski
(74) *Attorney, Agent, or Firm* — Sheridan Ross P.C.

(57) ABSTRACT

A solid-state imaging device includes a layout in which one sharing unit includes an array of photodiodes of 2 pixels by 4×n pixels (where, n is a positive integer), respectively, in horizontal and vertical directions.

16 Claims, 51 Drawing Sheets

(56) References Cited

U.S. PATENT DOCUMENTS

| | | | |
|---|---|---|---|
| 2004/0159861 A1* | 8/2004 | Mori et al. | 257/223 |
| 2005/0205902 A1* | 9/2005 | Hara et al. | 257/291 |
| 2005/0248675 A1* | 11/2005 | Hashimoto et al. | 348/308 |
| 2006/0027843 A1* | 2/2006 | Ogura et al. | 257/291 |
| 2006/0044439 A1* | 3/2006 | Hiyama et al. | 348/308 |
| 2006/0192234 A1* | 8/2006 | Miyagawa | 257/292 |
| 2006/0249654 A1* | 11/2006 | Silsby et al. | 250/208.1 |
| 2006/0256221 A1* | 11/2006 | Mckee et al. | 348/308 |
| 2008/0029787 A1 | 2/2008 | Watanabe et al. | |
| 2009/0046189 A1* | 2/2009 | Yin et al. | 348/308 |
| 2009/0179238 A1* | 7/2009 | Hara et al. | 257/291 |
| 2009/0219422 A1* | 9/2009 | Takeuchi et al. | 348/300 |
| 2009/0237543 A1* | 9/2009 | Hatano et al. | 348/308 |
| 2010/0118167 A1* | 5/2010 | Johnson | 348/294 |
| 2011/0180689 A1* | 7/2011 | Roy et al. | 250/208.1 |

FOREIGN PATENT DOCUMENTS

| | | |
|---|---|---|
| JP | 2005-302903 | 10/2005 |
| JP | 2006-128383 | 5/2006 |
| JP | 2007-019521 | 1/2007 |
| JP | 2007-180336 | 7/2007 |
| JP | 2008-186894 | 8/2008 |
| JP | 2008-270299 | 11/2008 |
| JP | 2008-294218 | 12/2008 |
| KR | 10-0790582 | 1/2008 |

OTHER PUBLICATIONS

Extended European Search Report for European Patent Application No. 14002649.3, dated Feb. 3, 2015, 5 pages.

* cited by examiner

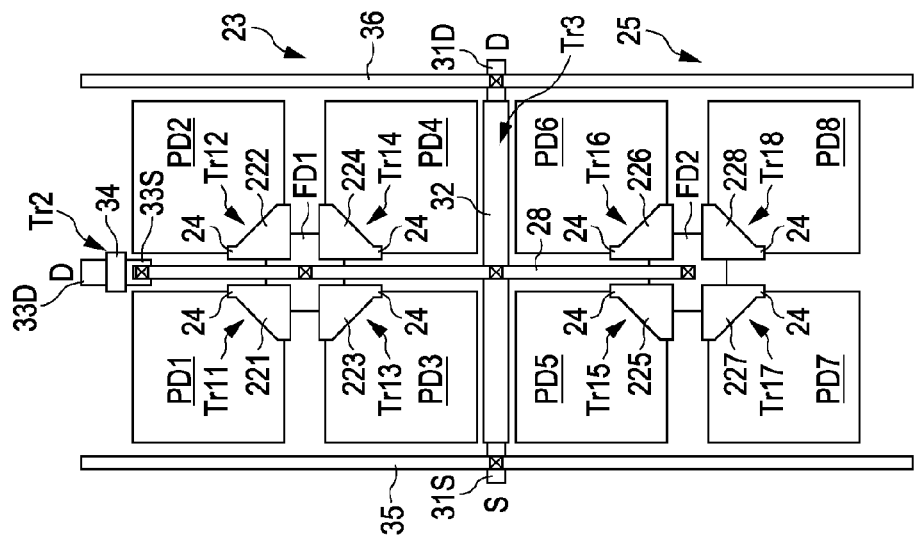
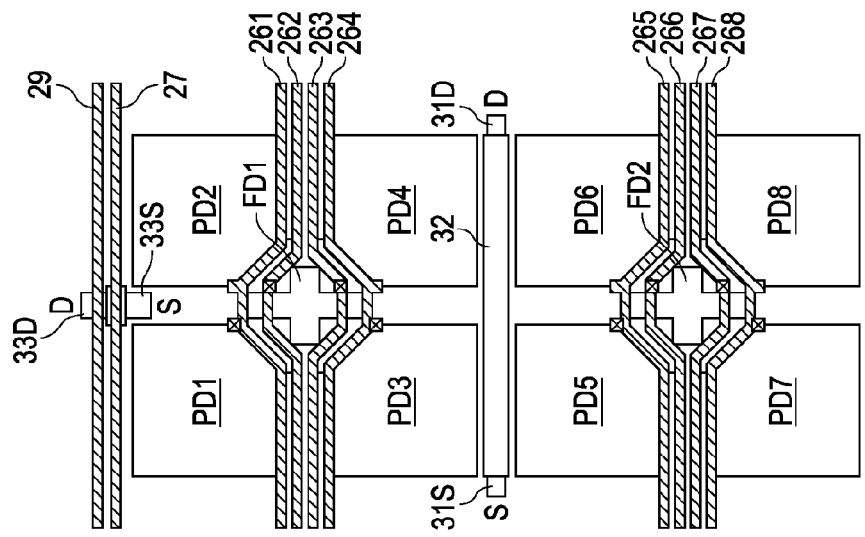
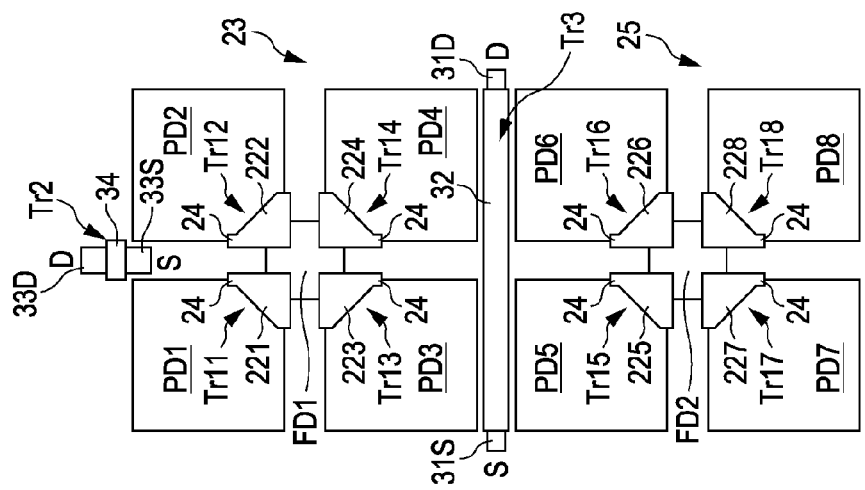

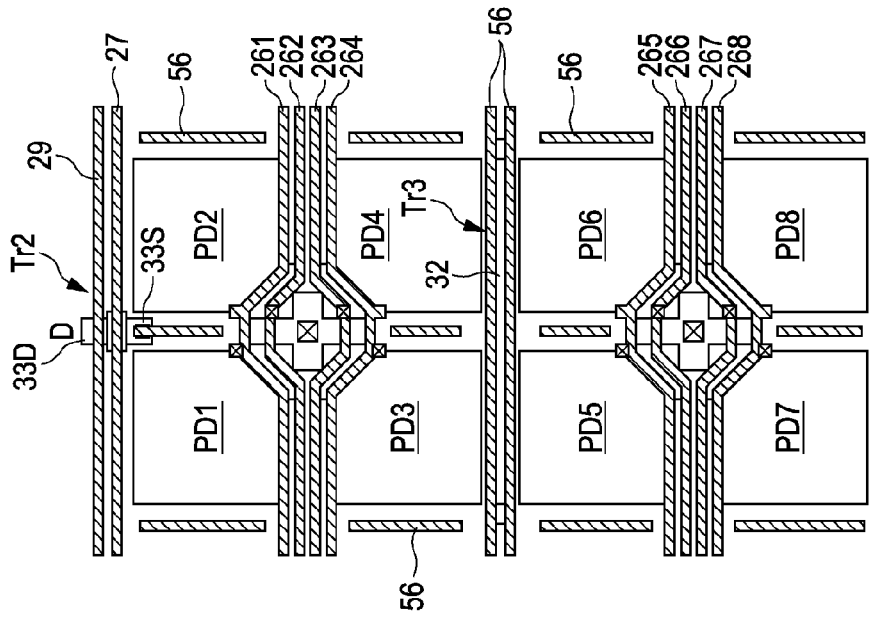
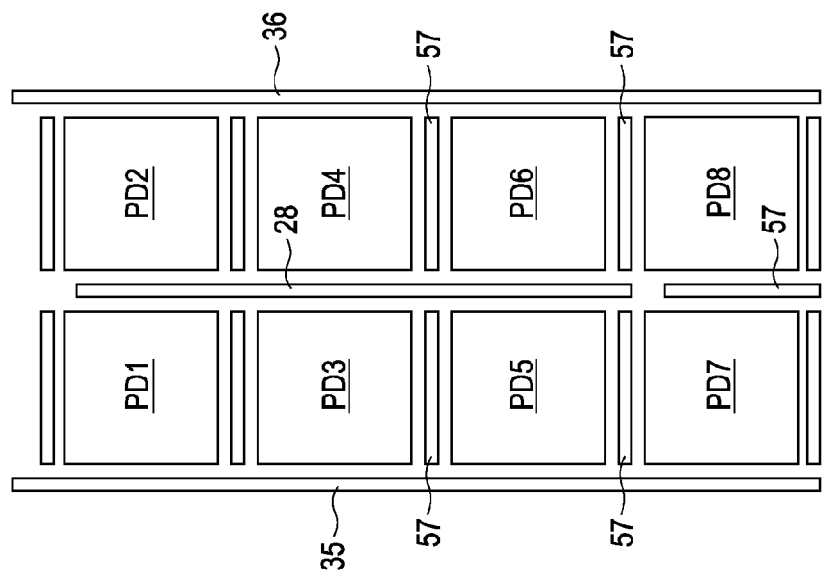

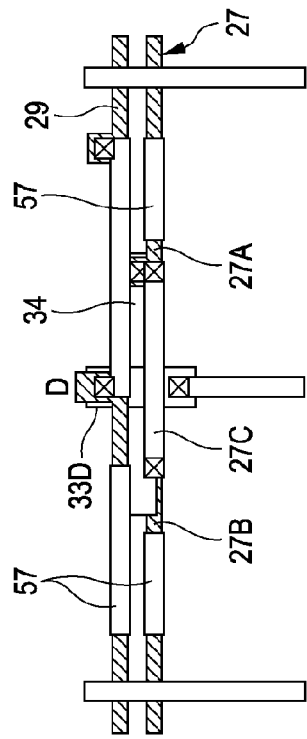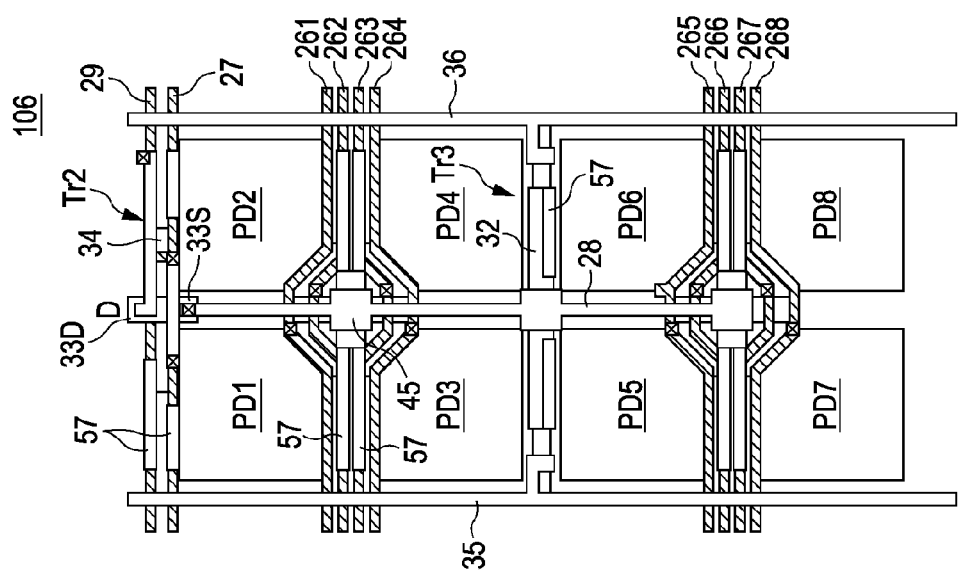

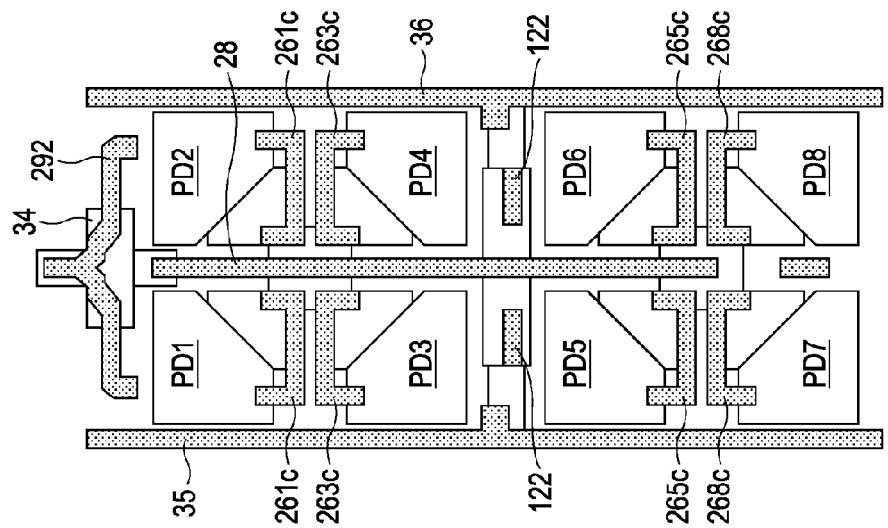
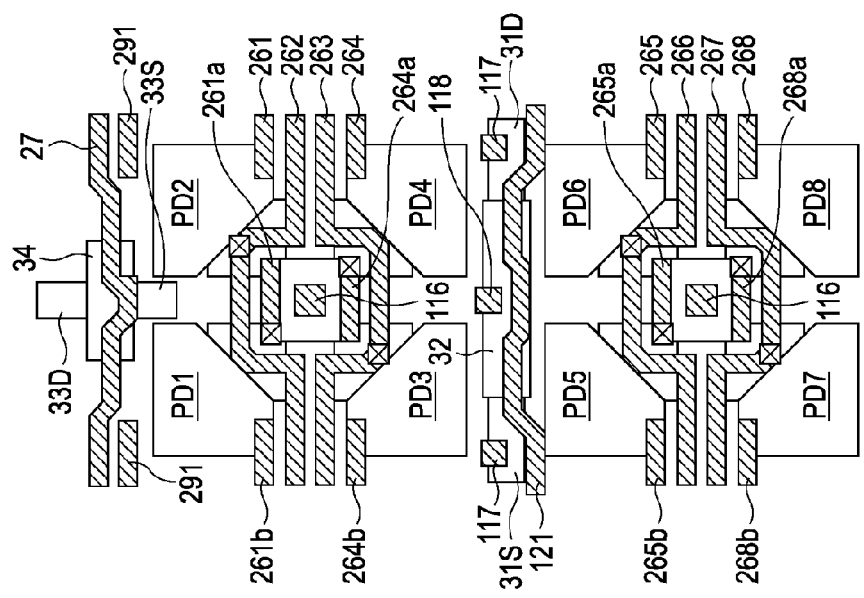
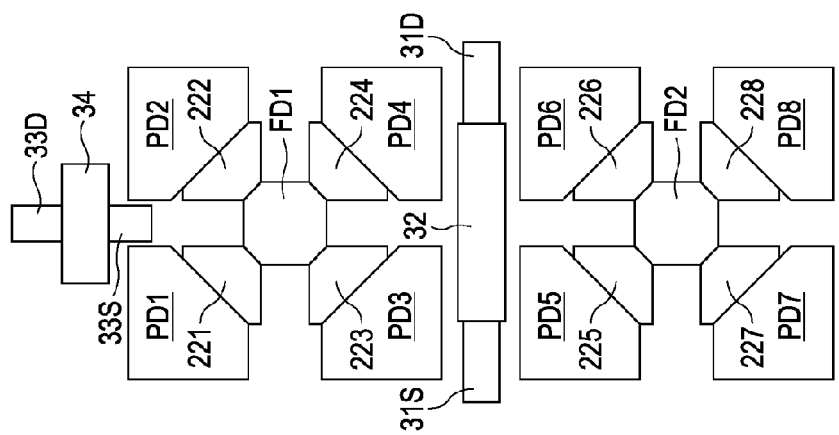

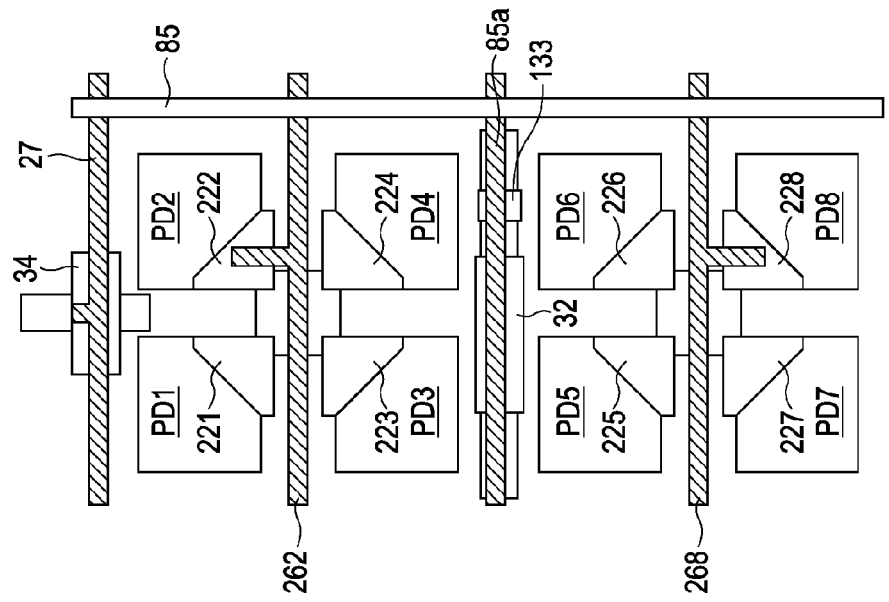
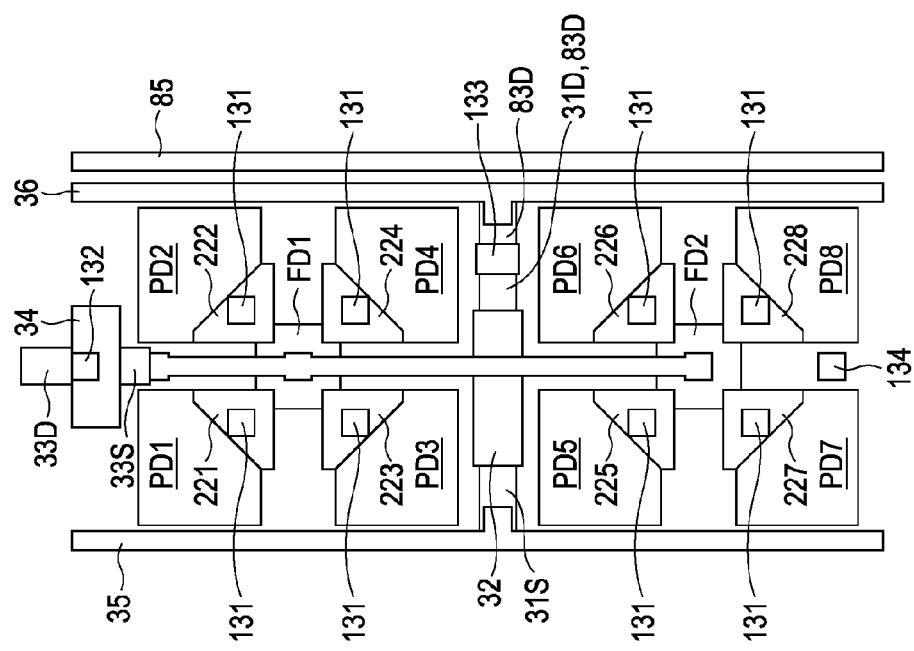

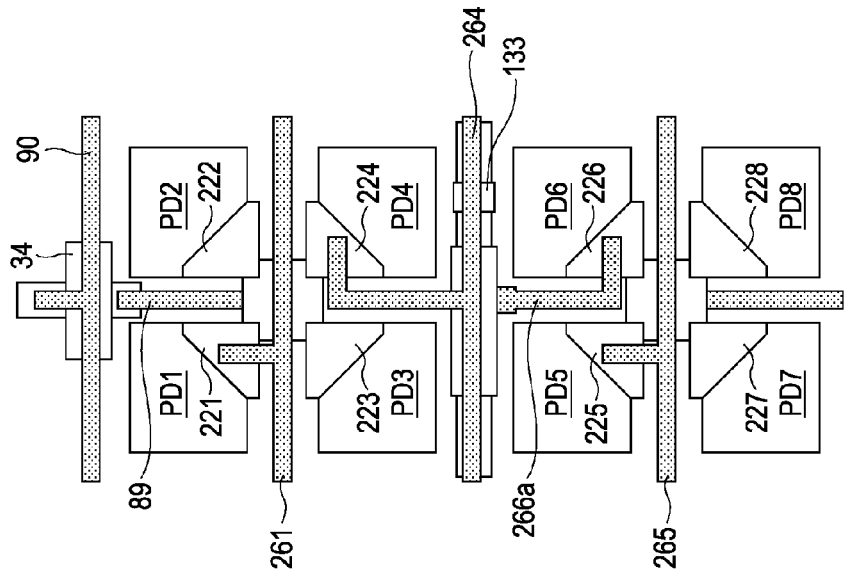
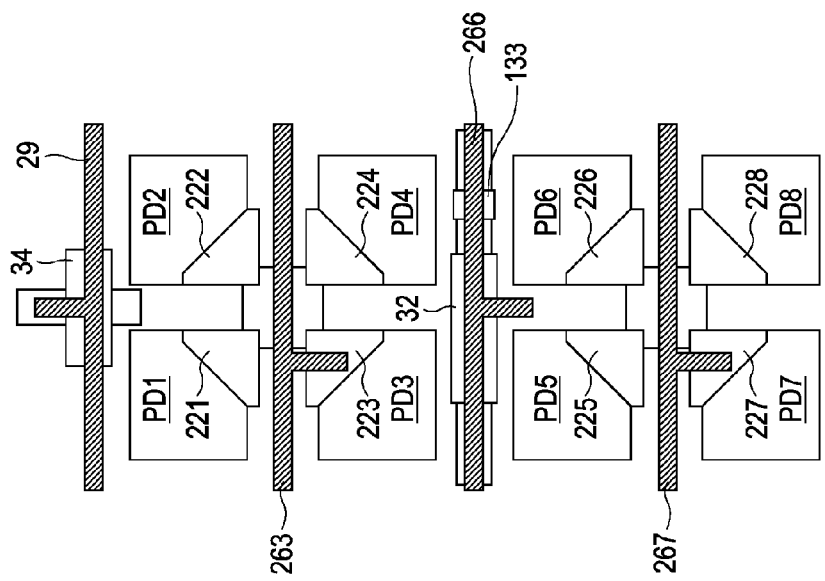

_US 9,049,392 B2_

SOLID-STATE IMAGING DEVICE AND ELECTRONIC APPARATUS

CROSS-REFERENCE TO RELATED APPLICATIONS

This application is a divisional of U.S. patent application Ser. No. 13/609,596, filed Sep. 11, 2012, which is a divisional of U.S. patent application Ser. No. 12/684,445, filed Jan. 8, 2010, now U.S. Pat. No. 8,314,870, which claims priority to Japanese Patent Application Serial No. JP 2009-006892, filed in the Japan Patent Office on Jan. 15, 2009, the entire disclosures of which are hereby incorporated herein by reference.

BACKGROUND OF THE INVENTION

1. Field of the Invention

The present invention relates to an MOS Si substrate and an electronic apparatus, such as a camera, having the solid-state imaging device.

2. Description of the Related Art

Amplification-type solid-state imaging devices represented by MOS image sensors such as CMOS (complementary metal oxide semiconductor) image sensors are known as one type of solid-state imaging devices. Moreover, charge transfer-type solid-state imaging devices represented by CCD (charge coupled device) image sensors are also known. These solid-state imaging devices are broadly used in digital cameras, digital video cameras, and the like. In recent years, as solid-state imaging devices which are mounted on mobile apparatuses, such as camera-incorporated mobile phones or PDAs (personal digital assistants), the MOS image sensors have been used more than the CCD image sensors because the CMOS image sensors are advantageous in terms of lower power supply voltage, smaller power consumption, and the like.

An MOS solid-state imaging device has a configuration in which a plurality of pixels is arranged in a two-dimensional array, wherein each pixel is composed of a photodiode serving as a photoelectric conversion unit and a plurality of pixel transistors. In recent years, with the miniaturization of pixels, in order to reduce the area occupied by the pixel transistors per pixel, a so-called multi-pixel sharing structure is proposed in which a part of the pixel transistors is shared by a plurality of pixels. For example, Japanese Unexamined Patent Application Publication Nos. 2004/172950, 2006/054276, and 2006/157953 describe a solid-state imaging device with 2-pixel sharing structure.

SUMMARY OF THE INVENTION

However, in MOS solid-state imaging devices, it is desirable to achieve a further increase in resolution by miniaturizing the pixels further. However, a further miniaturization of the pixels may lead to a reduction in the aperture area of a light receiving portion and thus sensitivity decreases. Therefore, it is desirable to achieve improvement in sensitivity even when pixels are miniaturized.

It is therefore desirable to provide a solid-state imaging device capable of achieving improvement in sensitivity even when pixels are miniaturized and an electronic apparatus having such a solid-state imaging device.

According to an embodiment of the present invention, there is provided a solid-state imaging device having a layout in which one sharing unit includes an array of photodiodes of 2 pixels by 4×n pixels (where, n is a positive integer), respectively, in horizontal and vertical directions.

In the solid-state imaging device according to the embodiment of the present invention, since one sharing unit includes an array of photodiodes of 2 pixels by 4×n pixels (where, n is a positive integer), respectively, in horizontal and vertical directions, the number of pixel transistors per pixel can be decreased, and thus the aperture area of each of the photodiodes can be increased. Moreover, since one sharing unit includes an array of photodiodes of 2 pixels by 4×n pixels, respectively, in horizontal and vertical directions, the readout wirings can be arranged independently for each pixel, and thus pixel addition can be performed within the floating diffusions. Furthermore, it is possible to decrease the area of the column signal processing circuit.

According to another embodiment of the present invention, there is provided an electronic apparatus including: a solid-state imaging device; an optical system that guides incident light to photodiodes of the solid-state imaging device; and a signal processing circuit that processes output signals from the solid-state imaging device. The solid-state imaging device has a layout in which one sharing unit includes an array of photodiodes of 2 pixels by 4×n pixels (where, n is a positive integer), respectively, in horizontal and vertical directions.

Since the electronic apparatus according to the embodiment of the present invention includes the solid-state imaging device, the number of pixel transistors per pixel can be decreased, and thus the aperture area of each of the photodiodes can be increased. Moreover, since one sharing unit includes an array of photodiodes of 2 pixels by 4×n pixels, respectively, in horizontal and vertical directions, the pixel addition can be performed within the floating diffusions, and the area of the column signal processing circuit can be reduced.

According to the solid-state imaging device of the embodiment of the present invention, since the aperture area of the photodiode can be increased, it is possible to achieve improvement in sensitivity even when the pixels are miniaturized.

According to the electronic apparatus of the embodiment of the present invention, since the aperture area of the photodiode in the solid-state imaging device can be increased, it is possible to achieve improvement in sensitivity even when the pixels are miniaturized. Therefore, it is possible to provide a high-quality electronic apparatus.

BRIEF DESCRIPTION OF THE DRAWINGS

FIGS. 3A to 3C are exploded planar layout diagrams of one sharing unit according to Embodiment 1.

FIGS. 15A and 15B are layout diagrams of one sharing unit in a pixel portion of a solid-state imaging device according to Embodiment 5.

FIGS. 16A and 16B are layout diagrams of one sharing unit in a pixel portion of a solid-state imaging device according to Embodiment 6.

FIGS. 34A to 34C are exploded planar layout diagrams of one sharing unit according to Embodiment 15.

FIGS. 46A and 46B are first exploded planar layout diagrams of one sharing unit according to Embodiment 20.

FIGS. 47C and 47D are second exploded planar layout diagrams of one sharing unit according to Embodiment 20.

DESCRIPTION OF THE PREFERRED EMBODIMENTS

Hereinafter, embodiments of the present invention will be described with reference to the drawings.

Figure 1:
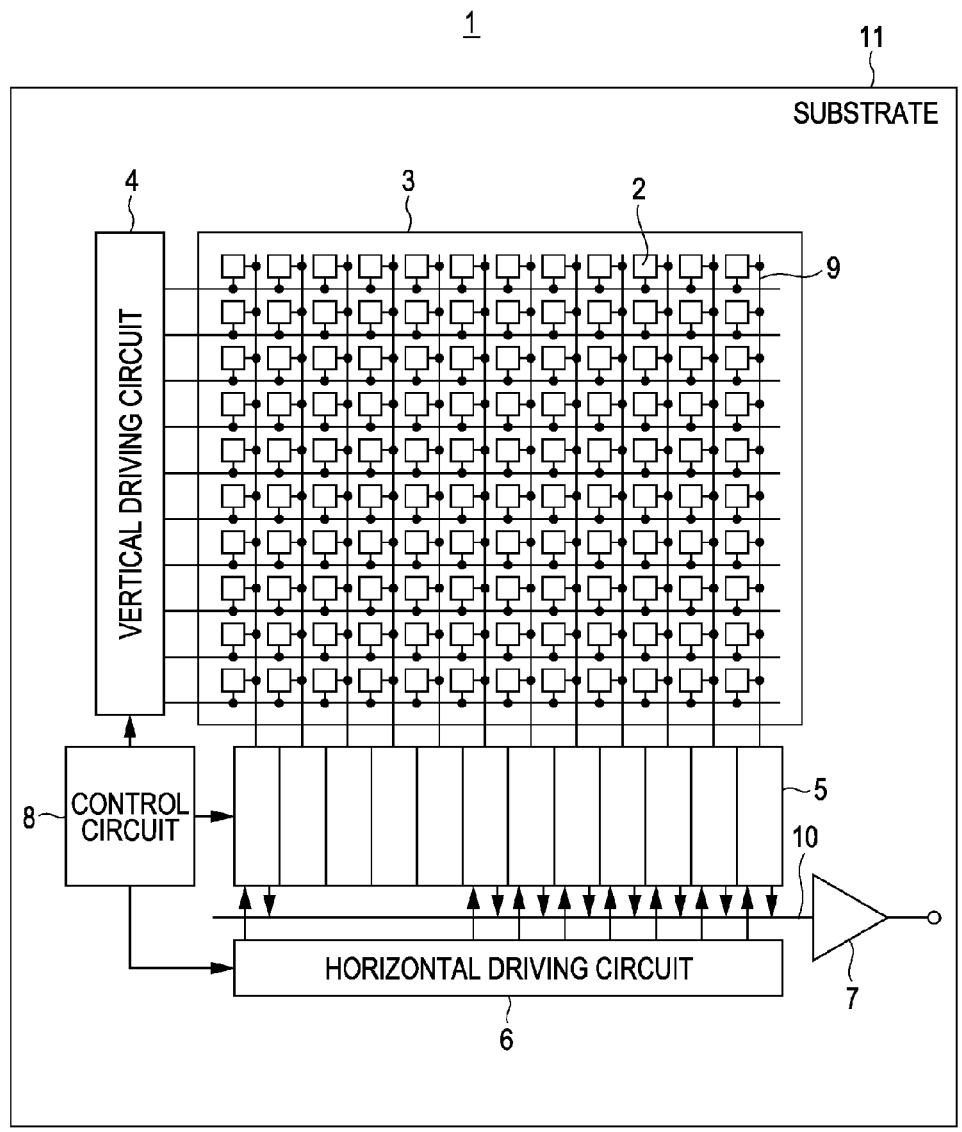
FIG. 1 is a schematic diagram illustrating an exemplary configuration of a solid-state imaging device according to an embodiment of the present invention.

With reference to FIG. 1, an example of a schematic configuration of a solid-state imaging device, i.e., an MOS solid-state imaging device, according to an embodiment of the present invention is illustrated. The solid-state imaging device 1 of this example includes a pixel portion (namely, an imaging region) 3 and a peripheral circuit portion which are provided on a semiconductor substrate 11 (e.g., a silicon substrate). The pixel portion 3 includes pixels 2 which include a plurality of photodiodes serving as photoelectric conversion units and which are regularly arranged in a two-dimensional array. Each pixel 2 includes a photodiode and a plurality of pixel transistors (namely, MOS transistors). The plurality of pixel transistors may be composed of the three transistors, a transfer transistor, a reset transistor, and an amplification transistor, for example. In addition to these transistors, the pixel transistors may be composed of four transistors by adding a select transistor.

The peripheral circuit portion includes a vertical driving circuit 4, column signal processing circuits 5, a horizontal driving circuit 6, an output circuit 7, a control circuit 8, and the like.

The control circuit 8 generates clock signals or control signals serving as the reference signals of the operations of the vertical driving circuit 4, the column signal processing circuits 5, the horizontal driving circuit 6, and the like in accordance with a vertical synchronization signal, a horizontal synchronization signal, and a master clock. The control circuit 8 inputs these signals to the vertical driving circuit 4, the column signal processing circuits 5, the horizontal driving circuit 6, and the like.

The vertical driving circuit 4 is configured by a shift register, for example. The vertical driving circuit 4 selectively scans each pixel 2 of the pixel portion 3 sequentially in a vertical direction in units of rows and supplies a pixel signal to a column signal processing circuit 5 via a vertical signal line 9. The pixel signal is based on signal charges generated corresponding to the amount of light received, for example, by the photodiode serving as a photoelectric conversion element of each pixel 2.

The column signal processing circuits 5 are provided, for example, for each column of the pixels 2 and perform signal processing such as noise removal for each pixel column on signals output from pixels 2 of one row using a signal from a black reference pixel (which is formed around an effective pixel region). Specifically, the column signal processing circuits 5 perform signal processing such as CDS for removing fixed pattern noise inherent to the pixels 2 or signal amplification. A horizontal select switch (not illustrated) is connected between an output terminal of each of the column signal processing circuits 5 and a horizontal signal line 10.

The horizontal driving circuit 6 is configured by a shift register, for example, and sequentially selects each of the column signal processing circuits 5 by sequentially outputting horizontal scanning pulses and outputs the pixel signals from each of the column signal processing circuits 5 to the horizontal signal line 10.

The output circuit 7 performs signal processing on signals which are sequentially supplied from each of the column signal processing circuits 5 via the horizontal signal line 10 and outputs the processed signals.

When the above-described solid-state imaging device 1 is applied to a front-illuminated solid-state imaging device, a plurality of wiring layers including a plurality of layers of wiring is formed above the pixel portion 3 and the peripheral circuit portion via an interlayer insulating film. In the pixel portion 3, an on-chip color filter is formed on the plurality of wiring layers via a planarization film, and an on-chip microlens is formed thereon.

When the solid-state imaging device 1 is applied to a back-illuminated solid-state imaging device, the plurality of wiring layers is not formed on a back surface on the side of a light incidence surface (namely, a light receiving surface). Instead of this, the plurality of wiring layers is formed on a front surface side opposite to the light receiving surface.

The solid-state imaging device according to the embodiment of the present invention has an optimized feature in the layout of the pixel portion 3 when the pixels are miniaturized.

Embodiment 1

Exemplary Configuration of Solid-State Imaging Device

Figure 2:
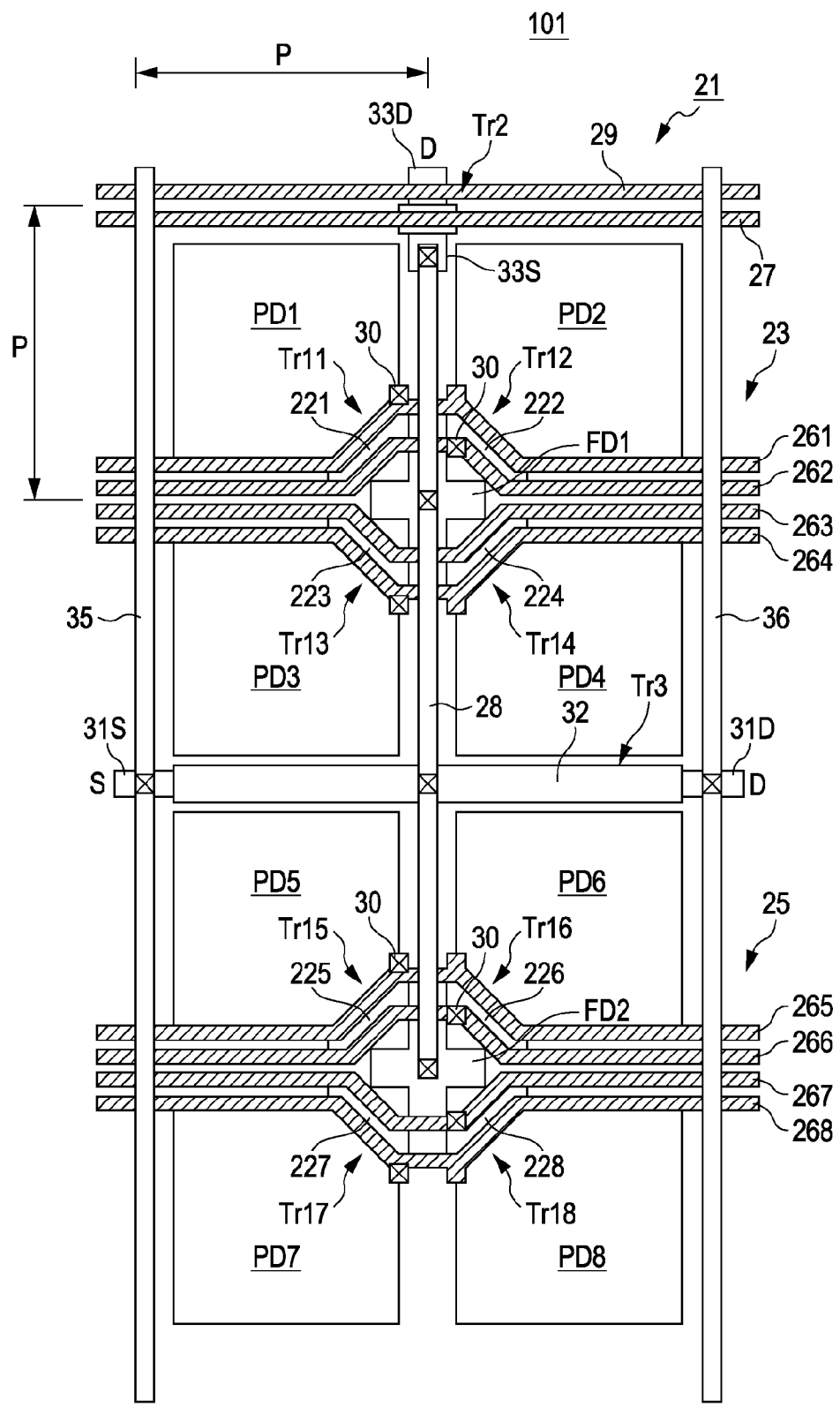
FIG. 2 is a layout diagram of one sharing unit in a pixel portion of a solid-state imaging device according to Embodiment 1.

With reference to FIG. 2, a solid-state imaging device, namely an MOS solid-state imaging device, according to Embodiment 1 of the present invention is illustrated. FIG. 2 illustrates a main part of a layout of a pixel portion. FIGS. 3A to 3C and FIGS. 4 and 5 are exploded planar views for understanding the patterns of first-layer wirings and second-layer wirings. In the following description, a lengthwise or longitudinal direction corresponds to a vertical direction of a pixel portion, and a widthwise or transverse direction corresponds to a horizontal direction of a pixel portion. That is to say, a direction parallel to the vertical signal line is the vertical direction, and a direction vertical to this direction is the horizontal direction.

As illustrated in FIG. 2, a solid-state imaging device 101 according to Embodiment 1 includes a pixel portion 3 in which sharing units 21 are arranged in a two-dimensional array, wherein one sharing unit 21 includes photodiodes PD (PD1 to PD8) of 8 pixels in total (2 pixels by 4 pixels, respectively, in horizontal and vertical directions). That is to say, one sharing unit 21 is laid out in a so-called 8-pixel sharing structure with 2 pixels by 4 pixels, respectively, in horizontal and vertical directions, in which two structural groups are arranged vertically, wherein one structural group has one floating diffusion FD which are shared by four photodiodes PD in total (2 by 2 photodiodes, respectively, in horizontal and vertical directions). In the figure, P represents a pixel pitch.

One sharing unit 21 is composed of eight photodiodes and ten pixel transistors; that is, one sharing unit 21 includes 1.25 pixel transistors per pixel. In this example, the ten pixel transistors are specifically broken down into eight transfer transistors Tr1 (Tr11 to Tr18), one reset transistor Tr2, and one amplification transistor Tr3.

The layout in one sharing unit 21 includes a first structural portion 23, a second structural portion 25, readout transistors Tr11 to Tr18, an amplification transistor Tr3, and a reset transistor Tr2. Moreover, this layout also includes eight readout wirings 26 (261 to 268), a reset wiring 27, and a connection wiring 28. The amplification transistor Tr3 includes a source region 31S, a drain region 31D, and an amplification gate electrode 32. The reset transistor Tr2 includes a source region 33S, a drain region 33D, and a reset gate electrode 34.

The first structural portion 23 includes four photodiodes PD1, PD2, PD3, and PD4, and four readout gate electrodes 221 to 224 and one first floating diffusion FD1 which are respectively provided so as to correspond to the four photodiodes PD1 to PD4 (see FIG. 3A). The photodiodes PD1 to PD4, the first floating diffusion FD1, and the readout gate electrodes 221 to 224 form readout transistors Tr11 to Tr14, respectively.

The first structural portion 23 on the upper side includes the four photodiodes PD1 to PD4 which are approximately square in shape and are arranged in two vertical and two horizontal rows with a predetermined spacing therebetween (e.g., equal vertical and horizontal spacing). One first floating diffusion FD1 is formed at the central region which is surrounded by the four photodiodes PD1 to PD4. The corresponding readout gate electrodes 221 to 224 are formed at opposing corner portions of the four photodiodes PD1 to PD4 so as to contact the first floating diffusion FD1. Each of the readout gate electrodes 221 to 224 is approximately triangular or trapezoidal in shape with a partially protruding portion 24, wherein a bottom side thereof is positioned close to the corresponding photodiode PD and an apex side thereof is positioned close to the first floating diffusion FD1. More specifically, the four readout gate electrodes 221 to 224 are identical in shape and are arranged symmetrically.

The second structural portion 25 includes four photodiodes PD5, PD6, PD7, and PD8, and four readout gate electrodes 225 to 228 and one second floating diffusion FD2 which are respectively provided so as to correspond to the four photodiodes PD5 to PD8 (see FIG. 3A). The photodiodes PD5 to PD8, the second floating diffusion FD2, and the readout gate electrodes 225 to 228 form readout transistors Tr15 to Tr18, respectively.

Similarly to the first structural portion 23 on the upper side, the second structural portion 25 on the lower side includes the four photodiodes PD5 to PD8 which are approximately square in shape and are arranged in two vertical and two horizontal rows with a predetermined spacing therebetween (e.g., equal vertical and horizontal spacing). One second floating diffusion FD2 is formed at the central region which is surrounded by the four photodiodes PD5 to PD8. The corresponding readout gate electrodes 225 to 228 are formed at opposing corner portions of the four photodiodes PD5 to PD8 so as to contact the second floating diffusion FD2. The readout gate electrodes 225 to 228 have the same shape as the above-described readout gate electrodes 221 to 224. Therefore, the readout gate electrodes 225 to 228 are arranged symmetrically so that bottom sides thereof are positioned close to the corresponding photodiodes PD and apex sides thereof are positioned close to the second floating diffusion FD2.

The eight readout wirings 261 to 268 are connected to the readout gate electrodes 221 to 228 of the readout transistors Tr11 to Tr18, respectively and are independently controlled by independent readout pulses applied thereto. The reset wiring 27 is connected to the reset gate electrode 34 of the reset transistor Tr2 and is supplied with a reset pulse. The connection wiring 28 is connected to the first floating diffusion FD1, the second floating diffusion FD2, the amplification gate electrode 32 of the amplification transistor Tr3, and the source region 33S of the reset transistor Tr2.

Furthermore, the sharing unit 21 includes a power supply wiring 29 connected to the drain region 33D of the reset transistor Tr2, a vertical signal line 35 connected to the source region 31S of the amplification transistor Tr3, and a power supply wiring 36 connected to the drain region 31D of the amplification transistor Tr3.

The amplification transistor Tr3 is formed between the upper first structural portion 23 and the lower second structural portion 25. The amplification transistor Tr3 includes an amplification gate electrode 32, which has a large gate length in the transverse direction, and a source region 31S and a drain region 31D which are formed at both ends of the amplification gate electrode 32. The length in the gate length direction of the amplification gate electrode 32 is formed so as to be larger than a pixel pitch P1. In this example, the length of the amplification gate electrode 32 corresponds to a length of the two horizontal photodiodes PD1 and PD2, namely a dimension close to two pixel pitches.

The reset transistor Tr2 is formed at the center of an upper portion of the upper first structural portion 23. Specifically, the reset transistor Tr2 includes the reset gate electrode 34, which is formed in a corresponding region disposed between the two horizontal photodiodes PD1 and PD2, and the drain region 33D and the source region 33S which are formed so as to sandwich the reset gate electrode 34.

Figure 4:
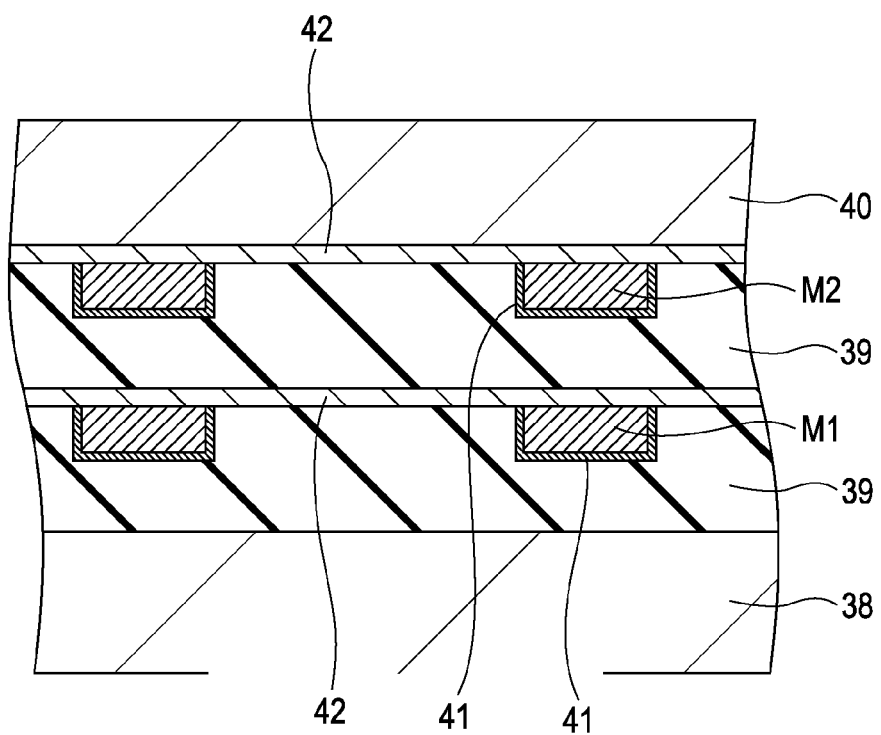
FIG. 4 is a schematic cross-sectional view of an example of a two-layer wiring structure of Embodiment 1.

In this embodiment, the readout wirings 261 to 268, the reset wiring 27, the power supply wiring 29 that is connected to the drain region 33D of the reset transistor Tr2 are formed by first-layer wirings of the wiring with a two-layer structure (hereinafter referred to as a two-layer wiring structure). The two-layer wiring structure is formed by metal wirings M1 and M2 as illustrated in FIG. 4. The first-layer wirings, that is, the respective wirings 261 to 268, 27, and 29 formed by the first-layer metal wirings M1 are wired in the transverse direction (see FIG. 3B).

As illustrated in FIG. 4, the metal wirings M1 and M2 are formed via an interlayer insulating film 39 on a semiconductor substrate 38 on which the photodiodes PD and the pixel transistors Tr1 to Tr3 are formed. Reference numeral 40 designates a planarization film. The metal wirings M1 and M2 are formed by a Cu wiring of which the lower and side surfaces are covered with a barrier metal 41. An SiC film 42 is formed on the surface of the Cu-based metal wirings M1 and M2 so as to prevent diffusion of Cu.

The four readout wirings 261 to 264 on the first structural portion 23 are arranged in a corresponding region disposed between two vertical rows of the photodiodes PD. The upper two readout wirings 261 and 262 are partially bent following the readout gate electrodes 221 and 222 and are arranged in parallel to each other to be connected to the corresponding readout gate electrodes 221 and 222. The lower two readout wirings 263 and 264 are partially bent following the readout gate electrodes 223 and 224 and are arranged in parallel to each other to be connected to the corresponding readout gate electrodes 223 and 224. The upper two readout wirings 261 and 262 connected to the readout gate electrodes 221 and 222 and the lower two readout wirings 263 and 264 connected to the readout gate electrodes 223 and 224 are formed in a symmetrical layout.

The four readout wirings 265 to 268 on the second structural portion 25 are arranged in the same manner. That is to say, the readout wirings 265 to 268 are arranged in a corresponding region disposed between two vertical rows of the photodiodes PD. The upper two readout wirings 265 and 266 are partially bent following the readout gate electrodes 225 and 226 and are arranged in parallel to each other to be connected to the corresponding readout gate electrodes 225 and 226. The lower two readout wirings 267 and 268 are partially bent following the readout gate electrodes 227 and 228 and are arranged in parallel to each other to be connected to the corresponding readout gate electrodes 227 and 228. The upper two readout wirings 265 and 266 connected to the readout gate electrodes 225 and 226 and the lower two readout wirings 267 and 268 connected to the readout gate electrodes 227 and 228 are formed in a symmetrical layout.

The upper and lower, first and second floating diffusions FD1 and FD2, the amplification gate electrode 32, and the source region 33S of the reset transistor Tr2 are connected by a connection wiring 28. The connection wiring 28, the vertical signal line 35 that is connected to the source region 31S of the amplification transistor Tr3, and the power supply wiring 36 that is connected to the drain region 31D of the amplification transistor Tr3 are formed by second-layer wirings of the two-layer wiring structure. The second-layer wirings, that is, the connection wiring 28, the vertical signal line 35, and the power supply wiring 36, which are formed by the second-layer metal wiring M2, are wired in the longitudinal direction (see FIG. 3C).

The four rows of the readout wirings 261 to 264 and the four rows of the readout wirings 265 to 268 which are respectively wired in the transverse direction are arranged at an interwiring spacing which is set to be equal to or smaller than a diffraction limit. Therefore, the region of the four rows of the readout wirings 261 to 264 (and the readout wirings 265 to 268) serves as a light shielding region where light does not substantially pass therethrough. In FIG. 2, reference numeral 30 designates a contact portion. In the contact portion 30, interconnections are achieved via a conductive plug that passes through the interlayer insulating film. In this case, a structure in which the first-layer metal wirings M1 and the second-layer metal wirings M2 are directly connected to target connection regions via the conductive plug, respectively, or a structure in which the second-layer metal wirings M2 are connected to a target connection region via the conductive plug and the first-layer metal wirings M1 is employed.

An element separation region 20 is formed between the photodiodes PD1 to PD8, the amplification transistor Tr3, and the reset transistor Tr2. Although not illustrated in the figure, as this element separation region 20, a flat insulating film is formed in an impurity diffusion region so as to be approximately even with a gate insulating film on the entire surface of the impurity diffusion region, for example. The impurity diffusion region may be a p-type semiconductor region, for example. In this case, an re-channel pixel transistor is used as the pixel transistor, and electrons are used as signal charges.

With reference to FIGS. 3A to 3C, exploded planar views of one sharing unit 21 are illustrated. In FIG. 3A, the layout of the photodiodes PD1 to PD8, the first and second floating diffusions FD1 and FD2, the readout gate electrodes 221 to 228, the readout transistor Tr1, the reset transistor Tr2, and the amplification transistor Tr3 is illustrated. In FIG. 3B, the layout of the readout wirings 261 to 268, the reset wiring 27, and the power supply wiring 29 which are wired in the transverse direction by the first-layer metal wirings M1 is illustrated. In FIG. 3C, the layout of the connection wiring 28, the vertical signal line 35, and the power supply wiring 36 which are wired in the longitudinal direction by the second-layer metal wirings M2 is illustrated.

The connection between the wirings formed by the second-layer metal wirings M2 and the pixel transistor is achieved by the connection which extends from the wirings formed by the second-layer metal wirings M2 via connection portions of the first-layer metal wirings M1 to predetermined portions of the pixel transistor.

The wiring that is disposed on the peripheral circuit portion via the interlayer insulating film is wired in two or more layers. When the number of wiring layers is different from the pixel portion to the peripheral circuit portion, the insulating film on the top-layer wiring in the pixel portion is formed to be thicker than the insulating film on the top-layer wiring in the peripheral circuit portion.

Figure 5:
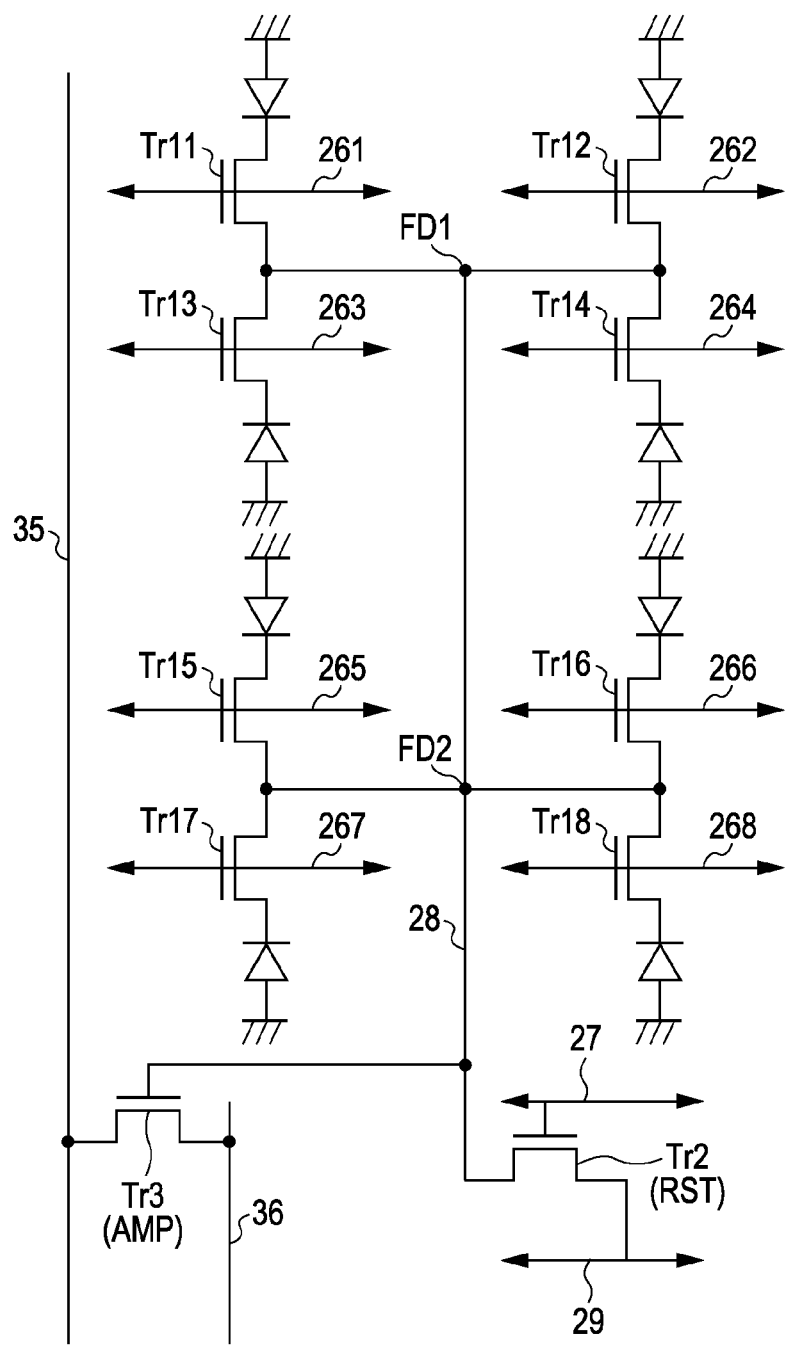
FIG. 5 is an equivalent circuit diagram of one sharing unit having a structure with 8 pixels and 10 transistors in the solid-state imaging device according to Embodiment 1.

With reference to FIG. 5, an equivalent circuit of the structure with eight pixels and ten transistors related to one sharing unit 21 of Embodiment 1 is illustrated. In this circuit configuration, the four photodiodes PD (PD11, PD12, PD13, and PD14) of the first structural portion are connected to the sources of the four readout transistors Tr11, Tr12, Tr13, and Tr14, respectively. The drains of the readout transistors Tr11 to Tr14 are connected to the source of the reset transistor Tr2. The four photodiodes PD (PD15, PD16, PD17, and PD18) of the second structural portion are connected to the sources of the four readout transistors Tr15, Tr16, Tr17, and Tr18, respectively. The drains of the readout transistors Tr15 to Tr18 are connected to the sources of the reset transistors Tr2. The first floating diffusion FD1 between the readout transistors Tr11 to Tr14 and the reset transistor Tr2 is connected to the amplification gate of the amplification transistor Tr3 via the connection wiring 28. The second floating diffusion FD2 between the readout transistors Tr15 to Tr18 and the reset transistor Tr2 is connected to the amplification gate of the amplification transistor Tr3 via the connection wiring 28. The source of the amplification transistor Tr3 is connected to the vertical signal line 35, and the drain of the amplification transistor Tr3 is connected to the power supply wiring 36. The drain of the reset transistor Tr2 is connected to the power supply wiring 29, and the gate of the reset transistor Tr2 is connected to the reset wiring 27 to which the reset pulse is applied. The readout gates of the readout transistors Tr11 to Tr18 are connected to the readout wirings 261 to 268 to which independent row-readout pulses are applied.

The color filters of the four pixels of each of the first structural portion 23 and the second structural portion 25 may be arranged in the Bayer arrangement using the primary colors red, green, and blue (RGB). Alternatively, as the color filter arrangement, various color filter arrangements can be used, such as a color filter arrangement using white W in addition to the primary colors red, green, and blue (RGB) or a color filter arrangement using other complementary colors or a combination of complementary colors and primary colors.

According to the solid-state imaging device of Embodiment 1, since one sharing unit 21 has a structure with eight pixels and ten transistors, the number of pixel transistors per pixel can be decreased, and accordingly, the aperture area of each of the photodiodes PD1 to PD8 can be increased. Moreover, the wirings are formed in only a two-layer wiring structure, the first-layer metal wirings M1 are used for the wirings in the transverse direction, and the second-layer metal wirings M2 are used for the wirings in the longitudinal direction, whereby the aperture area of the photodiode is defined by the vertical and horizontal wirings. This wiring layout is not complex and does not interfere with the aperture of the photodiode. As described above, since the aperture area of the photodiode can be increased, it is possible to improve the sensitivity even when the pixels are miniaturized. Therefore, a solid-state imaging device with high sensitivity and high resolution can be obtained.

The connection wiring 28 which is wired in two wiring layers and is connected to the floating diffusions FD1 and FD2 is formed by the second-layer metal wirings M2 which is distant from the semiconductor substrate. Moreover, the connection wiring 28 and the first-layer metal wirings M1 intersecting the connection wiring 28 meet only at its intersections with the small-width readout wirings 261 to 268. The floating capacitance between the connection wiring 28 and the semiconductor substrate and the floating capacitance between the connection wiring 28 and the readout wirings 261 to 268 are small. Therefore, the floating capacitance connected to the floating diffusions FD1 and FD2 is small, and thus conversion efficiency thereof does not fall even when the pixels are miniaturized. Thus, it is possible to achieve improvement in sensitivity.

In this embodiment, the wirings are formed in a two-layer wiring structure. The wirings of the two-layer wiring structure are formed at positions closer to the photodiodes than the wirings of a four-layer wiring structure. Since the diffracted light generated by the first and second metal wirings M1 and M2 reaches the photodiodes with a small horizontal diffraction angle, light collection efficiency of the photodiodes is improved. Moreover, the two-layer wiring structure enables it to have an increased production yield. As the number of wiring layers increases, the production yield decreases.

In the above example, although the horizontal wirings are formed by the first-layer metal wirings M1 and the vertical wirings are formed by the second-layer metal wirings M2, the vertical wirings may be formed by the first-layer metal wirings M1 and the horizontal wirings may be formed by the second-layer metal wirings M2. However, when the diffraction of light, the light shielding of the floating diffusions FD1 and FD2, and the like are considered, it is preferable that the horizontal wirings including the readout wirings 261 to 268 are formed by the first-layer metal wirings M1 and the vertical wirings are formed by the second-layer metal wirings M2.

Using eight pixels as one sharing unit, the gates of the readout transistors Tr11 to Tr18 can be independently controlled via the readout wirings 261 to 268 which are connected to the readout gate electrodes 221 to 228 of the readout transistors Tr11 to Tr18. Since the gates can be controlled independently, addition of necessary pixels to the eight pixels can be made easy. This pixel addition is performed within the floating diffusions FD1 and FD2 of one sharing unit 21. For example, when the RGB pixels are arranged in the Bayer arrangement, any pixels of the same color in the eight pixels can be added. Alternatively, when four pixels of white (W), red (R), green (G), and blue (B) are arranged, pixels of any two colors (e.g., white (W) and green (G)) in the eight pixels may be added. Besides this, other pixel addition methods are possible. That is, various pixel addition methods are possible such as addition of a pixel in the first structural portion 23 and a pixel in the second structural portion 25, addition of pixels in the first structural portion, or addition of pixels in the second structural portion. Furthermore, pixels on the vertical rows may be thinned out.

Since the pixels are laid out in a sharing unit with 2 pixels by 4 pixels, respectively, in horizontal and vertical directions, pixels are read in units of 2 by 1 pixels, respectively, in row and column directions. Thus, the area of the column signal processing circuit can be decreased by half, and different gains for each color can be achieved in a relatively simple manner. Therefore, a chip area becomes small.

Figure 49:
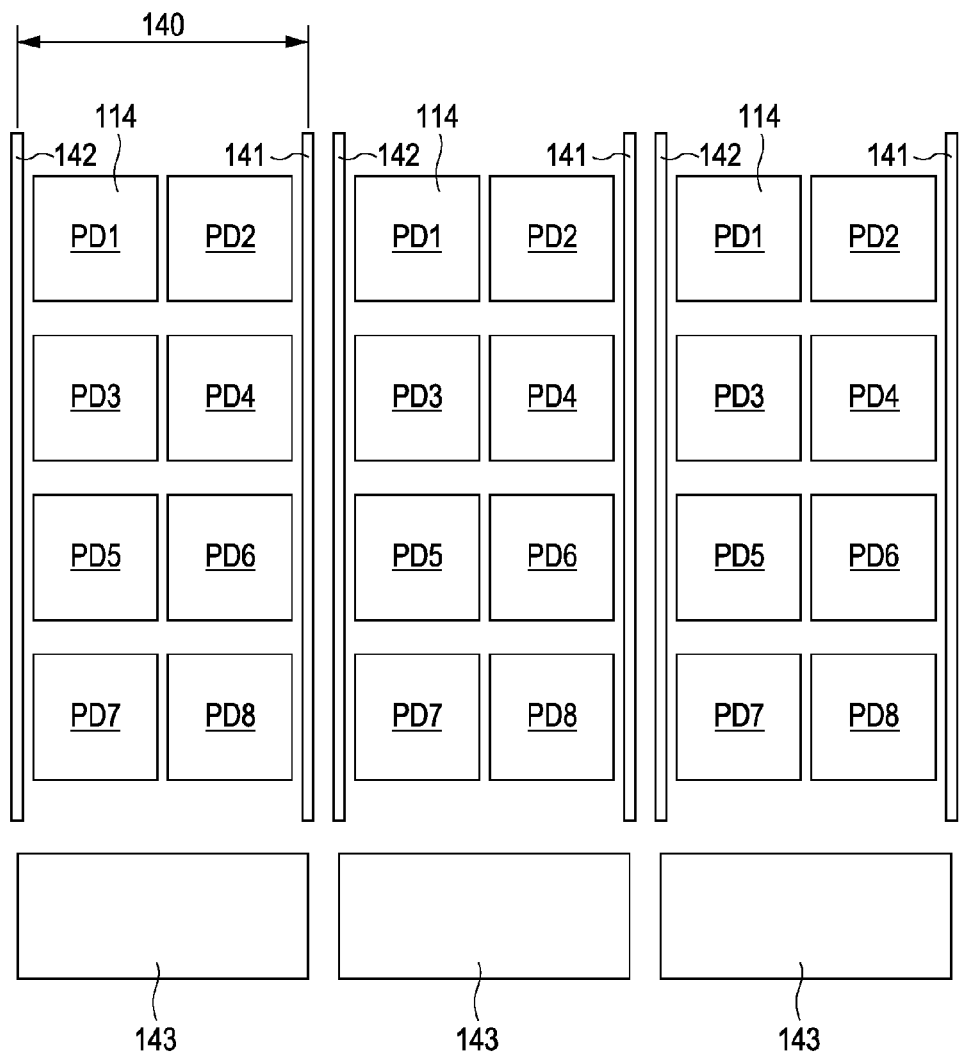
FIG. 49 is a layout diagram used for explaining the advantages of the embodiment of the present invention.
Figure 50:
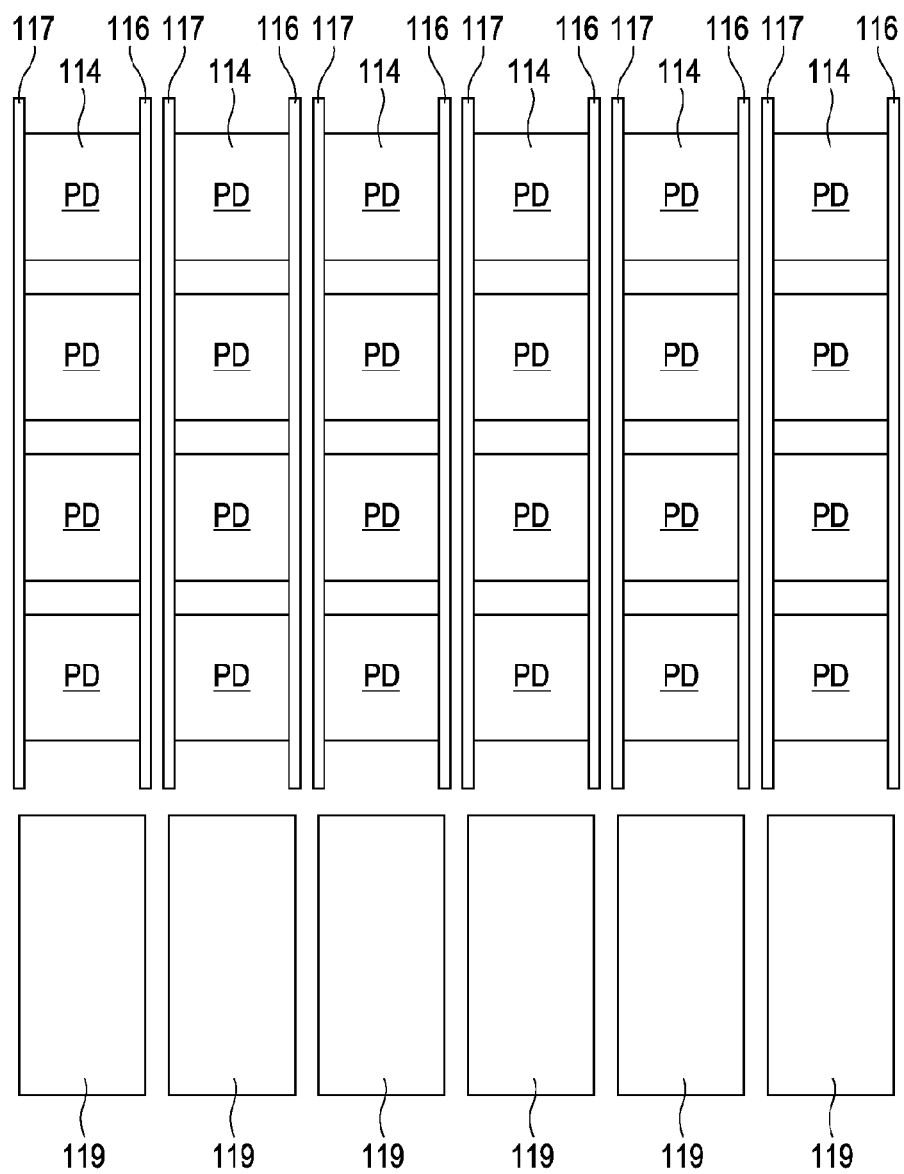
FIG. 50 is a layout diagram of a reference example used for comparison with the advantages of the embodiment of the present invention.

With reference to FIG. 50, a reference example of a solid-state imaging device 118 is illustrated in which a plurality of pixels 114 is arranged in a two-dimensional array, a vertical signal line 116 and a power supply wiring 117 are disposed for every column of the pixels 114, and unit column signal processing circuits 119 are arranged for each column of the pixels. On the contrary, in this embodiment, as illustrated in FIG. 49, one sharing unit 140 is composed of eight pixels 114 in total (2 pixels by 4 pixels, respectively, in horizontal and vertical directions), a vertical signal line 141 and a power supply wiring 142 are provided for each sharing unit, and unit column signal processing circuits 143 are arranged for each sharing unit. That is to say, since the vertical signal line 141 and the power supply wiring 142 which are wired in the longitudinal direction are disposed every two columns of the pixels, the unit column signal processing circuits 143 can be laid out at a pitch (dimension) of approximately twice the pixel pitch, and thus the area in the longitudinal direction is reduced.

On the other hand, in the MOS solid-state imaging devices, when signals are amplified by amplification transistors, 1/f noise (flicker noise) the power spectrum of which is inversely proportional to the frequency f is generated because of a trap level in a gate insulating film of the amplification transistor. This 1/f noise generated in the amplification transistor has a great influence on image quality.

In this embodiment, the length of the amplification gate electrode 32 of the amplification transistor Tr3 is equal to or larger than one pixel pitch; therefore, the gate length is equal to or larger than one pixel pitch, in this example, close to two pixel pitches. Therefore, the 1/f noise can be reduced. The 1/f noise can be expressed using Equation 1 below.

$$\overline{V_n^2} = \frac{K}{C_{ox}} \cdot \frac{1}{W \cdot L} \cdot \int^{fc} \frac{1}{f} df \qquad \text{Equation 1}$$

In the equation, K is a process-dependent coefficient (which is related to electron capture/emission at the interface of a gate insulating film), Cox is a capacitance of the gate insulating film, L is a gate length (channel length) of a transistor, and W is a gate width (channel width). The power spectrum (mean-square noise voltage) of the 1/f noise is given by Equation 1.

As clear from Equation 1 above, since the amplification gate electrode 32 (namely, the gate length) of the amplification transistor Tr3 is long, it can be understood that the 1/f noise is decreased.

Since the drain region 31D of the amplification transistor Tr3 is connected to the power supply wiring 36 which is wired in the vertical direction, the value of current supplied to the amplification transistors on a selected row is not increased but can be maintained at an appropriate value. When the drain region 31D of the amplification transistor is connected to a power supply wiring which is wired in the horizontal direction, it is necessary to supply current to amplification transistors of all the pixels on one selected row, which may necessitate an excessively large driving capability and is thus difficult to implement.

Since sharing units with a 2 by 4 pixel arrangement are arranged in a two-dimensional array, pixels can be read in a dot-sequential manner from the end of the first row. However, when sharing units with a 4 by 2 pixel arrangement are arranged in a two-dimensional array, post-processing is made difficult, and thus, it is difficult to read pixels in a dot-sequential manner.

In this embodiment, it is preferable that the number of wiring layers on the peripheral circuit portion is two or more. Moreover, when the number of wiring layers is different from the pixel portion to the peripheral circuit portion, it is preferable that the insulating film on the top-layer wiring in the pixel portion is formed to be thicker than the insulating film on the top-layer wiring in the peripheral circuit portion. In the peripheral circuit region, the circuit area can be decreased by increasing the number of wiring layers. However, in the pixel region, since it becomes difficult for the photodiode to collect light when as the number of wiring layers increases, it is necessary to decrease the number of wiring layers. Furthermore, even when the number of wiring layers in the pixel portion is small, since the collection efficiency for oblique light decreases if the distance from the top-layer wiring to the on-chip lenses provided for each pixel is increased, it is preferable to decrease the thickness of the insulating film on the top-layer wiring.

Embodiment 2

Exemplary Configuration of Solid-State Imaging Device

Figure 6:
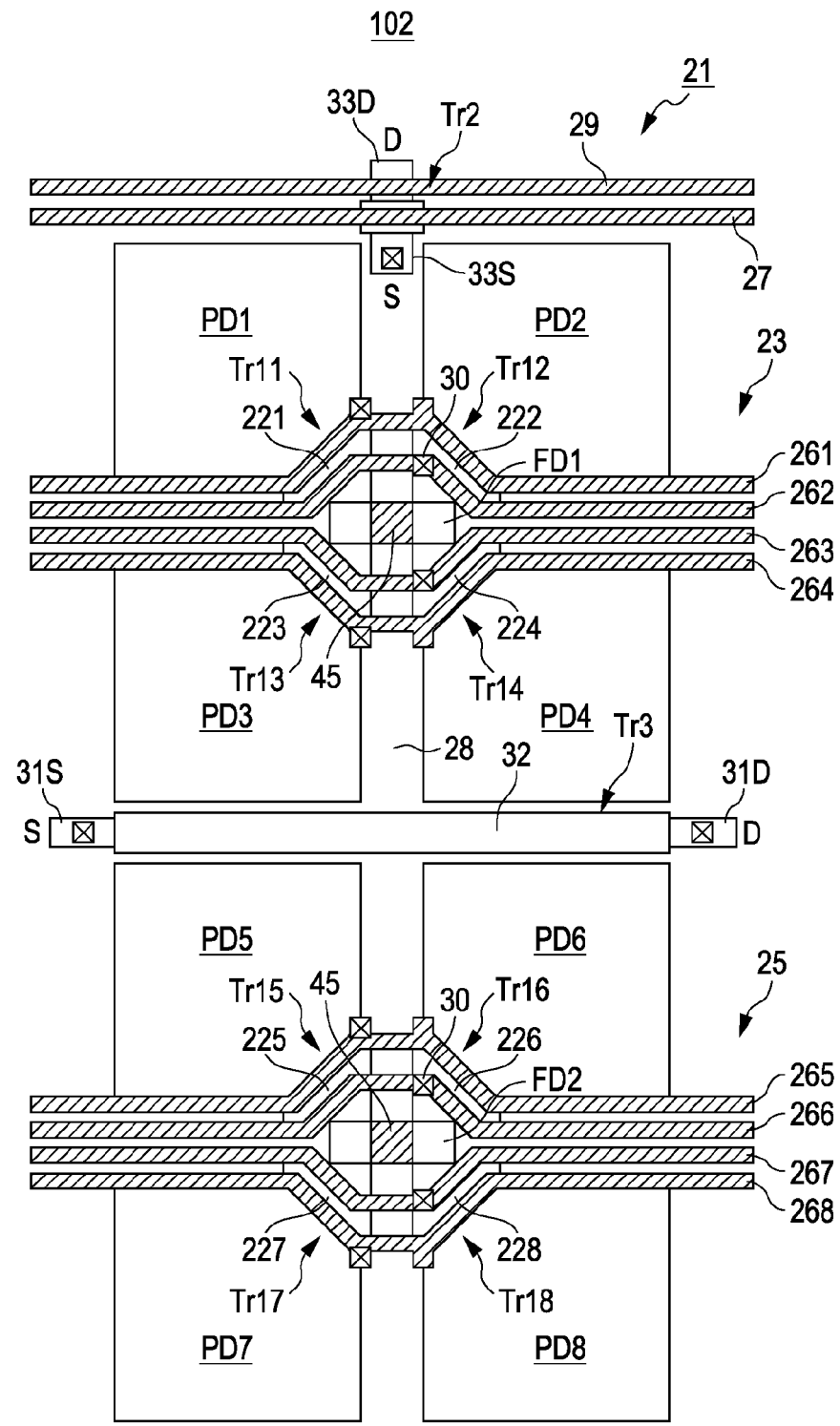
FIG. 6 is a layout diagram of a main part of one sharing unit in a pixel portion of a solid-state imaging device according to Embodiment 2.

With reference to FIG. 6, a solid-state imaging device, namely an MOS solid-state imaging device, according to Embodiment 2 of the present invention is illustrated. FIG. 6 illustrates only the layout of a first-layer metal when the first-layer metal wirings M1 are formed. A solid-state imaging device 102 according to Embodiment 2 includes light shielding portions 45 which are provided for each sharing unit 21 and which are formed by the first-layer metal on each of the floating diffusions FD1 and FD2. That is to say, in the solid-state imaging device, 102 the readout wirings 261 to 268, the reset wiring 27, the power supply wiring 29 that is connected to the drain region of the reset transistor Tr2 are formed by the first-layer metal wirings M1. Moreover, the light shielding portions 45 are formed by the first-layer metal wirings M1 so as to cover the floating diffusions FD1 and FD2. Since other configurations are the same as those described in Embodiment 1, portions corresponding to those in FIG. 2 will be denoted by the same reference numerals, and description thereof will be omitted.

According to the solid-state imaging device 102 of Embodiment 2, the light shielding portions 45 formed by the first-layer metal wirings M1 are formed on the floating diffusions FD1 and FD2 with a narrow spacing from the readout wirings 262 and 263, and 266 and 267, respectively. Due to this configuration, it is possible to achieve more reliable shielding of the floating diffusions FD1 and FD2. In addition to this, the same advantages as those described in Embodiment 1 can be obtained.

In Embodiment 1 described above, with the miniaturization of pixels, when the width of each of the four readout wirings 261 to 264 (or 265 to 268) and the spacing between adjacent wirings are decreased, light becomes unable to pass therethrough. That is to say, when the spacing between the readout wirings is decreased to be equal to or smaller than a diffraction limit, light does not pass through the interwiring spacing. Therefore, the region where these four readout wirings 261 to 264 (or 265 to 268) are arranged performs the role of a light shielding portion. When the pixels are miniaturized further, the spacing between the readout wirings is further decreased to be further smaller than the diffraction limit. Therefore, in Embodiment 1, as the width of each readout wiring and the spacing between the readout wirings decrease, the aperture area of each of the photodiodes PD1 to PD8 can be increased, and thus the sensitivity can be improved.

Figure 7:
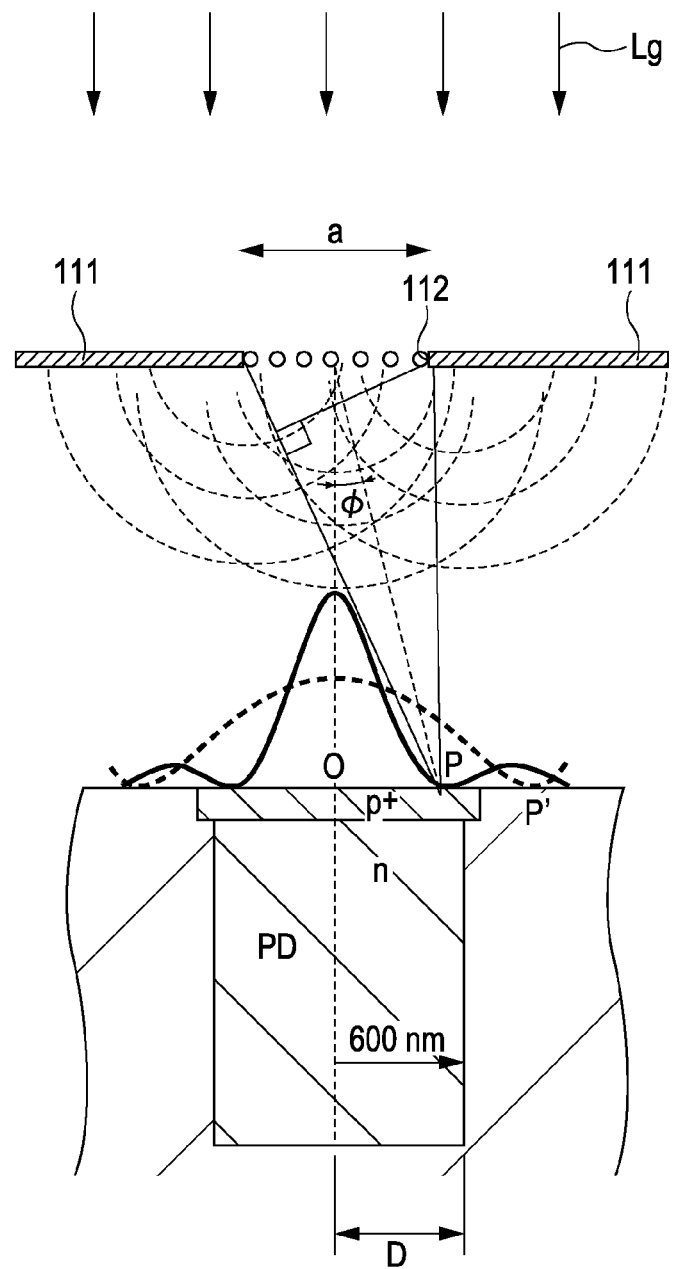
FIG. 7 is a cross-sectional view used for explaining diffraction limit.

The diffraction limit will be described with reference to FIGS. 7 and 8. In FIG. 7, "a" is an aperture width between wirings 111. FIG. 7 illustrates a light intensity distribution when light (in this example, green light having wavelength λ of 530 nm) is passed through an aperture 112 so that a photodiode PD is irradiated with the light. The intensity of the light having reached the photodiode PD peaks at an aperture center O, decreases as it becomes distant from the aperture center, and becomes 0 at a point P. This point P is referred to as a first dark ring. As the aperture 112 is narrowed, the light is diffracted more, so that the distance (OP) in the light intensity distribution from the aperture center O to the first dark ring P increases, and the peak of the light intensity decreases.

Figure 8:
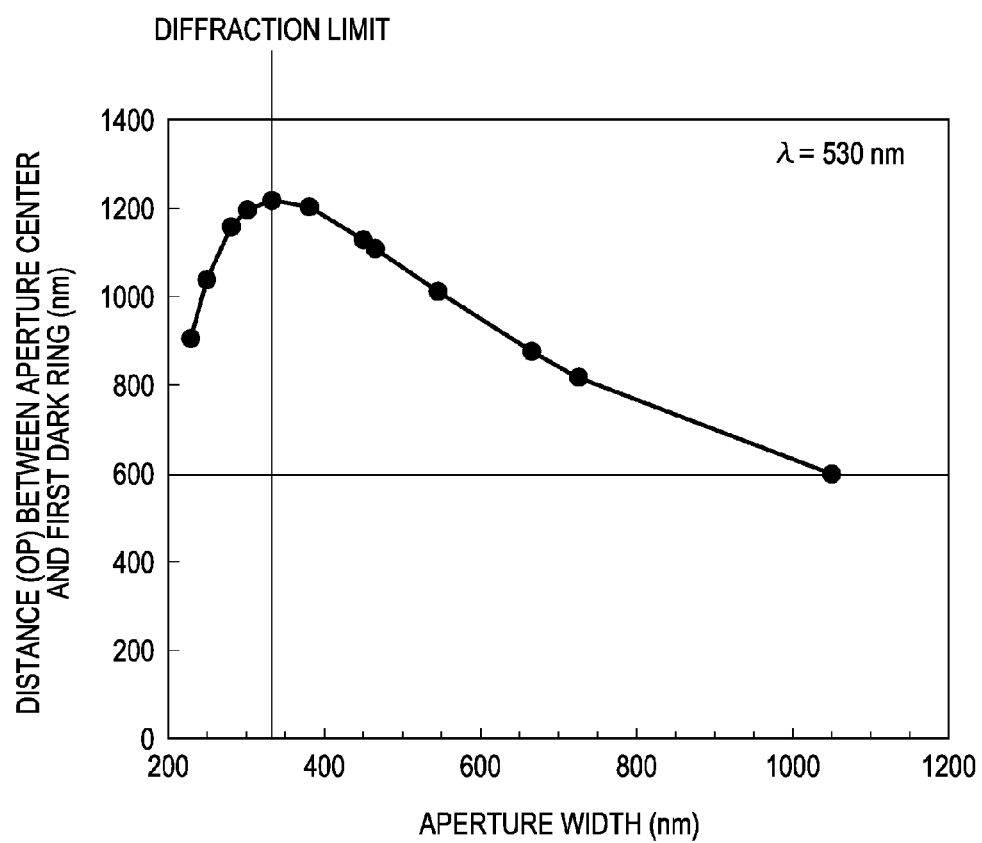
FIG. 8 is a graph used for explaining diffraction limit.

FIG. 8 illustrates the case of increasing the distance (OP). FIG. 8 is a graph when a dimension D from the center to the end of the photodiode PD in FIG. 7 is 600 nm, and green light Lg (wavelength λ: 530 nm) is made incident. The aperture width a at which the distance (OP) becomes the maximum is the diffraction limit. For example, as the distance (OP) becomes larger than ½ of the pixel pitch, it becomes difficult for the photodiode PD to collect light. When the aperture width is equal to or smaller than the diffraction limit, light is diffracted, so that light is not collected by the photodiode PD; that is, light will not enter the photodiode PD.

When light is diffracted with the aperture 112 moved closer to the photodiode PD, the light can be collected by the photodiode PD without increasing the distance (OP).

In the case of a multi-layer wiring structure, since light is diffracted at a lower-layer wiring as the distance (OP) increases, the distance (OP) will increase further and the peak will decrease. Therefore, as the number of wiring layers decreases, the distance (OP) in the intensity distribution of the light having reached the photodiode PD decreases.

Embodiment 3

Exemplary Configuration of Solid-State Imaging Device

Figure 9:
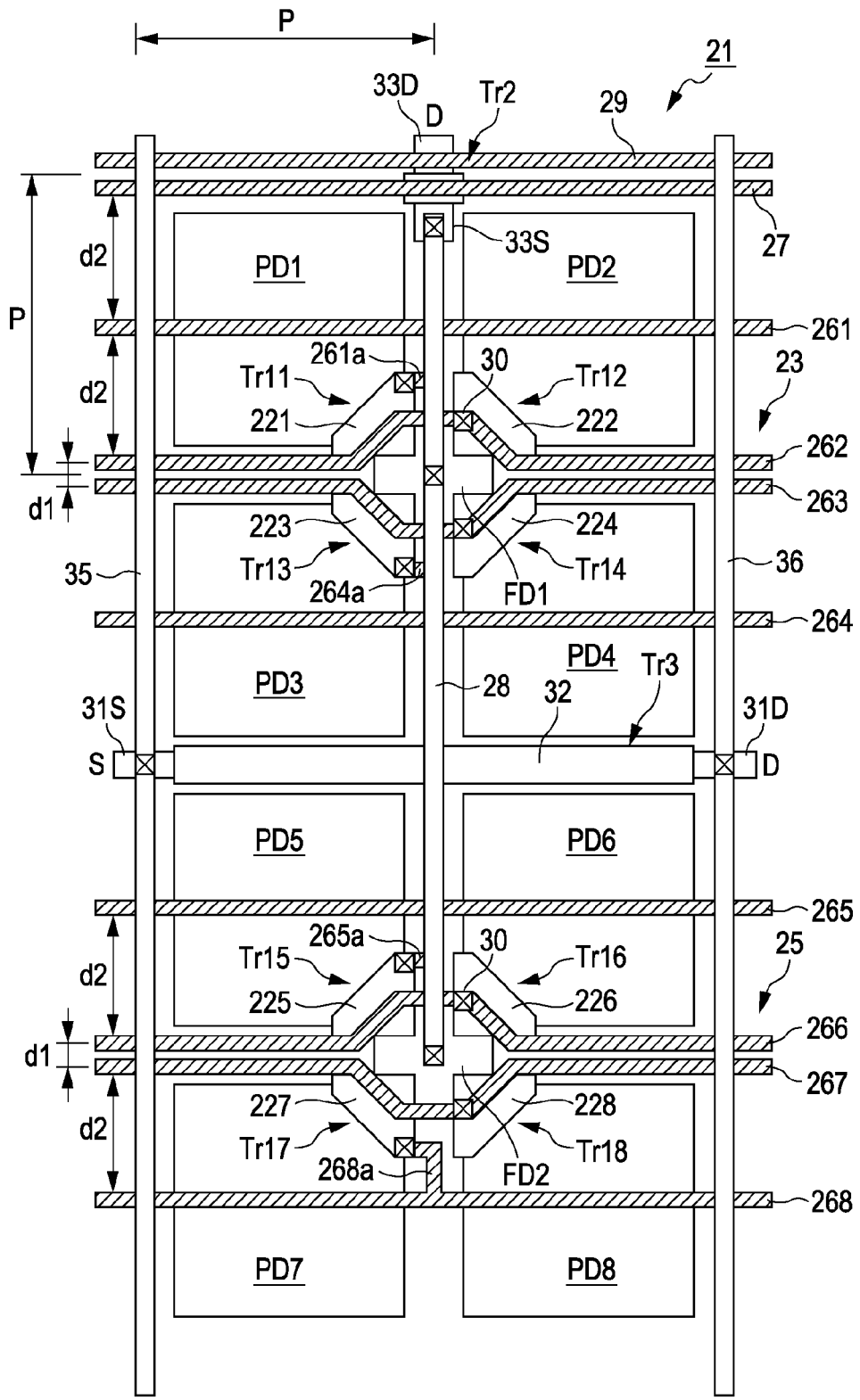
FIG. 9 is a layout diagram of one sharing unit in a pixel portion of a solid-state imaging device according to Embodiment 3.
Figure 10:
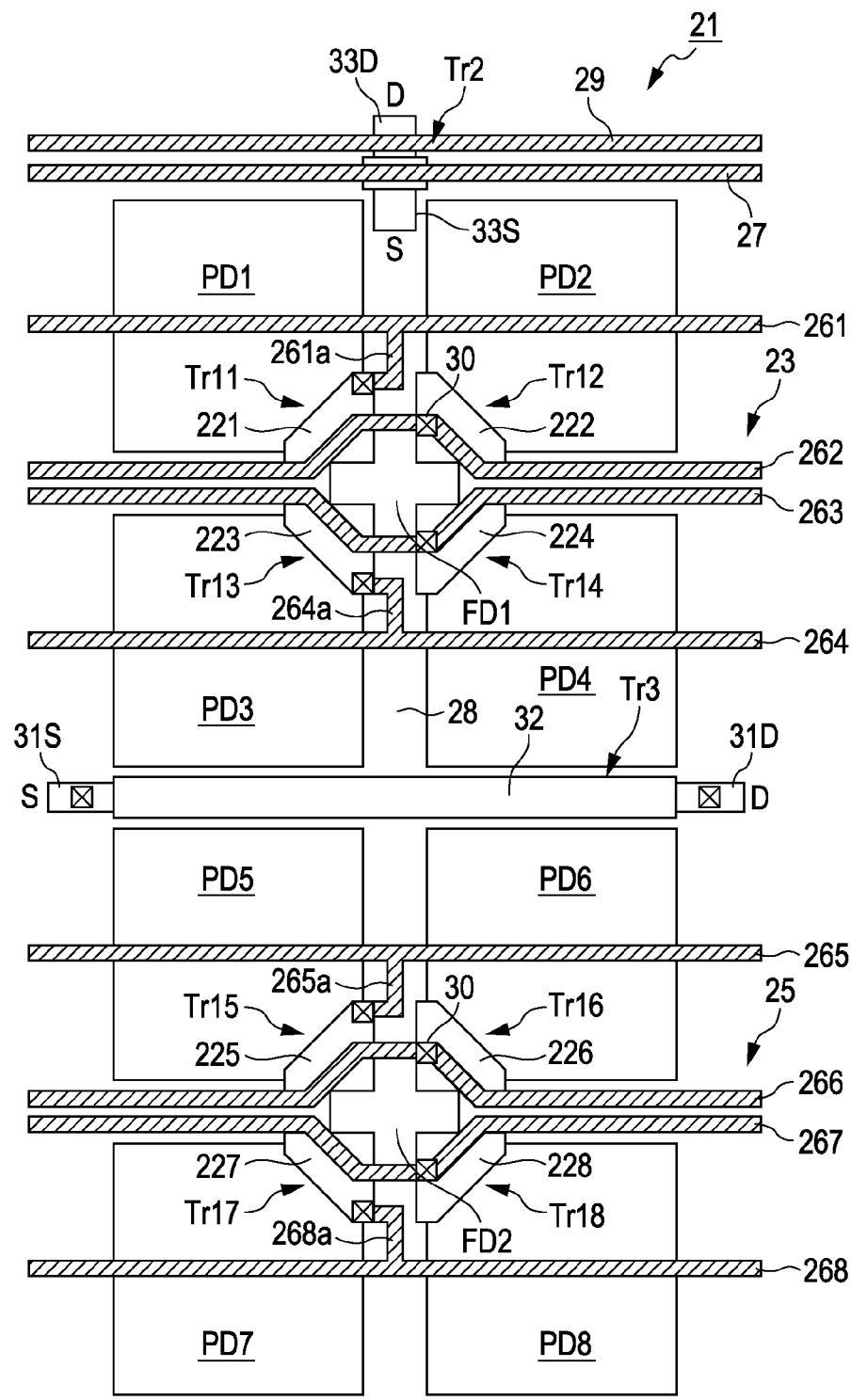
FIG. 10 is a layout diagram of a first-layer wiring of Embodiment 3.
Figure 11:
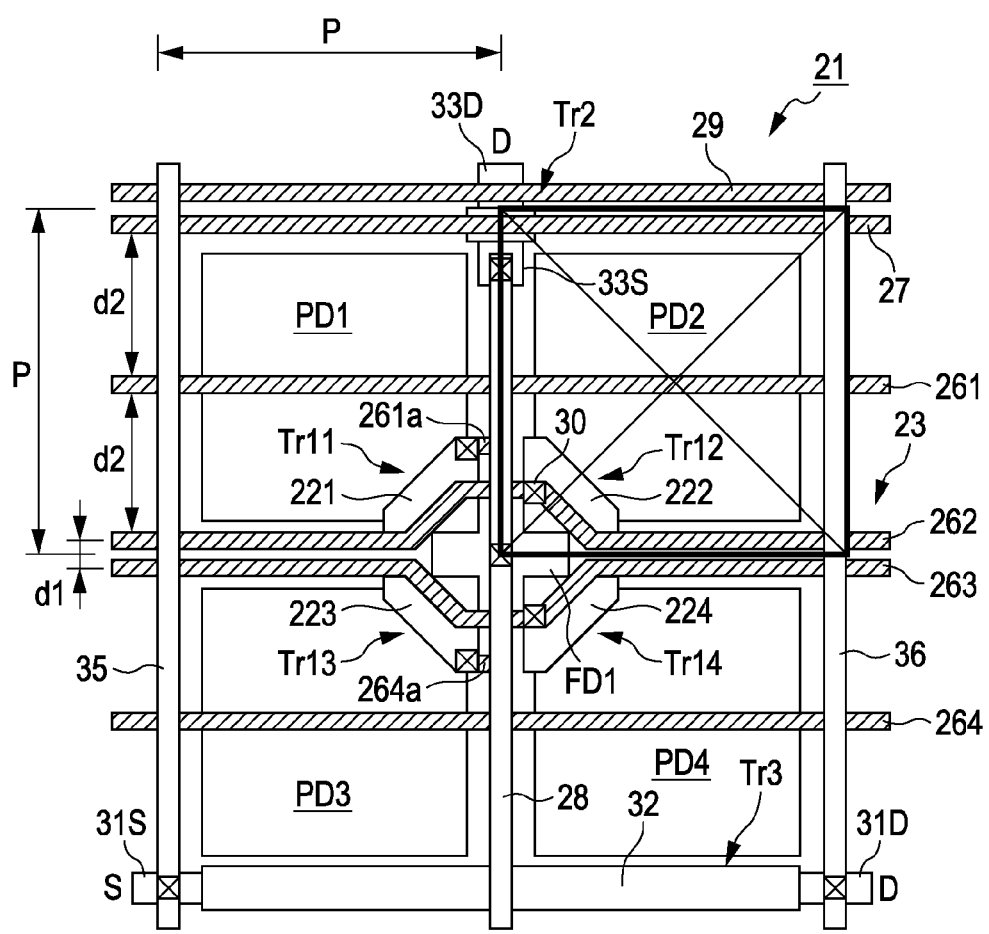
FIG. 11 is a plan view of a main part of FIG. 9.

With reference to FIGS. 9 and 10, a solid-state imaging device, namely an MOS solid-state imaging device, according to Embodiment 3 of the present invention is illustrated. FIG. 9 illustrates a main part of a layout of a pixel portion. FIG. 10 illustrates the pattern of the first-layer wirings. A solid-state imaging device 103 according to Embodiment 3 has one sharing unit 21 in which at least one of the readout wirings in unit pixels is disposed within the regions of the photodiodes PD, and the regions of the photodiodes PD are disposed on both sides of and right below the one readout wiring.

In this example, in one sharing unit 21, among a plurality of readout wirings on the same layer which are disposed within the pixel pitch P, one readout wiring is spaced apart from the other readout wirings. This readout wiring is disposed at a distance d2 from the other readout wirings, wherein the distance d2 is larger than a minimum spacing d1 between the readout wirings on the same layer which occur repeatedly in one sharing unit 21. The minimum spacing d1 is a spacing which is equal to or smaller than a so-called diffraction limit, at which light does not substantially pass therethrough. The distance (spacing) d2 is a distance which exceeds the diffraction limit, at which light is substantially allowed to pass therethrough.

In other words, the solid-state imaging device 103 of this embodiment has a configuration in which one readout wiring in one sharing unit 21 is disposed on the photodiodes PD so as to be spaced from the other readout wirings by a distance exceeding the diffraction limit. Specifically, as illustrated in FIGS. 9 and 10, in the first structural portion 23, among the four readout wirings 261 to 264, the readout wiring 261 is disposed so as to correspond to the position, for example, near the centers of the photodiodes PD1 and PD2, and the readout wiring 264 is disposed so as to correspond to the position, for example, near the centers of the photodiodes PD3 and PD4. In the second structural portion 25, among the four readout wirings 265 to 268, the readout wiring 265 is disposed so as to correspond to the position, for example, near the centers of the photodiodes PD5 and PD6, and the readout wiring 268 is disposed so as to correspond to the position, for example, near the centers of the photodiodes PD7 and PD8.

Figure 12:
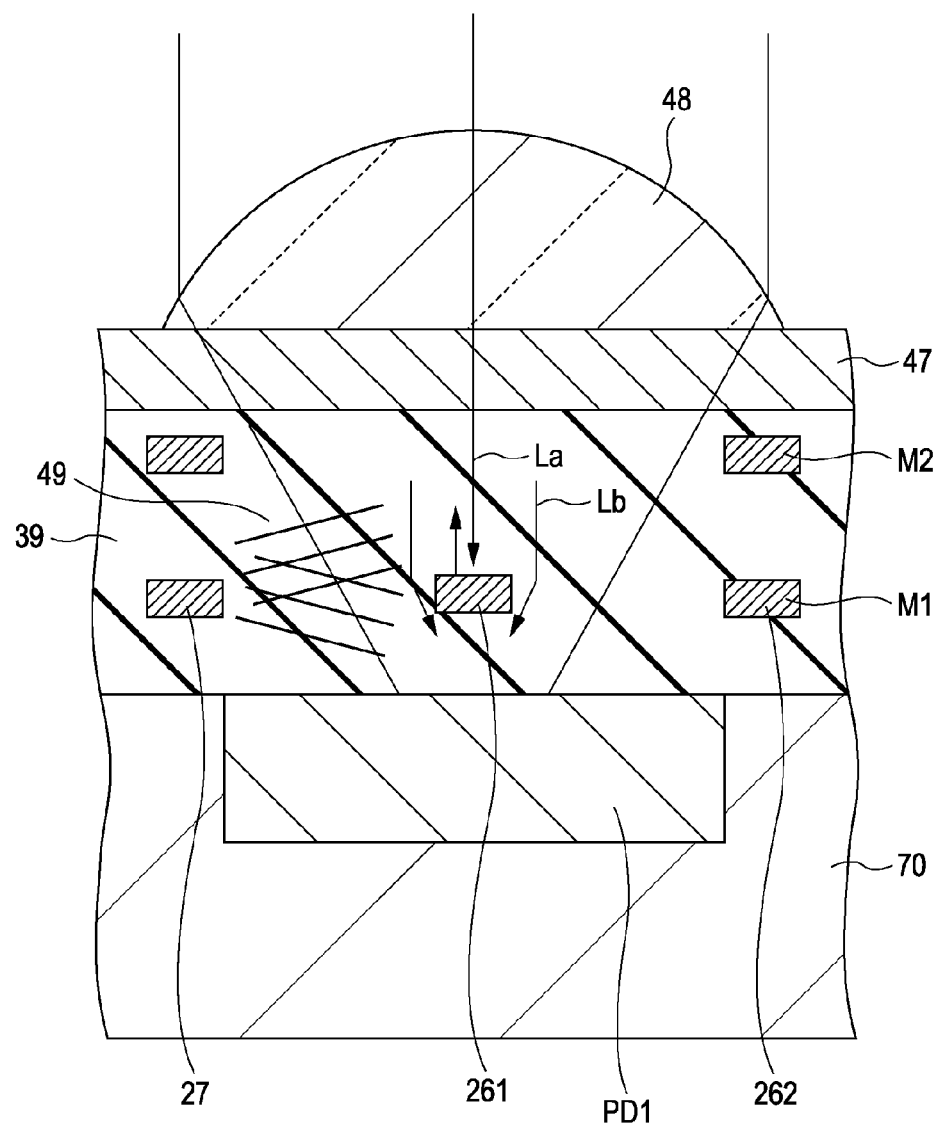
FIG. 12 is an explanatory diagram used for explaining Embodiment 3.

The minimum spacing (distance) d1 between the readout wirings 262 and 263 and the minimum spacing (distance) d1 between the readout wirings 266 and 267 are set to be equal to or smaller than the diffraction limit. The distance d2 between the readout wirings 261 and 262 and the distance d2 between the readout wirings 264 and 263 are set to exceed the diffraction limit. Moreover, the distance d2 between the readout wirings 265 and 266 and the distance d2 between the readout wirings 268 and 267 are set to exceed the diffraction limit. Although the readout wirings 261, 264, 265, and 268 may only have to be disposed on the photodiodes PD so as to be spaced by a distance exceeding the diffraction limit from the other readout wirings, they are preferably disposed near the centers of the photodiodes PD. That is to say, the readout wirings are preferably laid out so that the readout wirings 261, 264, 265, and 268 are disposed at the optical center O of a pixel (or the center of the pixel pitch) as illustrated in FIG. 12.

The readout wiring 261 is connected to the readout gate electrode 221 via an extension portion 261a. The readout wirings 262 and 263 are connected to the readout gate electrodes 222 and 223, respectively. The readout gate electrode 264 is connected to the readout gate electrode 224 via an extension portion 264a. The readout wiring 265 is connected to the readout gate electrode 225 via an extension portion 265a. The readout wirings 266 and 267 are connected to the readout gate electrodes 226 and 227, respectively. The readout gate electrode 268 is connected to the readout gate electrode 228 via an extension portion 268a.

Since other configurations are the same as those described in Embodiment 1, portions corresponding to those in FIG. 2 will be denoted by the same reference numerals, and description thereof will be omitted. However, in this example, although the readout gate electrodes 221 to 228 have a slightly different shape from the shape illustrated in FIG. 2, they can be said to have the same shape.

According to the solid-state imaging device 103 of Embodiment 3, the readout wirings 261, 264, 265, and 268 are shifted so as to be disposed respectively on the photodiodes PD1 and PD2, the photodiodes PD3 and PD4, the photodiodes PD5 and PD6, and the photodiodes PD7 and PD8. Due to this configuration, the aperture area of each of the photodiodes PD1 to PD8 is increased by an amount corresponding to one spacing between the readout wirings, compared to Embodiment 1 illustrated in FIG. 2. At this time, light at the vicinity of the readout wiring near the centers of the photodiodes PD curves towards the backside of the readout wiring because of diffraction to be collected by the photodiodes PD.

This phenomenon will be described with reference to the schematic diagram of FIG. 12. FIG. 12 illustrates the portion of the photodiode PD1. The photodiode PD1 is formed in a semiconductor substrate 70, and the readout wiring 262 and the reset wiring 27, which are formed by the first-layer metal wirings M1, and the second-layer metal wirings M2 are disposed thereon via the interlayer insulating film 39 so as to define an aperture of the photodiode PD1. An on-chip connector housing 47 and an on-chip microlens 48 are formed on this two-layer wiring structure via a planarization film (not illustrated). Furthermore, the readout wiring 261 which is formed by the first-layer metal wirings is disposed near the center of the photodiode PD1.

Light La incident right above the readout wiring 261 is reflected by the readout wiring. However, since the readout wiring 261 disposed near the center of the photodiode PD1 has a very small width, light Lb incident at the vicinity of the readout wiring 261 is diffracted by the readout wiring 261 to curve towards the backside of the readout wiring 261 to be collected by the photodiode PD1. Since the incident light is condensed by the on-chip microlens 48, a wave front 49 propagating towards the center of the photodiode PD1 is dominant. For this reason, when light is diffracted by the readout wiring 261, the light curving towards the center of the backside is dominant.

On the other hand, a solid-state imaging device is known which increases light collection efficiency by using a combination of an on-chip microlens and an inner-layer lens. However, it becomes difficult to form the inner-layer lens as the pixel size is further miniaturized. In Embodiment 3, since one of the readout wirings is disposed near the center of the photodiode PD so that incident light is diffracted by the readout wiring to be collected by the photodiode, the readout wiring at the center performs the role of the inner-layer lens, whereby light collection efficiency can be improved.

In Embodiment 3, since the light collection efficiency is improved, it is possible to achieve further improvement in the sensitivity. In addition to this, the same advantages as those described in Embodiment 1 can be obtained.

Embodiment 4

Exemplary Configuration of Solid-State Imaging Device

Embodiment 4 illustrates another example of one sharing unit 21 in which at least one of the readout wirings in unit pixels is disposed within the regions of the photodiodes PD, and the regions of the photodiodes PD are disposed on both sides of and right below the one readout wiring.

When the pixels are further miniaturized, a configuration may be considered in which the photodiodes of the colors red, green, and blue (RGB) are disposed at different positions in a depth direction thereof, and the photodiodes of the RGB colors are arranged so as to overlap partially each other in a top plan view thereof so as to increase a light receiving area. At this time, since a region where no photodiode is formed exists between photodiodes of adjacent pixels, it is difficult to arrange all of the four readout wirings between pixels. Embodiment 4 provides a solid-state imaging device applicable to such a case.

Figure 13:
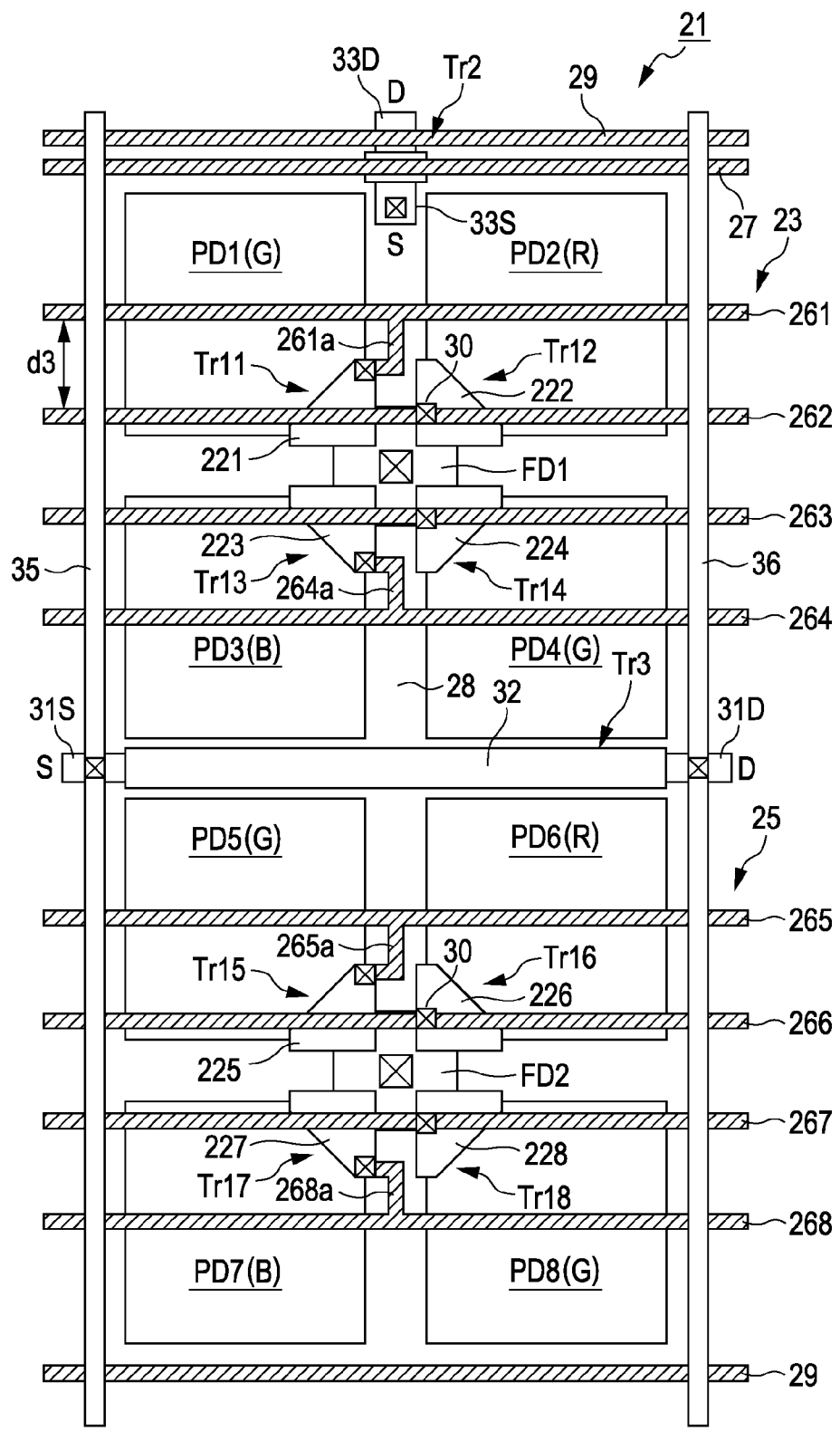
FIG. 13 is a layout diagram of one sharing unit in a pixel portion of a solid-state imaging device according to Embodiment 4.
Figure 14:
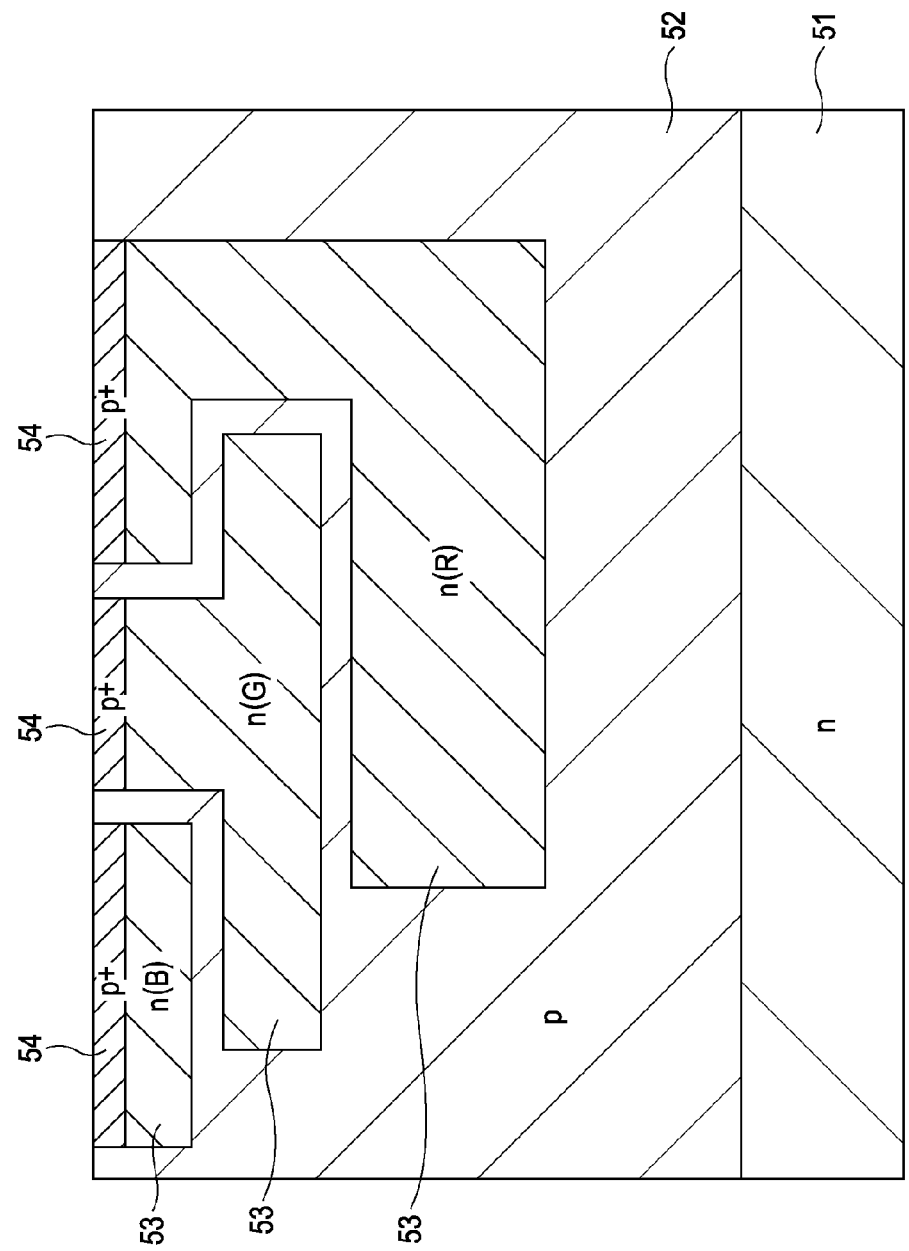
FIG. 14 is a schematic cross-sectional view illustrating an example of a photodiode in the pixel portion of the solid-state imaging device according to Embodiment 4.

With reference to FIGS. 13 and 14, a solid-state imaging device, namely an MOS solid-state imaging device, according to Embodiment 4 of the present invention is illustrated. FIG. 13 illustrates a main part of a layout of a pixel portion. However, on a plan view, the photodiodes are partitioned for each pixel for convenience's sake. FIG. 14 illustrates a configuration of a photodiode in a semiconductor substrate.

As illustrated in FIG. 13, a solid-state imaging device 104 according to Embodiment 4 includes one sharing unit 21 in which all the readout wirings 261 to 268 on the same layer are disposed at a distance d3 from each other in one sharing unit 21, wherein the distance d3 is larger than the minimum spacing d1 (see FIG. 9). In other words, in the solid-state imaging device 104 of this embodiment, the readout wirings 261 to 268 are disposed at a distance exceeding the diffraction limit from each other. When diffraction of light is considered, it is preferable that the readout wirings 261 to 268 are sufficiently spaced from each other to be disposed at an equal pitch (spacing), for example so that the distance between the wiring is maximized. Moreover, adjacent two wirings of the readout wirings 261 to 268 are disposed on the photodiodes PD1 and PD2, the photodiodes PD3 and PD4, the photodiodes PD5 and PD6, and the photodiodes PD7 and PD8, respectively. Although now illustrated in the figure, the readout wirings 261 to 268 are connected to the corresponding readout gate electrodes 221 to 228 via extension portions, respectively, similar to Embodiment 3.

Next, photodiodes PD with a Bayer arrangement, for example, will be described. The photodiodes PDr, PDg, and PDb of the colors red (R), green (G), and blue (B) are formed, for example, in a semiconductor well region 52 of second conductivity type (e.g., p type) which is formed in a semiconductor substrate 51 of first conductivity type (e.g., n type), as illustrated in FIG. 14. The photodiodes PDr, PDg, and PDb are formed by an n-type semiconductor region 53 and a p-type semiconductor region 54 which is formed on the n-type semiconductor region 53.

Since light having a blue wavelength is absorbed in a shallow region, the photodiode PDb of a blue pixel is formed close to a surface side of the semiconductor well region 52. Since light having a green wavelength is absorbed at a deeper position than the light having a blue wavelength, the photodiode PDg of a green pixel is formed so as to extend partially from the surface of the semiconductor well region to a region right below the photodiode PDb of the blue pixel. Since light having a red wavelength is absorbed at a deepest position, the photodiode PDr of a red pixel is formed so as to extend partially from the surface of the semiconductor well region to a region right below the photodiode PDg of the green pixel. In this example, the photodiode PDg of the green pixel and the photodiode PDr of the red pixel are formed so as to pass each other in a depth direction thereof. As illustrated in FIG. 14, since the photodiodes PDr, PDg, and PDb of each pixel are formed so as to overlap each other in a substrate-depth direction, a region where no photodiode is formed does not exist between the photodiodes of adjacent pixels.

Since other configurations are the same as those described in Embodiment 1, portions corresponding to those in FIG. 2 will be denoted by the same reference numerals, and description thereof will be omitted.

According to the solid-state imaging device 104 of Embodiment 4, since the photodiodes of each pixel of the colors red, green, and blue are formed at different positions in the depth direction of the semiconductor substrate 51, a color separation is realized within the semiconductor substrate. That is to say, prevention of a color mixture can be achieved within the semiconductor substrate 51. Moreover, since the readout wirings 261 to 268 which are connected to the readout transistors Tr11 to Tr18 of each pixel are spaced from each other at a distance exceeding the diffraction limit, it is possible to further increase the aperture area of each of the photodiodes PD1 to PD8. The readout wirings 261 to 268 provide the same effects as those described in FIG. 12. Therefore, it is possible to improve the sensitivity even when the pixels are further miniaturized. In addition to this, the same advantages as those described in Embodiment 1 can be obtained.

Embodiment 5

Exemplary Configuration of Solid-State Imaging Device

With reference to FIGS. 15A and 15B, a solid-state imaging device, namely an MOS solid-state imaging device, according to Embodiment 5 of the present invention is illustrated. FIGS. 15A and 15B illustrate a main part of a layout of a pixel portion, respectively, illustrating the patterns of first-layer wirings and second-layer wirings in exploded planar views. A solid-state imaging device 105 according to Embodiment 5 includes dummy wirings which are formed by the first-layer wirings and the second-layer wirings as illustrated in FIG. 15B in order to realize a good symmetry in the wirings of one sharing unit 21. That is to say, by the same first-layer metal wirings M1, the readout wirings 261 to 268, the reset wiring 27, and the power supply wiring 29, which are the horizontal wirings, are formed, and at the same time, divided dummy wirings 56 to which voltage is not applied are formed on both left and right sides of the photodiodes PD1 to PD8. Moreover, by the same second-layer metal wirings M2, the connection wiring 28, the vertical signal line 35, and the power supply wiring 36, which are the vertical wirings, are formed, and at the same time, divided dummy wirings 57 to which voltage is not applied are formed on both upper and lower sides of the photodiodes PD1 to PD8.

Since other configurations are the same as those described in Embodiment 1, portions corresponding to those in FIG. 2 will be denoted by the same reference numerals, and description thereof will be omitted.

According to the solid-state imaging device 105 of Embodiment 5, in addition to the horizontal wirings and the vertical wirings, the dummy wirings 56 and 57, which are formed by the first-layer metal wirings M1 and the second-layer metal wirings M2, respectively, are formed so that the photodiodes PD1 to PD8 are surrounded by these wirings. Due to this configuration, the photodiodes PD1 to PD8 are surrounded by the metal wirings on the same layer with a good symmetry, and thus a color mixture due to diffraction of light can be prevented. In addition to this, the same advantages as those described in Embodiment 1 can be obtained.

Embodiment 6

Exemplary Configuration of Solid-State Imaging Device

With reference to FIGS. 16A and 16B, a solid-state imaging device, namely an MOS solid-state imaging device, according to Embodiment 6 of the present invention is illustrated. FIGS. 16A and 16B illustrates a main part (one sharing unit) of a layout of a pixel portion. Embodiment 6 illustrates another layout in which dummy wirings are disposed.

As illustrated in FIG. 16A, a solid-state imaging device 106 according to Embodiment 6 includes the dummy wirings 57 which are formed by the second-layer metal wirings M2 and are disposed so as vertically to sandwich each of the photodiodes PD1 to PD8. The dummy wirings 57 are disposed to be divided at various positions including positions corresponding to regions on the readout wirings 261, 263, 266, and 267 formed by the first-layer metal wirings M1, a position corresponding to a region on the amplification gate electrode 32, and positions corresponding to regions on the reset wiring 27 and the power supply wiring 29 which are formed by the first-layer metal wirings M1.

Here, the reset wiring 27 formed by the first-layer metal wirings M1 is divided into a reset wiring part 27A having one end thereof connected to the reset gate electrode 34 and a reset wiring part 27B that is not connected to the reset gate electrode 34, as illustrated in FIG. 16B. The reset wiring parts 27A and 27B are connected by a connection wiring 27C which is formed by the second-layer metal wirings M2, whereby the reset wiring 27 is formed. Moreover, the light shielding portions 45 that shield the upper portions of the floating diffusions FD1 and FD2 are formed to be integral with the floating diffusions FD1 and FD2, the amplification gate electrode 32, and the connection wiring 28 that is connected to the source region 33S of the reset transistor Tr2. The light shielding portions 45 are formed by the second-layer metal wirings M2 by expanding portions of the connection wiring 28 corresponding to the contact portions with the floating diffusions FD1 and FD2.

Since other configurations are the same as those described in Embodiment 1, portions corresponding to those in FIG. 2 will be denoted by the same reference numerals, and description thereof will be omitted.

According to the solid-state imaging device 106 of Embodiment 6, since the dummy wirings 57 formed by the second-layer metal wirings M2 are disposed, the metal wirings are disposed around each of the photodiodes PD1 to PD8 with a good symmetry. Due to this configuration, similar to Embodiment 5, each of the photodiodes PD1 to PD8 is surrounded by the dummy wirings 57 and other wirings, and thus a color mixture due to diffraction of light can be prevented. In addition to this, the same advantages as those described in Embodiment 1 can be obtained.

Embodiment 7

Exemplary Configuration of Solid-State Imaging Device

Figure 17:
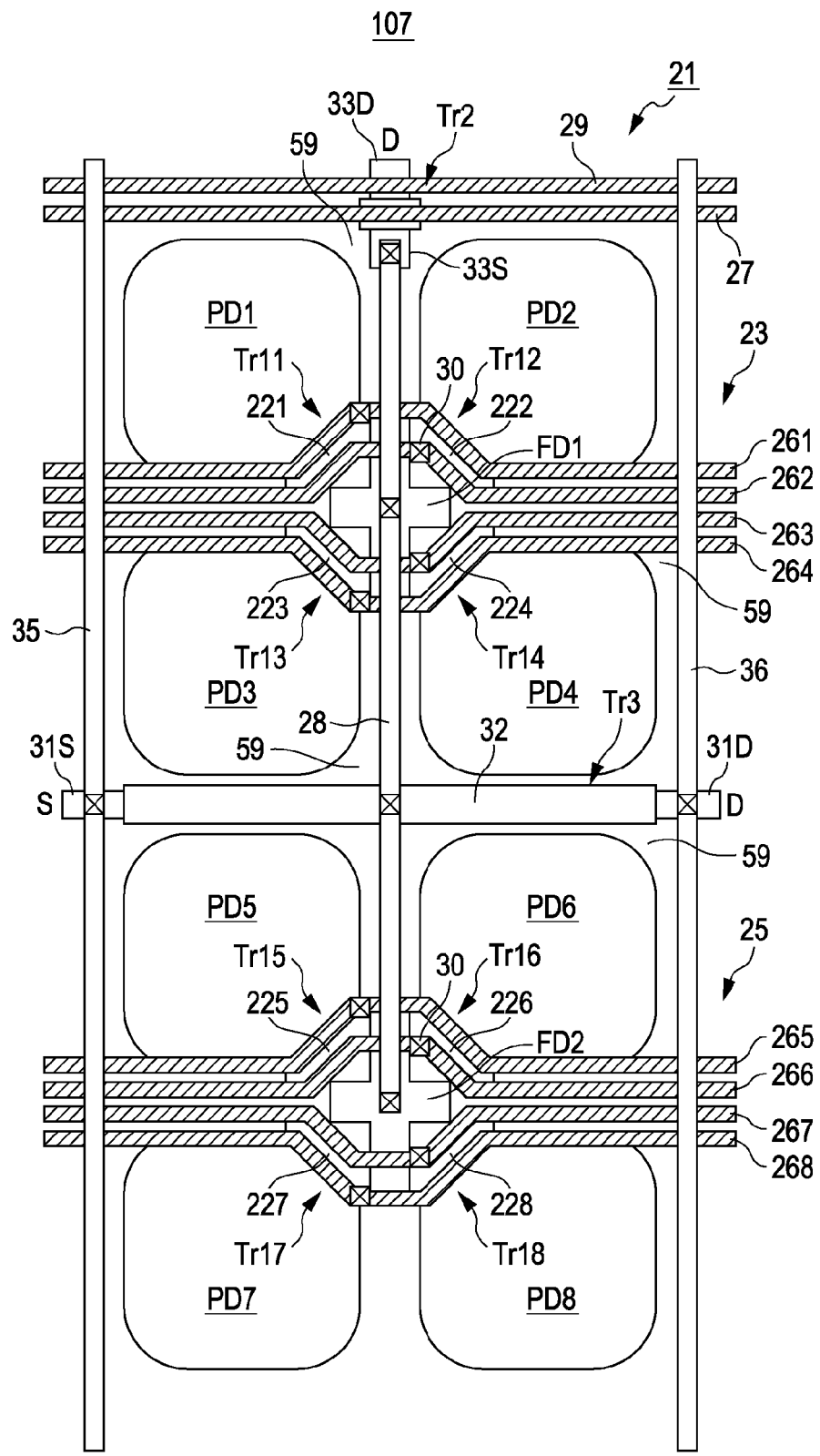
FIG. 17 is a layout diagram of one sharing unit in a pixel portion of a solid-state imaging device according to Embodiment 7.

With reference to FIG. 17, a solid-state imaging device, namely an MOS solid-state imaging device, according to Embodiment 7 of the present invention is illustrated. FIG. 17 illustrates a main part (one sharing unit) of a layout of a pixel portion. A solid-state imaging device 107 according to Embodiment 7 includes the photodiodes PD1 to PD8 which are not square in shape but have a shape with rounded corners.

When the photodiodes PD1 to PD8 are formed using an ion implantation method, a resist mask is used as an ion implantation mask. Since this resist mask is formed by a photolithography technique, an aperture is likely to have rounded corners and is hardly made perfectly square in shape. By using such a resist mask, the photodiodes PD1 to PD8 can be formed approximately square in shape with rounded corners.

Since other configurations are the same as those described in Embodiment 1, portions corresponding to those in FIG. 2 will be denoted by the same reference numerals, and description thereof will be omitted.

According to the solid-state imaging device 107 of Embodiment 7, since the photoresist has rounded corners, each of the photodiodes PD1 to PD8 can be formed with rounded corners. When the source region 31S and the drain region 31D of the amplification transistor Tr3, the source region 33S and the drain region 33D of the reset transistor Tr2, and the like are disposed in a region surrounded by the rounded corners, it is possible to expect an advantage of minimizing generation of an ineffective region. Moreover, damage incurred during the ion implantation does not have an influence on the photodiodes. In addition to this, the same advantages as those described in Embodiment 1 can be obtained.

The configuration of rounding the corners of the photodiode in Embodiment 7 can be applied to Embodiments 2 to 5 described above and Embodiments which will be described later.

Embodiment 8

Exemplary Configuration of Solid-State Imaging Device

Figure 18:
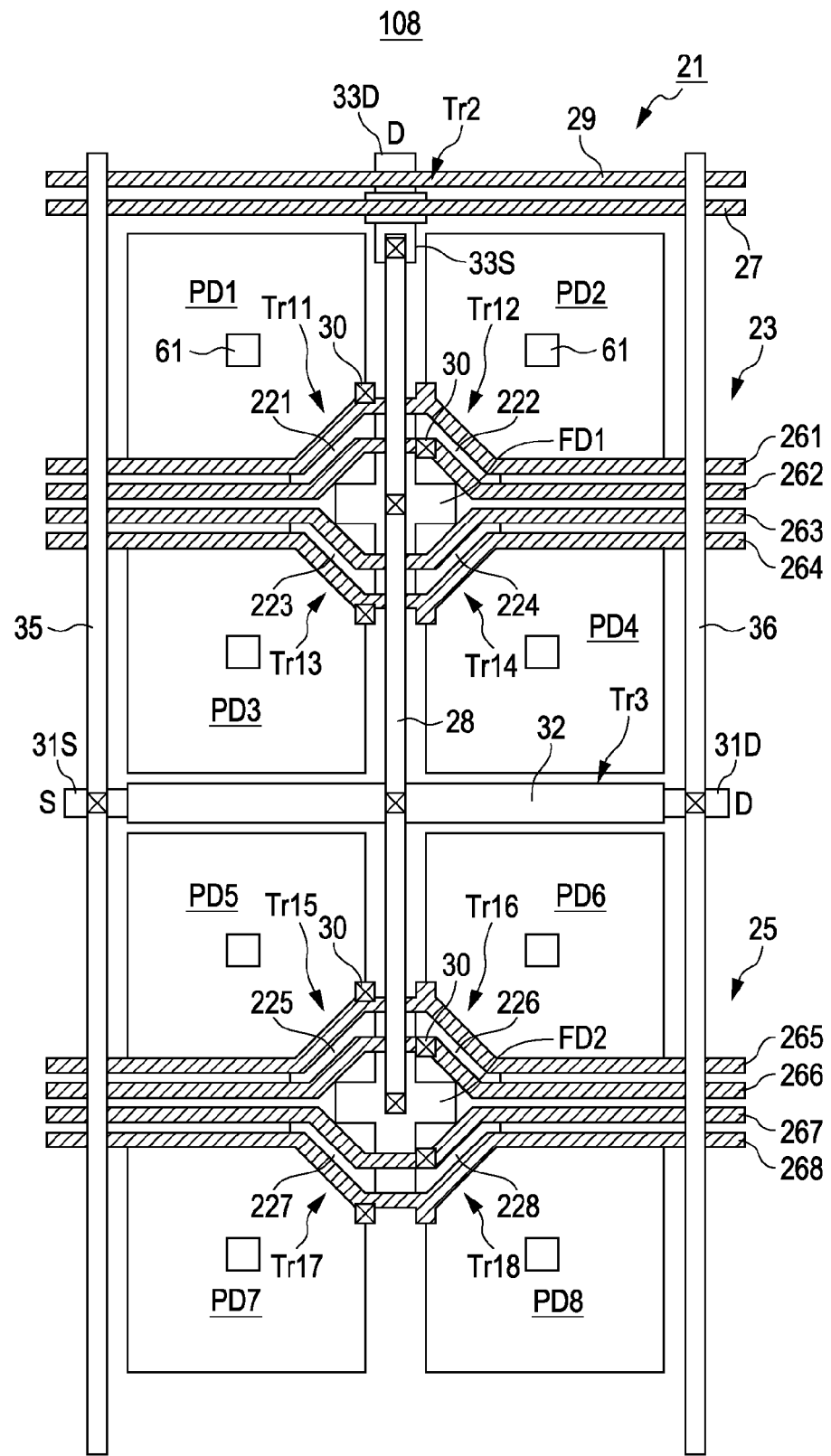
FIG. 18 is a layout diagram of one sharing unit in a pixel portion of a solid-state imaging device according to Embodiment 8.

With reference to FIG. 18, a solid-state imaging device, namely an MOS solid-state imaging device, according to Embodiment 8 of the present invention is illustrated. FIG. 18 illustrates a main part (one sharing unit) of a pixel portion. A solid-state imaging device 108 according to Embodiment 8 includes one sharing unit 21 in which dot-shaped structures 61 having a light condensing function are formed at positions corresponding to each region on each of the photodiodes PD1 to PD8, preferably at positions near the centers of each photodiode. The dot-shaped structures 61 are formed in an island-like shape, to which voltage is not applied, and are spaced from other wirings at a distance exceeding the diffraction limit. When the dot-shaped structures 61 are formed in a two-layer wiring structure, they are formed by any one of the metals on the same layer as the first-layer metal wirings M1 and the metal on the same layer as the second-layer metal wirings M2. The dot-shaped structures 61 are preferably formed by the metal on the same layer as the first-layer metal wirings M1.

The dot-shaped structures 61 are preferably formed with a film thickness allowing light to pass therethrough. The dot-shaped structures 61 are preferably formed by a thin metal film having a smaller thickness than the thickness of the first-layer metal wirings M1 and the second-layer metal wirings M2.

The dot-shaped structures 61 may be formed, for example, in a rectangular shape, a circular shape, a cross shape, a polygonal shape, and any other geometrical shapes. The dot-shaped structure 61 may be provided one, two, or plurally more than two in number. The dot-shaped structures may be formed of Cu, Al, SiON, SiN, SiC, TiN, ITO, TaN, W, WSi, WN, and the like.

Since other configurations are the same as those described in Embodiment 1, portions corresponding to those in FIG. 2 will be denoted by the same reference numerals, and description thereof will be omitted.

Figure 19A:
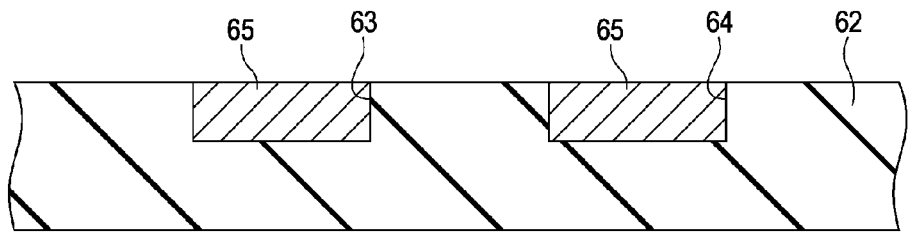
FIGS. 19A and 19B are process diagrams illustrating an example of a formation method of a dot-shaped structure of Embodiment 8.
Figure 19B:
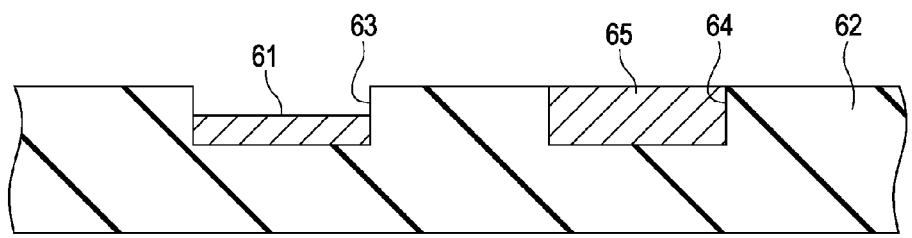

With reference to FIGS. 19A and 19B, an example of a formation method of the dot-shaped structure 61. As illustrated in FIG. 19A, trenches 63 and 64 having the same depth are formed on a surface of an interlayer insulating film 62 at positions where a dot-shaped structure and a wiring are to be formed, respectively. A Cu film 65 is buried in the trenches 63 and 64 via a barrier metal, for example. Subsequently, a planarization process is performed, and the Cu film 65 buried in the trench 63 corresponding to the dot-shaped structure is selectively etched together with the barrier metal so as to have a predetermined thickness as illustrated in FIG. 19B. In this way, a Cu wiring is formed in the trench 64, and a dot-shaped structure 61 formed by the thin Cu film is formed in the trench 63.

Figure 20A:
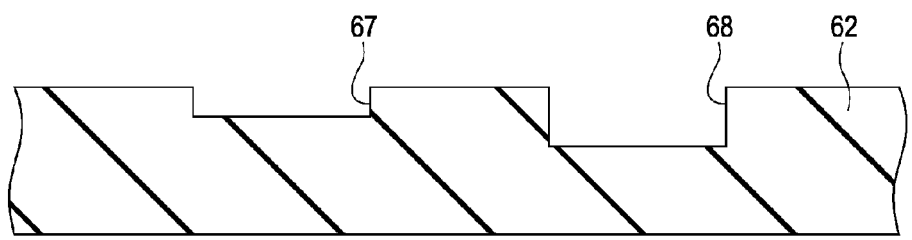
FIGS. 20A and 20B are process diagrams illustrating another example of a formation method of a dot-shaped structure of Embodiment 8.
Figure 20B:
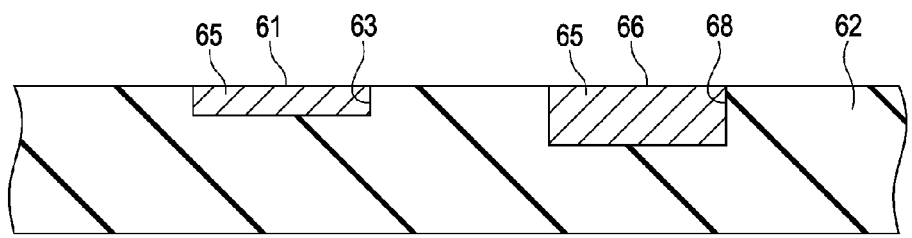

With reference to FIGS. 20A and 20B, another example of a formation method of a dot-shaped structure is illustrated. As illustrated in FIG. 20A, a shallow trench 67 is formed on a surface of an interlayer insulating film 62 at a position where a dot-shaped structure is to be formed, and a trench 68 deeper than the trench 67 is formed on the surface of the interlayer insulating film 62 at a position where a wiring is to be formed. Subsequently, as illustrated in FIG. 20B, a Cu film 65 is buried in the trenches 67 and 68 via a barrier metal. Thereafter, a planarization process is performed, whereby a dot-shaped structure 61 formed by the thin Cu film is formed in the trench 67, and a Cu wiring 66 is formed in the trench 68.

The Cu wiring 66 is formed, for example, as the horizontal wiring (the readout wirings 26₁ to 26₈, the reset wiring 27, and the power supply wiring 29) which is formed by the first-layer metal wirings.

Figure 21:
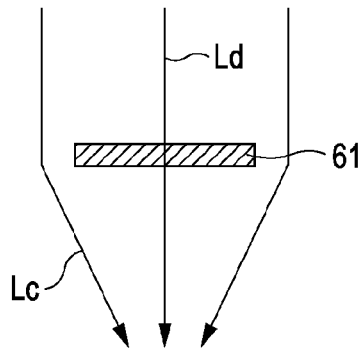
FIG. 21 is an explanatory diagram illustrating the function of the dot-shaped structure in Embodiment 8.

According to the solid-state imaging device 108 of Embodiment 8, the dot-shaped structures 61 which are separately disposed near the centers of the photodiodes PD1 to PD8 have the same light condensing function as the above-described function of the readout wirings 261, 264, 265, and 268 described in Embodiment 3. As illustrated in the schematic diagram of FIG. 21, light is diffracted at the vicinity of the dot-shaped structure 61 to curve towards the backside of the dot-shaped structure 61 to be collected by the photodiode PD. In this example, due to interference of light, light intensity increases at a position right below the dot-shaped structure 61. Moreover, the diffracted light Lc and the transmitted light Ld having passed through the dot-shaped structure 61 are added, and the light intensity increases further. The dot-shaped structure 61 has the function of an inner-layer lens.

In the example above, although the dot-shaped structure 61 is formed in a single-layer metal structure, the dot-shaped structure 61 may be formed in a multi-layer metal structure (e.g., two, three, and four-layer structure) at the same position via an interlayer insulating film. When the dot-shaped structure 61 is formed in a multi-layer structure, it is preferable that a dot width decreases as it goes towards a lower layer. When the dot-shaped structure 61 is formed in a multi-layer structure, light is first made curved towards an upper-layer dot-shaped structure and then curves towards a lower-layer dot-shaped structure to be collected by the photodiode.

Figure 22:
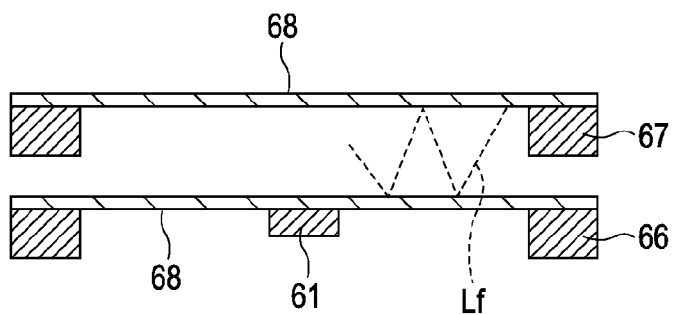
FIG. 22 is a cross-sectional view illustrating an example of a state of a dot-shaped structure and a wiring formed by a two-layer metal structure in Embodiment 8.

As illustrated in FIG. 22, in order to prevent diffusion of Cu, an SiC film 68, for example, is formed on the entire surface of a wiring 66 and a dot-shaped structure 61, which are formed by first-layer Cu metal, and a wiring 67 formed by second-layer Cu metal. The SiC film 68 may remain formed on a portion corresponding to a region on the photodiode. However, as illustrated in FIG. 22, when there are two layers of the SiC film 68, there is concern that a part Lf of incident light undergoes multiple reflection between the two layers of the SiC film 68, which may lead to ripples and decrease the sensitivity.

Figure 23:
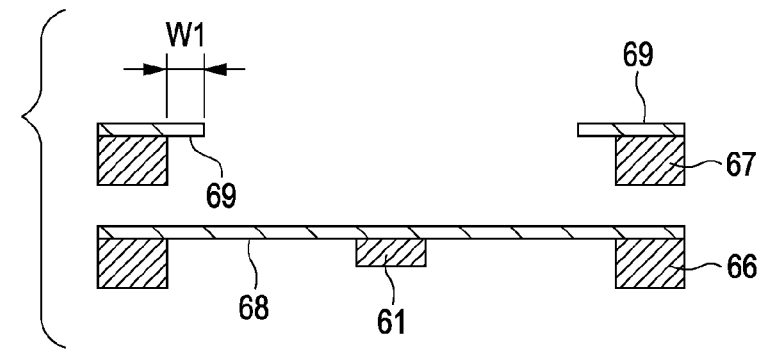
FIG. 23 is a cross-sectional view illustrating an exemplary state of a dot-shaped structure and a wiring formed by a two-layer metal structure in Embodiment 8.

For this reason, as illustrated in FIG. 23, it is preferable to remove selectively a portion of the second-layer SiC film 68 corresponding to the region on the photodiode. It was found from the simulation results that it is not necessary to etch selectively an entire layer of the SiC film 68 corresponding to the region on the photodiode, but it is necessary to etch selectively only the second-layer SiC film 68. By doing so, the multiple reflection is reduced, whereby occurrence of ripples is suppressed, and the sensitivity is improved. Here, since the removal of the second-layer SiC film 68 can be realized by etching using a direct mask alignment, it is possible to etch and remove the portion of the SiC film corresponding to the photodiode to the fullest extent. For this reason, it is possible to increase an aperture size and decrease a length w1 of a canopy portion 69, and accordingly, the occurrence of multiple reflection can be suppressed.

Figure 24:
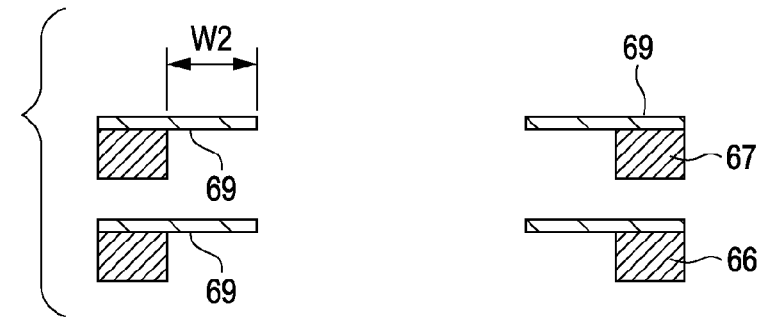
FIG. 24 is a cross-sectional view illustrating another exemplary state of a dot-shaped structure and a wiring formed by a two-layer metal structure in Embodiment 8.

When a waveguide is provided as another means for increasing the light collection efficiency, as illustrated in FIG. 24, it is necessary to etch selectively and remove an entire layer, in this case, the first and second-layer SiC films 68, of the portion corresponding to the region on the photodiode. At this time, since the first and second-layer SiC films 68 are etched via an indirect mask alignment, they are etched with a margin considering alignment errors. For this reason, an aperture size obtained thus is small, the length w2 of the canopy portion 69 increases, and thus the suppression effect of multiple reflection is less than that in FIG. 22.

The dot-shaped structure 61 shifts its position between the central portion of the pixel portion and the periphery of the pixel portion. Since light is incident approximately right above itself in the central portion of the pixel portion, the dot-shaped structure 61 is disposed at the center. Since oblique light is incident in the periphery of the pixel portion, the dot-shaped structure 61 is shifted from its optimum position in the central portion of the pixel portion by a distance corresponding to the amount of shift between the on-chip microlens and each pixel.

Embodiment 9

Exemplary Configuration of Solid-State Imaging Device

Figure 25:
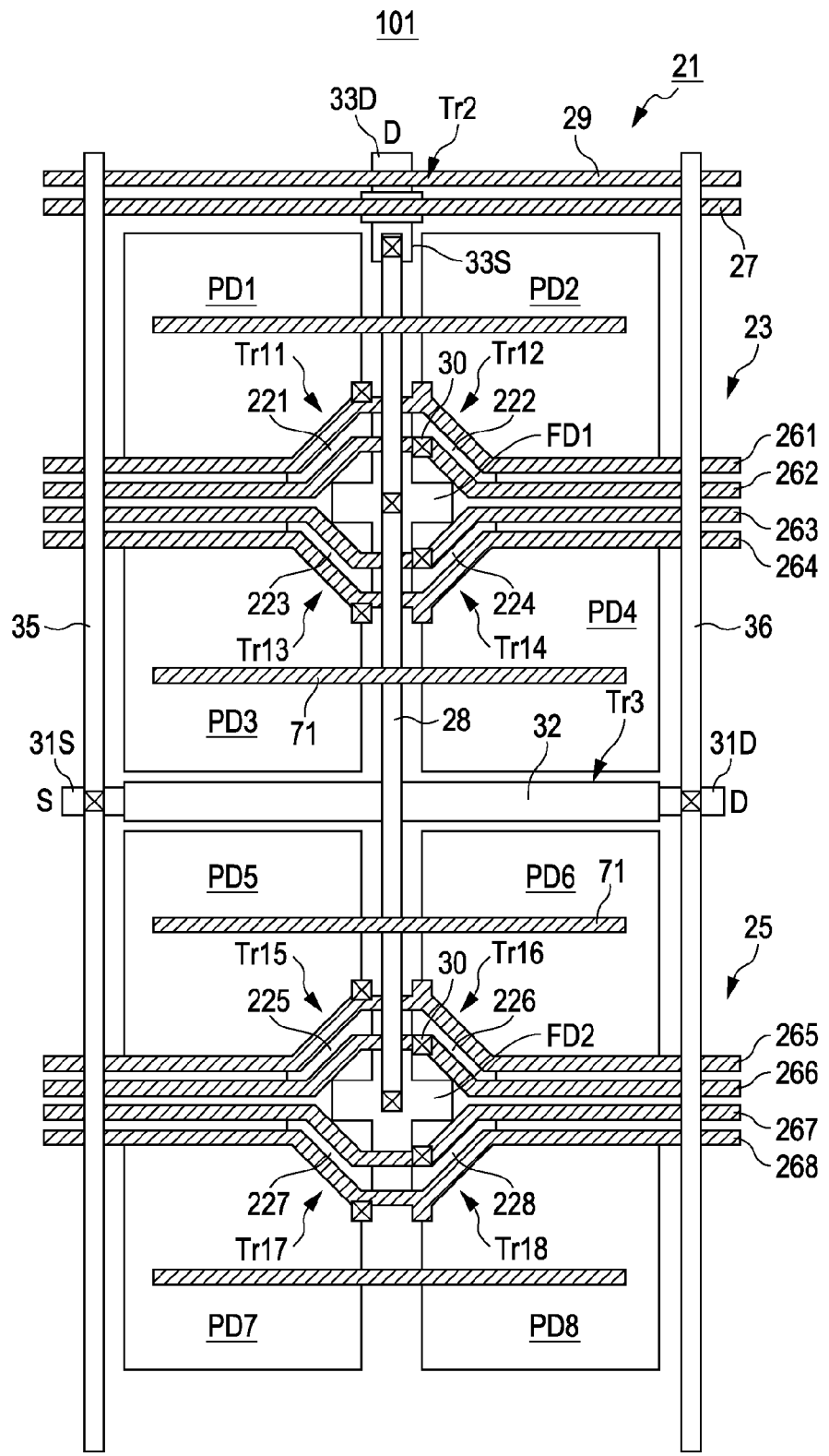
FIG. 25 is a layout diagram of one sharing unit in a pixel portion of a solid-state imaging device according to Embodiment 9.

With reference to FIG. 25, a solid-state imaging device, namely an MOS solid-state imaging device, according to Embodiment 9 of the present invention is illustrated. FIG. 25 illustrates a main part (one sharing unit) of a pixel portion. A solid-state imaging device 109 according to Embodiment 9 includes wirings 71 which do not have a wiring function and which are disposed at positions corresponding to the regions on the photodiodes PD1 to PD8, preferably, so as to pass along the vicinities of the centers of the photodiodes. The wirings 71 have the same light condensing function as an inner-layer lens similar to the above-described readout wirings 261, 264, 265, and 268 of Embodiment 3 and the dot-shaped structures 61 of Embodiment 8. As illustrated in FIG. 25, the wirings 71 may be provided for each sharing unit 21 and may be commonly provided to the photodiodes of the entire pixels on one row. The wirings 71 are simultaneously formed by the same metal wirings as the readout wirings 261 to 268. Alternatively, the wirings 71 may be formed to be thinner than the readout wirings similar to the dot-shaped structures 61.

Since other configurations are the same as those described in Embodiment 1, portions corresponding to those in FIG. 2 will be denoted by the same reference numerals, and description thereof will be omitted.

According to the solid-state imaging device 109 of Embodiment 9, since light is condensed by the diffracting effect of the wirings 71 as described above in FIGS. 12 and 21, the light collection efficiency is improved, and thus it is possible to achieve further improvement in the sensitivity. In addition to this, the same advantages as those described in Embodiment 1 can be obtained.

Embodiment 10

Exemplary Configuration of Solid-State Imaging Device

Figure 26:
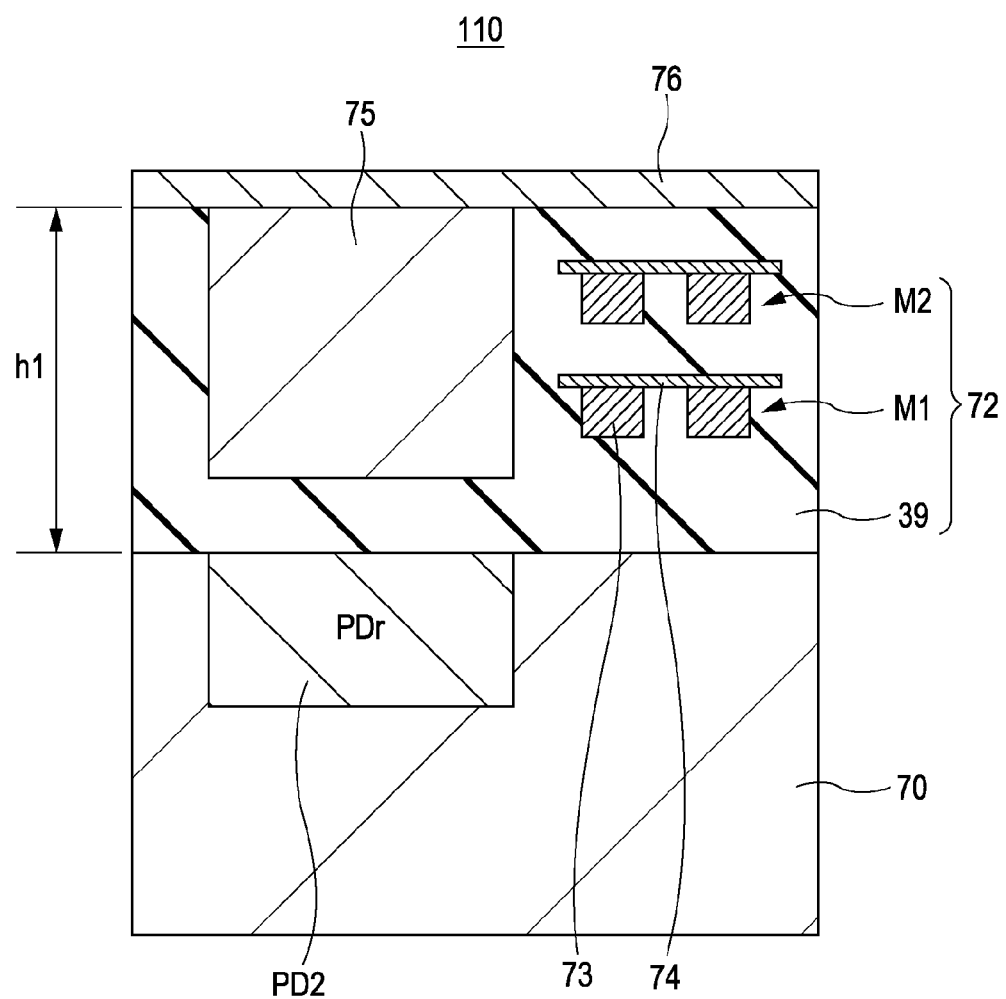
FIG. 26 is a cross-sectional view of a main part of one sharing unit in a pixel portion of a solid-state imaging device according to Embodiment 10.

With reference to FIG. 26, a solid-state imaging device, namely an MOS solid-state imaging device, according to Embodiment 10 of the present invention is illustrated. FIG. 26 is a cross-sectional view schematically showing a sectional pixel structure of one sharing unit using a red pixel as a representative pixel. Other pixels (e.g., green pixels and blue pixels) have a similar sectional structure.

Similar to Embodiment 1 illustrated in FIG. 2, a solid-state imaging device 110 according to Embodiment 10 includes one sharing unit 21 in which photodiodes PD (PD1 to PD8) of 8 pixels in total (2 pixels by 4 pixels, respectively, in horizontal and vertical directions) and ten pixel transistors are arranged. The readout wirings 261 to 268, which are connected to the readout transistors Tr11 to Tr18, and the reset wiring 27 and the power supply wiring 29, which are connected to the reset transistor Tr2, are wired in the transverse direction by the first-layer metal wirings M1. The connection wiring 28, and the convex lens elements 35 and the power supply wiring 36, which are connected to the amplification transistor Tr3, are wired in the longitudinal direction by the second-layer metal wirings M2.

In this embodiment, as illustrated in FIG. 26, a two-layer wiring structure 72 is formed on a semiconductor substrate 70 on which a photodiode (a photodiode of the red pixel is used as a representative example) PDr and pixel transistors are formed. That is to say, first and second-layer metal wirings M1 and M2 are formed via an interlayer insulating film 39. The metal wirings M1 and M2 are formed with a Cu wiring 73 which is formed via a barrier metal and an SiC film 74 for preventing diffusion of Cu as described above.

In particular, in this embodiment, a color filter 75 (in this figure, a red filter) is buried in the interlayer insulating film 39 at a position of the two-layer wiring structure 72 corresponding to a region on the photodiode PDr. A planarized passivation film 76 is formed on the surface of a structure thus obtained. An on-chip microlens may not be formed on the passivation film 76. Alternatively, an on-chip microlens may be formed on the passivation film 76.

Other pixels (e.g., green pixels and blue pixels) have a similar sectional structure. Since other configurations are the same as those described in Embodiment 1, description of the same layout as that in FIG. 2 will be omitted.

According to the solid-state imaging device 110 of Embodiment 10, the color filter 75 is buried in the two-layer wiring structure 72 by using a configuration such that the horizontal and vertical wirings forming the respective wirings are formed by the two-layer wiring structure 72 having an overall height smaller than that of the related art wiring structure (e.g., a four-layer wiring structure). Due to this configuration, it is possible to prevent a color mixture. Moreover, since the height h1 from the photodiode PDr to the top surface of the color filter 75 is lower than the height of the related art configuration, it is possible to achieve further improvement in the light collection efficiency. When the on-chip microlens is omitted, the structure can be further simplified. In addition to this, the same advantages as those described in Embodiment 1 can be obtained.

Embodiment 11

Exemplary Configuration of Solid-State Imaging Device

Figure 27:
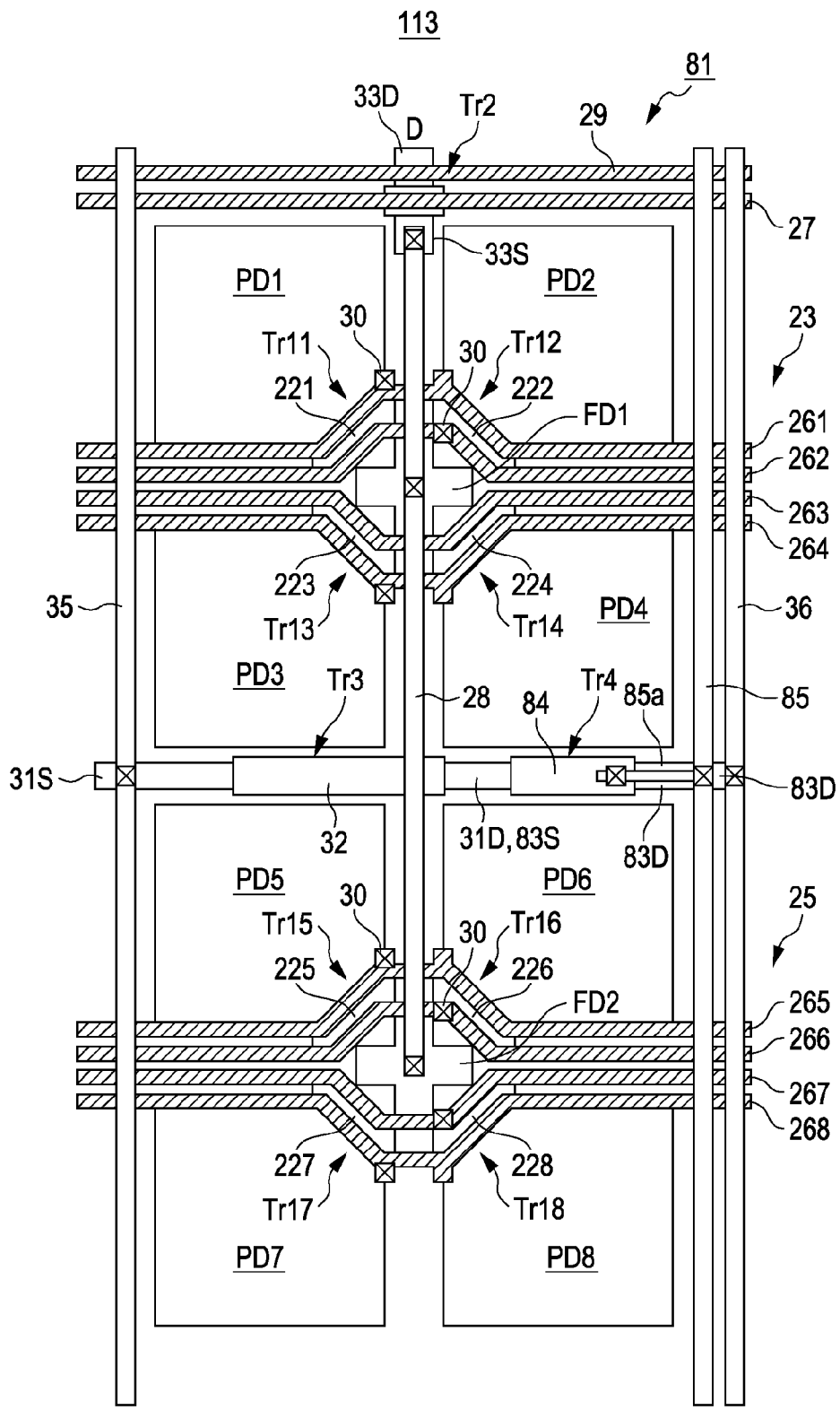
FIG. 27 is a layout diagram of one sharing unit in a pixel portion of a solid-state imaging device according to Embodiment 11.

With reference to FIG. 27, a solid-state imaging device, namely an MOS solid-state imaging device, according to Embodiment 11 of the present invention is illustrated. FIG. 27 illustrates a main part of a layout of a pixel portion using a two-layer wiring structure. As illustrated in FIG. 27, a solid-state imaging device 113 according to Embodiment 11 includes one sharing unit 81 which includes photodiodes PD (PD1 to PD8) of 8 pixels in total (2 pixels by 4 pixels, respectively, in horizontal and vertical directions) and eleven pixel transistors. Such sharing units 81 are arranged in a two-dimensional array to form a pixel portion 3. That is to say, similar to Embodiment 1, one sharing unit 81 is laid out in a so-called 8-pixel sharing structure with 2 pixels by 4 pixels, respectively, in horizontal and vertical directions, in which two structural groups are arranged vertically, wherein one structural group has one floating diffusion FD which is shared by four photodiodes PD in total (2 by 2 photodiodes, respectively, in horizontal and vertical directions).

One sharing unit 81 includes 1.375 pixel transistors per pixel. The eleven pixel transistors are specifically broken down into eight transfer transistors Tr1 (Tr11 to Tr18), one reset transistor Tr2, one amplification transistor Tr3, and one select transistor Tr4.

As illustrated in FIG. 27, the solid-state imaging device 113 according to Embodiment 11 includes the amplification transistor Tr3 and the select transistor Tr4 which are disposed between the first structural portion 23 and the second structural portion 25. The amplification transistor Tr3 includes a source region 31S, a drain region 31D, and an amplification gate electrode 32 as described above. The select transistor Tr4 includes a source region 83S, a drain region 83D, and a select gate electrode 84 and is connected to the amplification transistor Tr3. The source region 83S of the select transistor Tr4 is the same region as the drain region 31D of the amplification transistor Tr3.

The vertical signal line 35 is connected to the source region 31S of the amplification transistor Tr3, and the power supply wiring 36 is connected to the drain region 83D of the select transistor Tr4. The select gate electrode 84 of the select transistor Tr4 is connected to a select wiring 85. The vertical signal line 35, the power supply wiring 36, and the select wiring 85 are formed by the second-layer metal wirings M2 so as to extend in the longitudinal direction. In particular, the select gate electrode 84 of the select transistor Tr4 is connected to the select wiring 85, which is formed by the second-layer metal wirings M2, via a connection line 85a which is formed by the first-layer metal wirings M1.

Since other configurations are the same as those described in Embodiment 1, portions corresponding to those in FIG. 2 will be denoted by the same reference numerals, and description thereof will be omitted.

Figure 28:
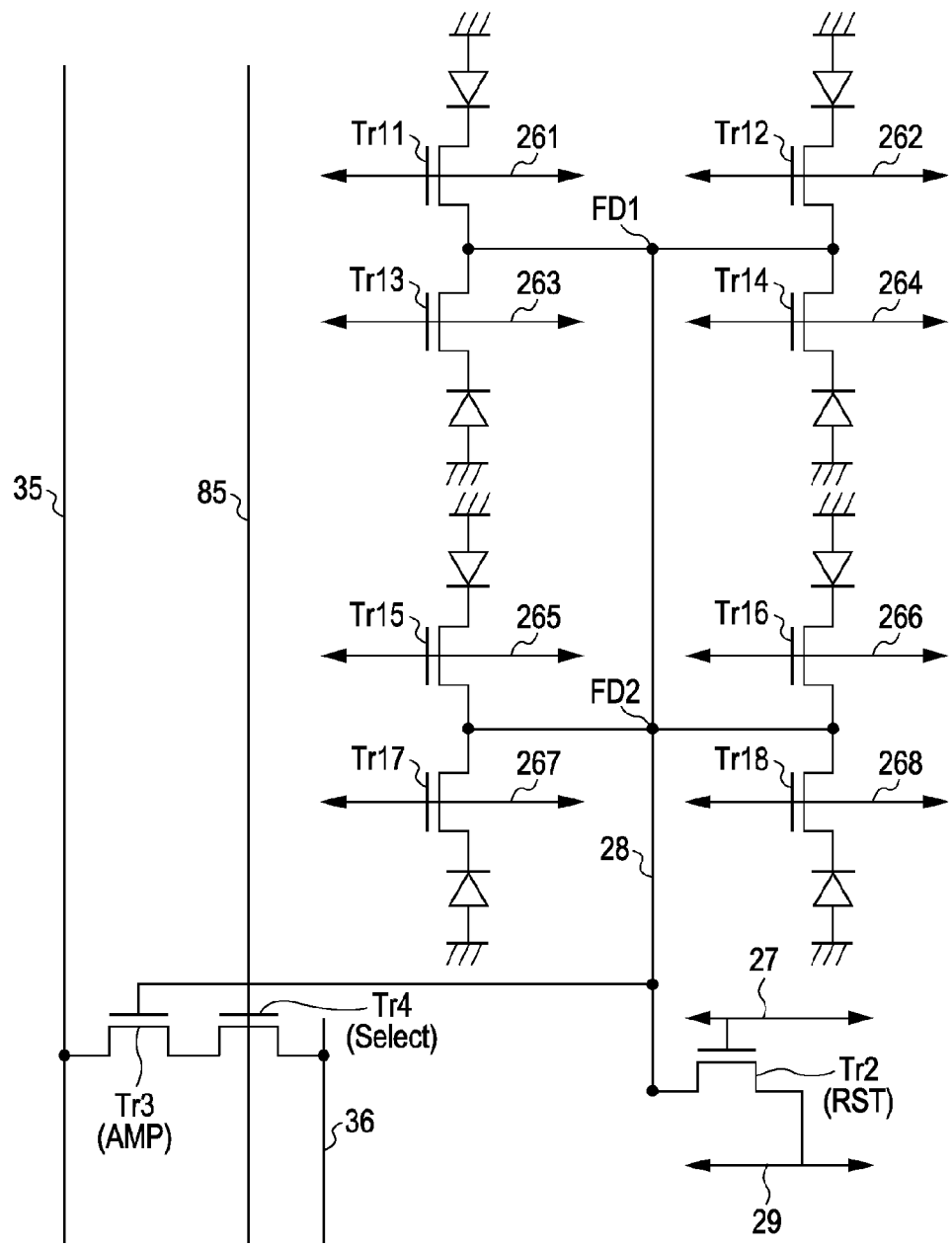
FIG. 28 is an equivalent circuit diagram of one sharing unit having a structure with 8 pixels and 11 transistors in the solid-state imaging device according to Embodiment 11.

With reference to FIG. 28, an equivalent circuit of one sharing unit 81 according to Embodiment 13 is illustrated. In this equivalent circuit, a configuration where the select transistor Tr4 is connected between the power supply wiring 36 and the drain of the amplification transistor Tr3, and the select wiring 85 is connected to the select gate is added to the equivalent circuit illustrated in FIG. 5. Other circuit configurations are the same as the circuit configurations illustrated in FIG. 5.

According to the solid-state imaging device 113 of Embodiment 11, since one sharing unit 81 has a structure with 8 pixels and 11 transistors, the number of pixel transistors per pixel can be decreased, and accordingly, the aperture area of each of the photodiodes PD1 to PD8 can be increased. Moreover, the wirings are formed in only a two-layer wiring structure, the first-layer metal wirings M1 are used for the wirings in the transverse direction, and the second-layer metal wirings M2 are used for the wirings in the longitudinal direction, whereby the aperture area of the photodiode is defined by the vertical and horizontal wirings. This wiring layout is not complex and does not interfere with the aperture of the photodiode. As described above, since the aperture area of the photodiode can be increased, it is possible to improve the sensitivity even when the pixels are miniaturized. Therefore, a solid-state imaging device with high sensitivity and high resolution can be obtained. In addition to this, the same advantages as those described in Embodiment 1 can be obtained.

Embodiment 12

Exemplary Configuration of Solid-State Imaging Device

Figure 29:
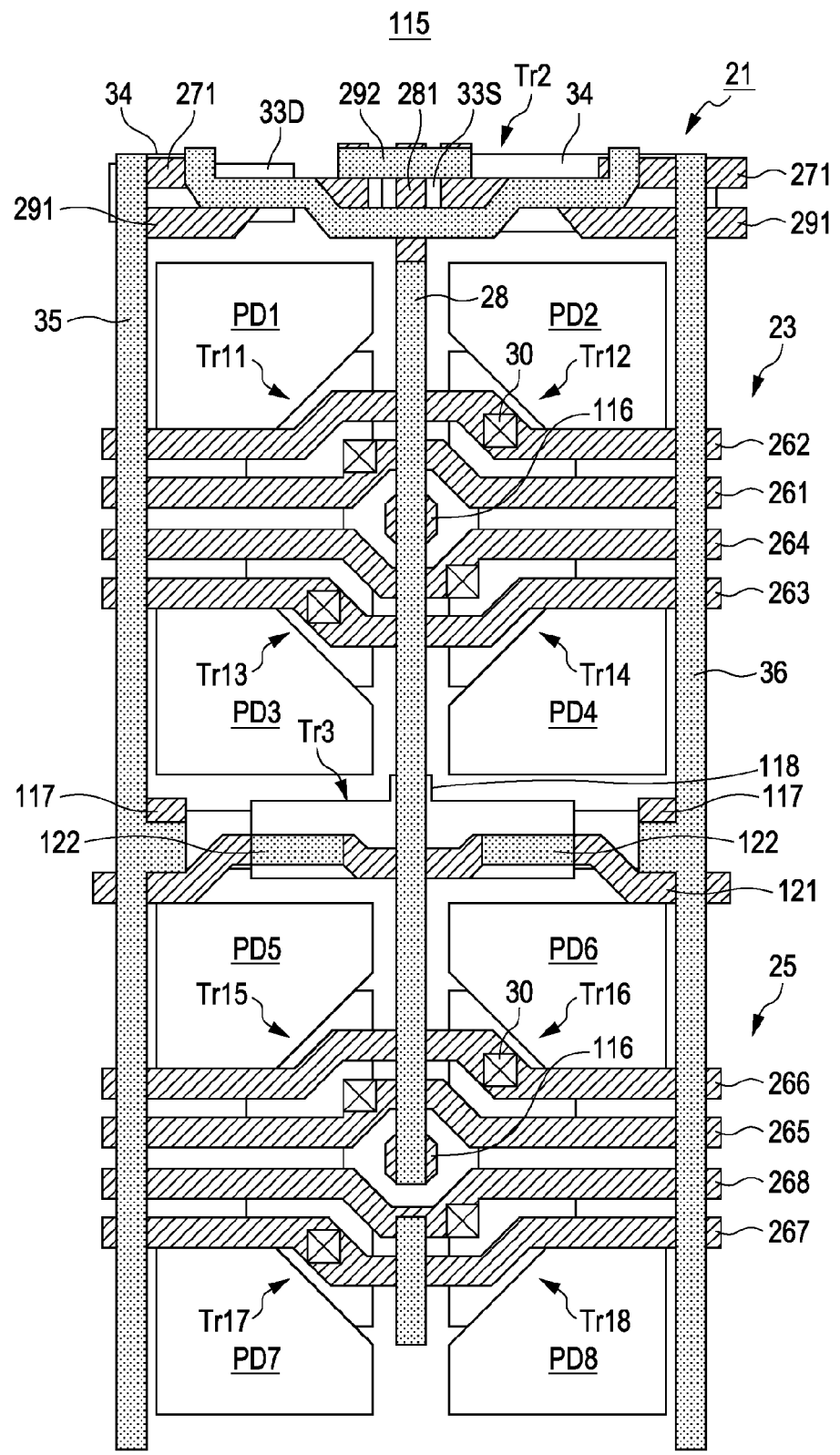
FIG. 29 is a layout diagram of one sharing unit in a pixel portion of a solid-state imaging device according to Embodiment 12.
Figure 30C:
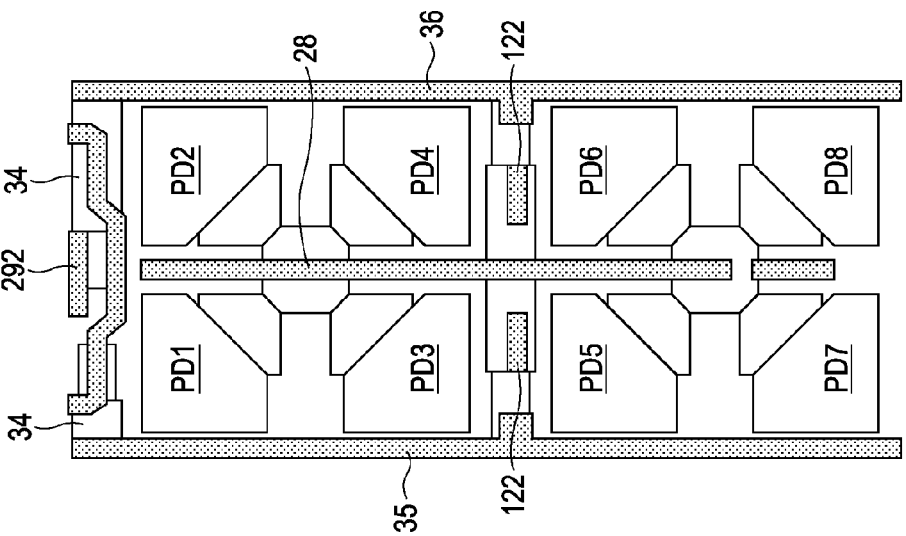
FIGS. 30A to 30C are exploded planar layout diagrams of one sharing unit according to Embodiment 12.
Figure 30B:
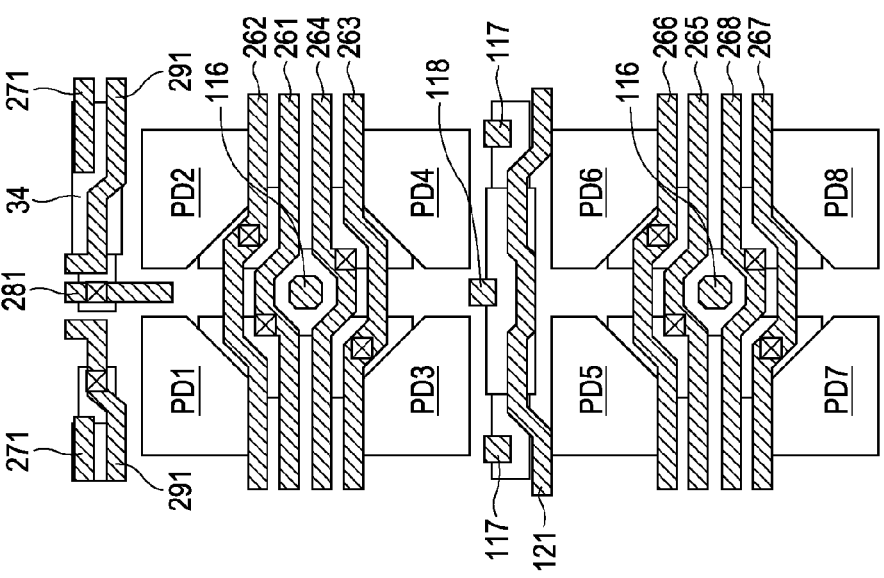
Figure 30A:
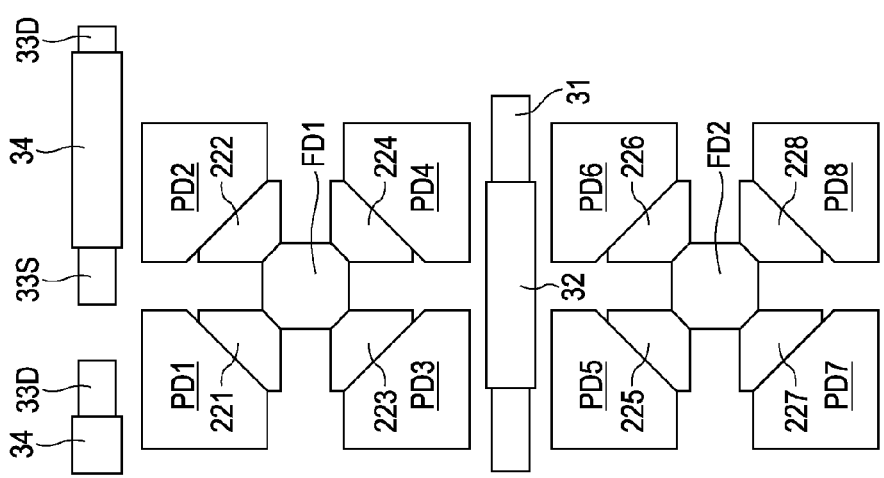

With reference to FIG. 29 and FIGS. 30A to 30C, a solid-state imaging device, namely an MOS solid-state imaging device, according to Embodiment 12 of the present invention is illustrated. FIG. 29 illustrates a main part of a layout of a pixel portion using a two-layer wiring structure. FIGS. 30A to 30C are exploded planar views for understanding the patterns of first-layer wirings and second-layer wirings.

As illustrated in FIG. 29, similar to Embodiment 1, a solid-state imaging device 115 according to Embodiment 12 includes one sharing unit 21 which includes photodiodes PD (PD1 to PD8) of 8 pixels in total (2 pixels by 4 pixels, respectively, in horizontal and vertical directions) and ten pixel transistors. Such sharing units 21 are arranged in a two-dimensional array to form a pixel portion 3. The photodiodes PD1 to PD8, the readout transistors Tr11 to Tr18 forming the pixel transistors, and the amplification transistor Tr3 have the same configuration as that of Embodiment 1.

In this embodiment, in particular, the reset transistor Tr2 is configured differently. That is to say, as illustrated in FIG. 30A, the source region 33S and the drain region 33D of the reset transistor Tr2 are disposed not in the longitudinal direction, but in the transverse direction, with respect to the reset gate electrode 34. Moreover, the reset transistor Tr2 is shifted in the transverse direction so as to overlap between adjacent sharing units 21. Furthermore, the reset wiring 27 connected to the reset gate electrode 34 of the reset transistor Tr2 and the power supply wiring 29 connected to the drain region 33D are formed in parallel to each other in the transverse direction using the first and second-layer metal wirings M1 and M2, respectively. The reset wiring 27 and the power supply wiring 29 are disposed on the reset gate electrode 34, and preferably, are formed with a width smaller than the width of the reset gate electrode 34.

First, as illustrated in FIG. 30A, an array of photodiodes PD1 to PD8 corresponding to an arrangement of 2 pixels by 4 pixels, the floating diffusions FD1 and FD2, and the readout transistors Tr11 to Tr18 having the readout gate electrodes 221 to 228 are formed. Furthermore, the reset transistor Tr2 and the amplification transistor Tr3 are formed, wherein the reset transistor Tr2 has the source region 33S and the drain region 33D which are arranged in the transverse direction with respect to the reset gate electrode 34 so that the gate length extends in the transverse direction. When one sharing unit 21 is observed, the reset transistor Tr2 has the reset gate electrode 34 which is divided into one half of the reset gate electrode 34 having the source region 33S and the other half of the reset gate electrode 34 having the drain region 33D. In this case, the divided reset gate electrodes 34 are formed so that the source region 33S opposes the drain region 33D.

Next, as illustrated in FIG. 30B, the readout wirings 261 to 268 are formed by the first-layer metal wirings M1 so as to extend in the transverse direction and be connected to the readout gate electrodes 221 to 228, respectively. Moreover, connection portions 116, which are connected to the floating diffusions FD1 and FD2, and connection portions 117, which are connected to the source region 31S and the drain region 31D of the amplification transistor Tr3, are formed by the first-layer metal wirings M1. Furthermore, a connection portion 118 connected to the amplification gate electrode 32 is formed by the first-layer metal wirings M1. Furthermore, a connection wiring portion 281 is formed by the first-layer metal wirings M1 so as to extend in the longitudinal direction and be connected to the source region 33S of the reset transistor Tr2. Furthermore, divided reset wiring portions 271, which are connected to the respective reset gate electrodes 34 corresponding to adjacent sharing units 21, and divided power supply wiring portions 291, which are connected to the respective drain regions 33D, are formed by the first-layer metal wirings M1. The ends of the divided power supply wiring portions 291 are formed so as to oppose each other at positions where the source region 33S positioned at the center in the transverse direction of the sharing unit 21 is sandwiched by the ends. Furthermore, a wavy wiring 121 is formed in the transverse direction by the first-layer metal wirings along the amplification gate electrode 32 of the amplification transistor Tr3 while moving aside from the connection portions 117 on the source and drain regions 33S and 33D and the connection portion 118 connected to the amplification gate electrode 32. This wavy wiring 121 is used for applying a substrate voltage, namely a predetermined voltage to the semiconductor well region in which the photodiodes and the pixel transistors are formed. For example, when an n-type substrate is used, a voltage of 0 V is applied to a p-type semiconductor well region in which the photodiodes and the pixel transistors are formed. Although this wiring 121 is the wiring for applying a voltage of 0 V to the p-type semiconductor well region, in this example, it is also referred to as a substrate contact wiring.

Next, as illustrated in FIG. 30C, the vertical signal line 35 connected to the source region 31S of the amplification transistor Tr3 and the power supply wiring 36 connected to the drain region 31D are formed in the longitudinal direction by the second-layer metal wirings M2. Moreover, the connection wiring 28 is formed by the second-layer metal wirings M2 so as to be connected via the connection portions 116 and 118 to the floating diffusions FD1 and FD2, the amplification gate electrode 32, and the connection portion 281 which is connected to the source region 33S of the reset transistor Tr2. Furthermore, a connection wiring portion 292 is formed by the second-layer metal wirings M2 so as to connect the power supply wiring portions 291 which are connected to the drain region 33D of the reset transistor Tr2. By the power supply wiring portion 291 formed by the first-layer metal wirings M1 and the connection wiring portion 292 formed by the second-layer metal wirings M2, the power supply wiring 29 is formed which is connected to the drain region 33D of each of the reset transistors Tr2 of the sharing units 21 arranged in the horizontal direction. Furthermore, a connection wiring portion 272 is formed in the transverse direction by the second-layer metal wirings M2 so as to connect the reset wiring portions 271 being connected to the reset gate electrode 34. By the reset wiring portions 271 formed by the first-layer metal wirings M1 and the connection wiring portion 272 formed by the second-layer metal wirings M2, the reset wiring 27 is formed which connects the reset gate electrodes 34 of the sharing units 21 arranged in the horizontal direction. Furthermore, optically dummy wirings 122 are formed by the second-layer metal wirings M2 on the side of the amplification transistor Tr3 at partial areas of the wiring 121 that applies a so-called substrate voltage.

According to the solid-state imaging device 115 of Embodiment 12, the source region 33S of the reset transistor Tr2 is not disposed near the boundary of the photodiodes PD1 and PD2 but is disposed on an upper side of the photodiodes PD. Due to this configuration, it is better able to decrease the spacing between the photodiodes PD arranged in the horizontal direction (transverse direction) without being interrupted by the source region 33S, than Embodiment 1 illustrated in FIG. 2. Accordingly, it is possible to increase the area of each of the photodiodes PD and further improve the sensitivity. Moreover, since the reset wiring 27 and the power supply wiring 29 connected to the reset transistor Tr2 are formed so as to extend along the reset gate electrode 34, it is possible to decrease the spacing between two sharing units 21 being adjacent in the vertical direction. Accordingly, it is possible to increase the area of each of the photodiodes PD and further improve the sensitivity. In addition to this, the same advantages as those described in Embodiment 1 can be obtained.

Embodiment 13

Exemplary Configuration of Solid-State Imaging Device

Figure 31:
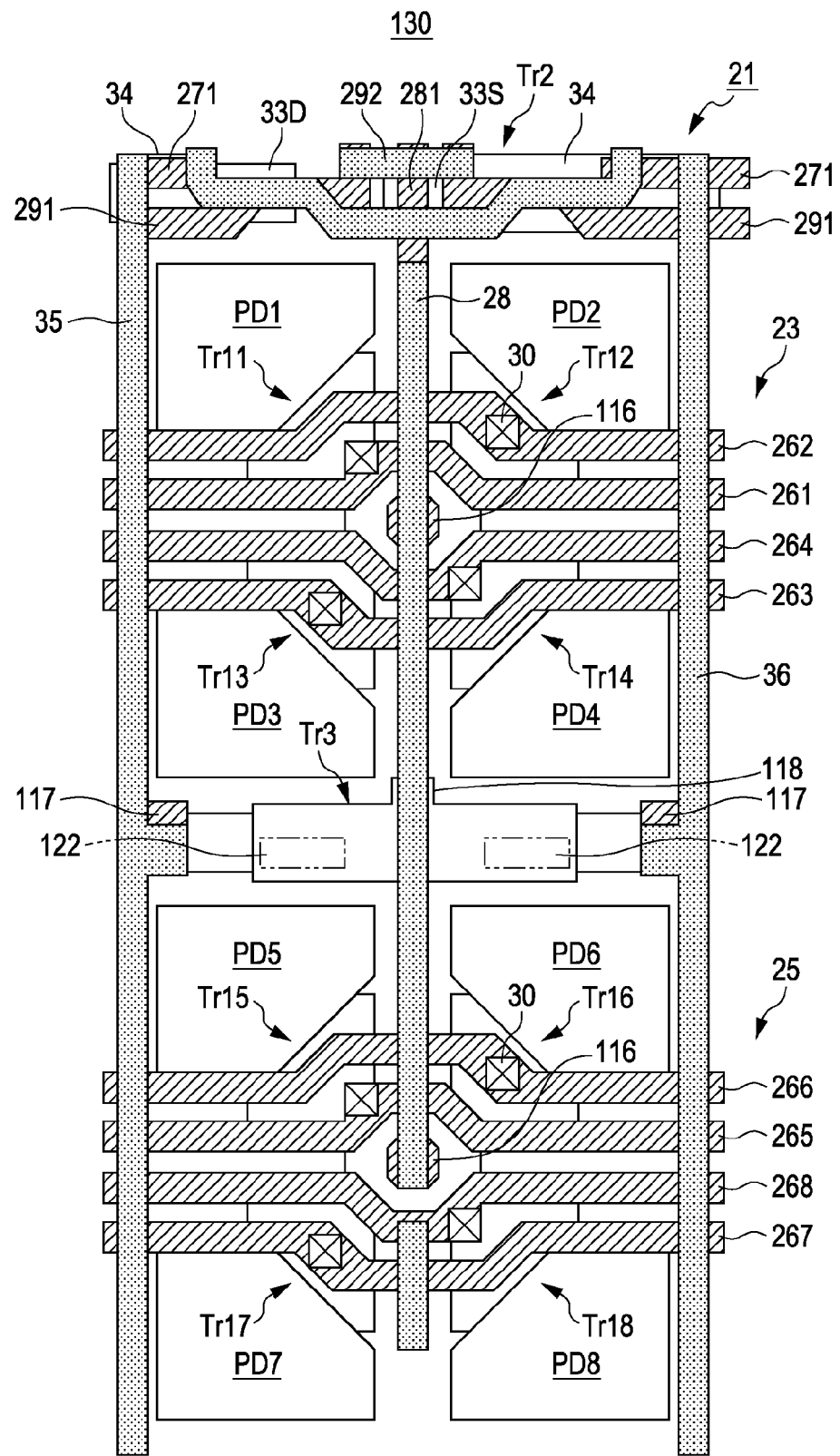
FIG. 31 is a layout diagram of one sharing unit in a pixel portion of a solid-state imaging device according to Embodiment 13.

With reference to FIG. 31, a solid-state imaging device, namely an MOS solid-state imaging device, according to Embodiment 13 of the present invention is illustrated. FIG. 31 illustrates a main part of a layout of a pixel portion using a two-layer wiring structure.

A solid-state imaging device 130 according to Embodiment 13 has a configuration such that the substrate contact wiring 121 and the dummy wirings 122 formed thereon are omitted from the configuration of the solid-state imaging device 115 of Embodiment 12. However, the dummy wirings 122 may be formed as illustrated by a chain line in the figure. Since other configurations are the same as those described in Embodiment 12, portions corresponding to those in FIG. 29 will be denoted by the same reference numerals, and description thereof will be omitted.

According to the solid-state imaging device 130 of Embodiment 13, the same advantages as those of the solid-state imaging device 115 of Embodiment 12 can be obtained since the solid-state imaging device 130 has the same configuration as that of Embodiment 12 except that the substrate contact wiring 121 is omitted.

Embodiment 14

Exemplary Configuration of Solid-State Imaging Device

Figure 32:
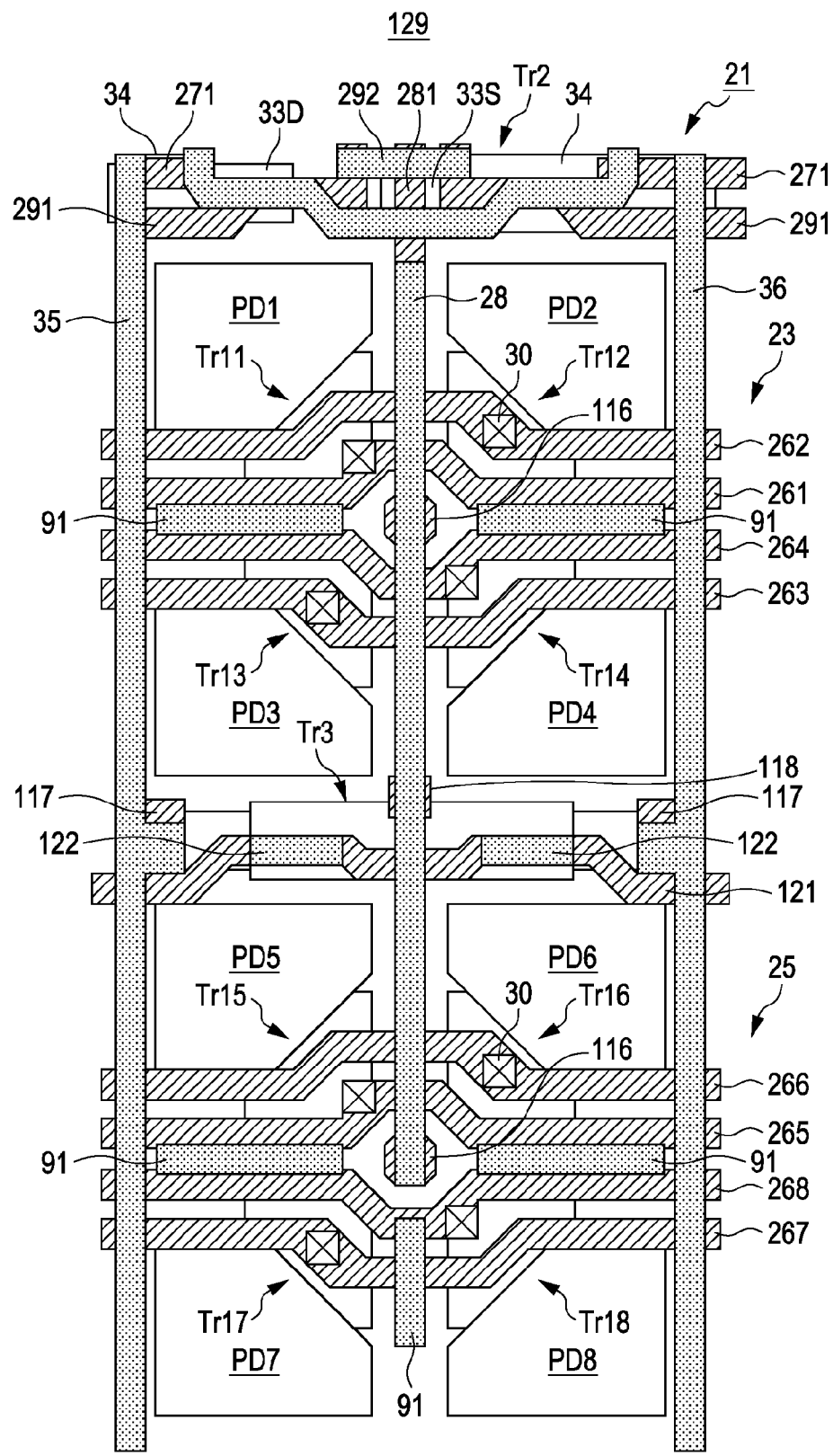
FIG. 32 is a layout diagram of one sharing unit in a pixel portion of a solid-state imaging device according to Embodiment 14.

With reference to FIG. 32, a solid-state imaging device, namely an MOS solid-state imaging device, according to Embodiment 13 of the present invention is illustrated. FIG. 32 illustrates a main part of a layout of a pixel portion using a two-layer wiring structure. A solid-state imaging device 129 according to Embodiment 14 includes dummy wirings 91 which are formed by the second-layer metal wirings M2. That is to say, in addition to the configuration of Embodiment 12 illustrated in FIG. 29, dummy wirings 122 and 91 are formed between the readout wirings 261 and 264, between the readout wirings 265 and 268, on partial areas of the substrate contact wiring 121, and under the floating diffusion FD2. Since other configurations are the same as those described in Embodiment 12 illustrated in FIG. 29, corresponding portions will be denoted by the same reference numerals, and description thereof will be omitted.

According to the solid-state imaging device 129 of Embodiment 14, the photodiodes PD are surrounded, with a good symmetry, by the dummy wirings 91, the vertical signal line 35, the power supply wiring 36, and the connection wiring which are formed by the second-layer metal wirings M2. Due to this configuration, it is possible to prevent a color mixture due to diffraction of light. In addition to this, the same advantages as those described in Embodiment 12 can be obtained.

Embodiment 15

Exemplary Configuration of Solid-State Imaging Device

Figure 33:
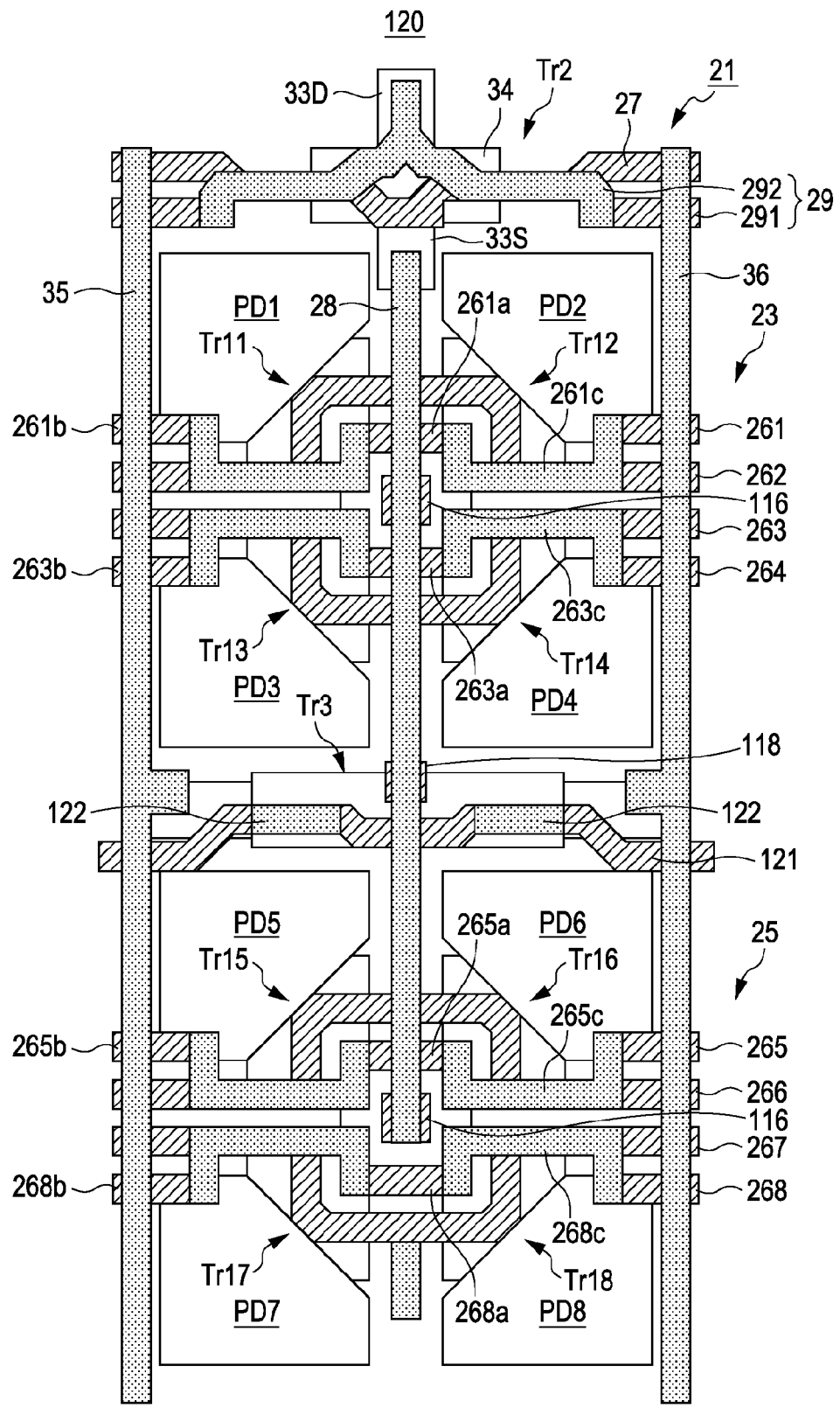
FIG. 33 is a layout diagram of one sharing unit in a pixel portion of a solid-state imaging device according to Embodiment 15.

With reference to FIG. 33 and FIGS. 34A to 34C, a solid-state imaging device, namely an MOS solid-state imaging device, according to Embodiment 15 of the present invention is illustrated. FIG. 33 illustrates a main part of a layout of a pixel portion using a two-layer wiring structure. FIGS. 34A to 34C are exploded planar views for understanding the patterns of first-layer wirings and second-layer wirings.

As illustrated in FIG. 33, similar to Embodiment 1, a solid-state imaging device 120 according to Embodiment 15 includes one sharing unit 21 which includes photodiodes PD (PD1 to PD8) of 8 pixels in total (2 pixels by 4 pixels, respectively, in horizontal and vertical directions) and ten pixel transistors. Such sharing units 21 are arranged in a two-dimensional array to form a pixel portion 3. The photodiodes PD1 to PD8, the readout transistors Tr11 to Tr18 forming the pixel transistors Tr2, and the amplification transistor Tr3 have the same configuration as that of Embodiment 1.

In this embodiment, in particular, the readout wirings 261 to 268, and the reset wiring 27 and the power supply wiring 29, which are connected to the reset transistor Tr2, are laid out differently. That is to say, the readout wirings 261 to 268 are laid out using the first and second-layer metal wirings M1 and M2 so as to shield a region including the readout gate electrodes 221 to 228 and partly form two wirings as viewed in a top plan view thereof. Moreover, the reset wiring 27 and the power supply wiring 29 which are connected to the reset transistor Tr2 are laid out using the first and second-layer metal wirings M1 and M2 so as partly to form one wiring as viewed in a top plan view thereof.

First, as illustrated in FIG. 34A, an array of photodiodes PD1 to PD8 corresponding to an arrangement of 2 pixels by 4 pixels, the floating diffusions FD1 and FD2, and the readout transistors Tr11 to Tr18 having the readout gate electrodes 221 to 228 are formed. Furthermore, the reset transistor Tr2 and the amplification transistor Tr3 are formed. The reset transistor Tr2 has the reset gate electrode 34 and the source region 33S and the drain region 33D which are arranged so that the gate length extends in the transverse direction. The amplification transistor Tr3 includes the amplification gate electrode 32, which extends in the transverse direction, and the source region 31S and the drain region 31D which are disposed at both ends of the amplification gate electrode 32. These layouts are the same as those of Embodiment 1.

Next, as illustrated in FIG. 34B, by the first-layer metal wirings M1, the readout wiring 262 connected to the readout gate electrode 222 is formed in a straight-line shape in the transverse direction and is bent in an inverted-U shape on the readout gate electrodes 221 and 222. Moreover, by the first-layer metal wirings M1, straight-line shaped wiring portions 261a and 261b are formed in the transverse direction to be divided so as to form a part of a readout wiring connected to the readout gate electrode 221. The wiring portion 261a is connected to the readout gate electrode 221 at an inner side of the inverted-U shaped portion of the readout wiring 262 and is formed over both readout gate electrodes 221 and 222. The wiring portion 261b is formed above the straight-line portion of the readout wiring 262 so as to be positioned at both ends in the transverse direction of the sharing unit 21.

The readout wiring 263, which is connected to the readout gate electrode 223, and wiring portions 264a and 264b, which form a part of the readout wiring 264, are formed by the first-layer metal wirings M1 to be linearly symmetrical to the layout of the readout wiring 262 and the rear-end wall portion 261a and 261b.

With the same layout, the readout wiring 266, which is connected to the readout gate electrode 226, and wiring portions 265a and 265b which form a part of the readout wiring 265 connected to the readout gate electrode 225 are formed by the first-layer metal wirings M1. Moreover, the readout wiring 267, which is connected to the readout gate electrode 227, and wiring portions 268a and 268b which form a part of the readout wiring 268 connected to the readout gate electrode 228 are formed.

Moreover, connection portions 116, which are connected to the floating diffusions FD1 and FD2, and connection portions 117, which are connected to the source region 31S and the drain region 31D of the amplification transistor Tr3, are formed by the first-layer metal wirings M1. Furthermore, a connection portion 118 connected to the amplification gate electrode 32 is formed by the first-layer metal wirings M1. Furthermore, the reset wiring 27 which is connected to the reset gate electrode 34 of the reset transistor Tr2 is formed by the first-layer metal wirings M1 so as to extend in the transverse direction, and power supply wiring portions 291 forming a part of the power supply wiring 29 are formed at both ends in the transverse direction of the sharing unit 21. The power supply wiring portions 291 and the reset wiring 27 are formed in parallel to the reset wiring 27.

Next, as illustrated in FIG. 34C, the vertical signal line 35 connected to the source region 31S of the amplification transistor Tr3 and the power supply wiring 36 connected to the drain region 31D are formed in the longitudinal direction by the second-layer metal wirings M2. Moreover, the connection wiring 28 is formed by the second-layer metal wirings M2 so as to extend in the longitudinal direction and be connected via the connection portions 116 and 118 to the floating diffusions FD1 and FD2, the amplification gate electrode 32, and the source region 33S of the reset transistor Tr2.

In the first structural portion 23, wiring portions 261c, which connect the wiring portions 261a and 261b forming a part of the readout wiring 261, and wiring portions 263c, which connect the wiring portions 263a and 263b forming a part of the readout wiring 263, are formed by the second-layer metal wirings M2. The wiring portions 261c formed by the second-layer metal wirings M2 are formed so as to overlap with both straight-line portions which sandwich the bent portion of the readout wiring 261 formed by the first-layer metal wirings M1 and be bent to cover the readout gate electrode and the spacing between the wirings on the floating diffusion FD1. The wiring portions 263c formed by the second-layer metal wirings M2 are formed so as to overlap with both straight-line portions which sandwich the bent portion of the readout wiring 264 formed by the first-layer metal wirings M1 and be bent to cover the readout gate electrode and the spacing between the wirings on the floating diffusion FD1.

In the second structural portion 25, wiring portions 265c, which connect the wiring portions 265a and 265b forming a part of the readout wiring 265, and wiring portions 268c, which connect the wiring portions 268a and 268b forming a part of the readout wiring 268, are formed by the second-layer metal wirings M2. The wiring portions 265c formed by the second-layer metal wirings M2 are formed so as to overlap with both straight-line portions which sandwich the bent portion of the readout wiring 266 formed by the first-layer metal wirings M1 and be bent to cover the readout gate electrode and the spacing between the wirings on the floating diffusion FD2. The wiring portions 268c formed by the second-layer metal wirings M2 are formed so as to overlap with both straight-line portions which sandwich the bent portion of the readout wiring 267 formed by the first-layer metal wirings M1 and be bent to cover the readout gate electrode and the spacing between the wirings on the floating diffusion FD2.

In the reset transistor Tr2, a power supply wiring portion 292 is formed by the second-layer metal wirings M2 so as to connect the power supply wiring portions 291 at both ends of the sharing unit 21 and the drain region 33D together. The power supply wiring portions 291 and 292 form the power supply wiring 29. The power supply wiring 292 formed by the second-layer metal wirings M2 is formed so as partly to overlap with the straight-line portion of the reset wiring 27 which is formed by the first-layer metal wirings M1 so as to extend in the transverse direction. Furthermore, optically dummy wirings 122 are formed by the second-layer metal wirings M2 on the side of the amplification transistor Tr3 at partial areas of the wiring 121 that applies a so-called substrate voltage.

According to the solid-state imaging device 120 of Embodiment 15, in the first structural portion 23, the readout wirings 262 and 261 overlap each other and the readout wirings 263 and 264 overlap each other, so that two main horizontal wiring portions appear in a top plan view. Moreover, in the second structural portion 25, two main horizontal wiring portions appear in a top plan view. Due to this configuration, it is possible to increase the area of each of the photodiodes PD1 to PD4 of the pixels and achieve improvement in the sensitivity. Furthermore, by the readout wirings 261 to 268 which are arranged at a spacing of equal to or smaller than the diffraction limit, regions which have to be shielded from light, namely the readout gate electrodes 221 to 228 and the floating diffusions FD1 and FD2 can be shielded. Therefore, it is not necessary to form an additional light shielding film. That is to say, in a configuration where a floating diffusion FD is surrounded by readout gate electrodes, when readout wirings are formed so as to overlap the readout gate electrodes, the readout wirings perform the function of a light shielding film. Since a distance of around 0.3 μm is maintained as a readout gate length between the photodiode PD and the floating diffusion FD, a proper operation of the readout transistors Tr11 to Tr18 is ensured. In the reset transistor Tr2, since the power supply wiring 29 and the reset wiring 27 partly overlap each other so as to appear as one wiring as viewed in a top plan view, a simple layout is achieved. In addition to this, the same advantages as those described in Embodiment 1 can be obtained.

Embodiment 16

Exemplary Configuration of Solid-State Imaging Device

Figure 35:
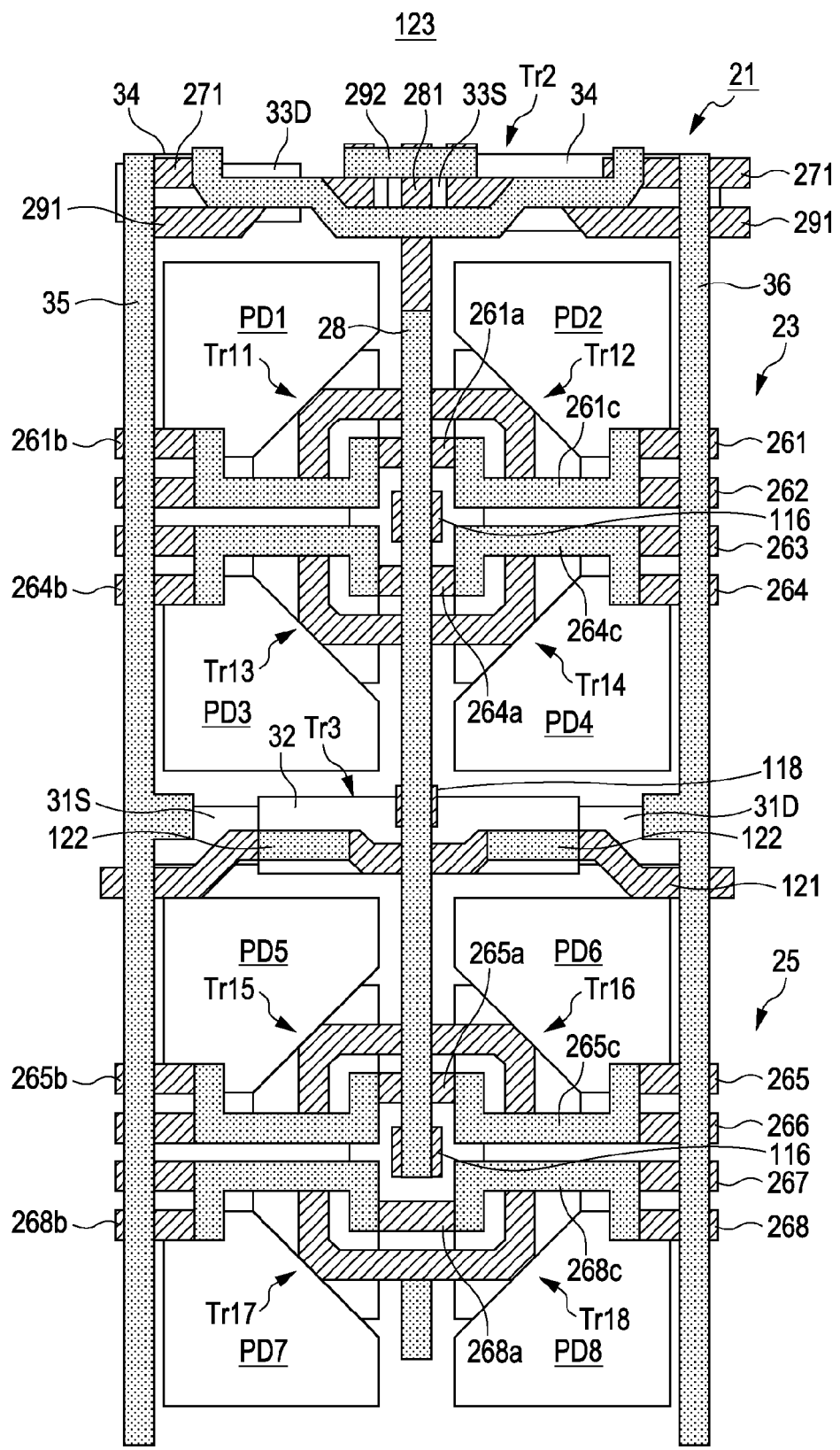
FIG. 35 is a layout diagram of one sharing unit in a pixel portion of a solid-state imaging device according to Embodiment 16.

With reference to FIG. 35, a solid-state imaging device, namely an MOS solid-state imaging device, according to Embodiment 16 of the present invention is illustrated. FIG. 35 illustrates a main part of a layout of a pixel portion using a two-layer wiring structure. A solid-state imaging device 123 according to Embodiment 16 has a configuration such that the layout of the reset transistor Tr2, the reset wiring 27, and the power supply wiring 29 in the solid-state imaging device 120 according to Embodiment 15 is replaced with the corresponding layout illustrated in Embodiment 12. Since other configurations are the same as those described in Embodiments 12 and 15, portions corresponding to those in FIG. 29, FIGS. 30A to 30C, FIG. 33, and FIGS. 34A to 34C will be denoted by the same reference numerals, and description thereof will be omitted.

According to the solid-state imaging device 123 of Embodiment 16, it is possible to decrease the spacing between the photodiodes PD arranged in the horizontal direction (transverse direction) while preventing the source region 33S of the reset transistor Tr2 from interfering with the photodiodes PD. Accordingly, it is possible to increase the area of each of the photodiodes PD and further improve the sensitivity. Moreover, since the reset wiring 27 and the power supply wiring 29 connected to the reset transistor Tr2 are formed so as to extend along the reset gate electrode 34, it is possible to decrease the spacing between two sharing units 21 being adjacent in the vertical direction. Accordingly, it is possible to increase the area of each of the photodiodes PD and further improve the sensitivity.

Furthermore, by the readout wirings 261 to 268, the readout gate electrodes 221 to 228 and the floating diffusions FD1 and FD2, where it is desired that light is not made incident thereto, can be shielded. In addition to this, the same advantages as those described in Embodiment 1 can be obtained.

Embodiment 17

Exemplary Configuration of Solid-State Imaging Device

Figure 36:
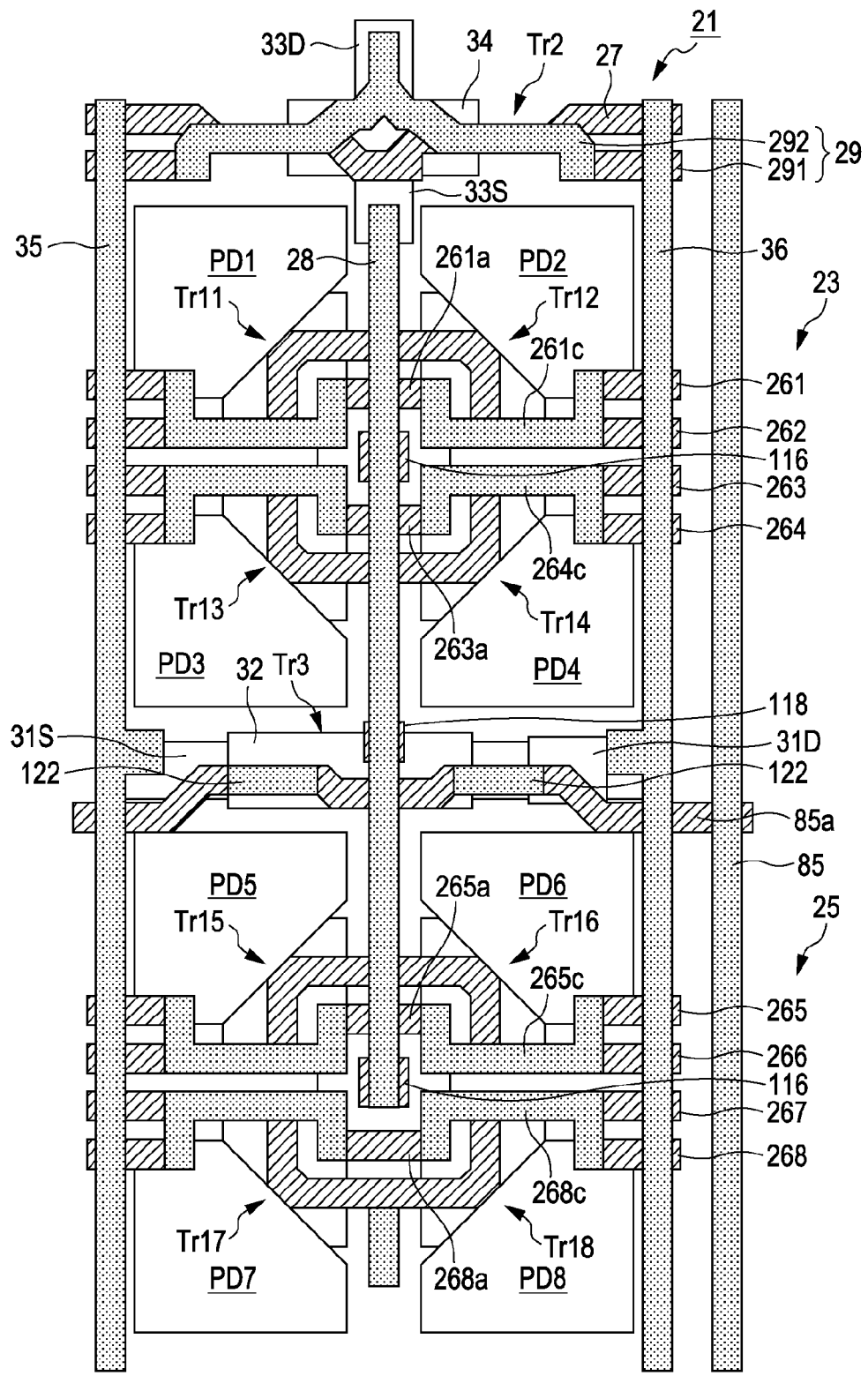
FIG. 36 is a layout diagram of one sharing unit in a pixel portion of a solid-state imaging device according to Embodiment 17.
Figure 37:
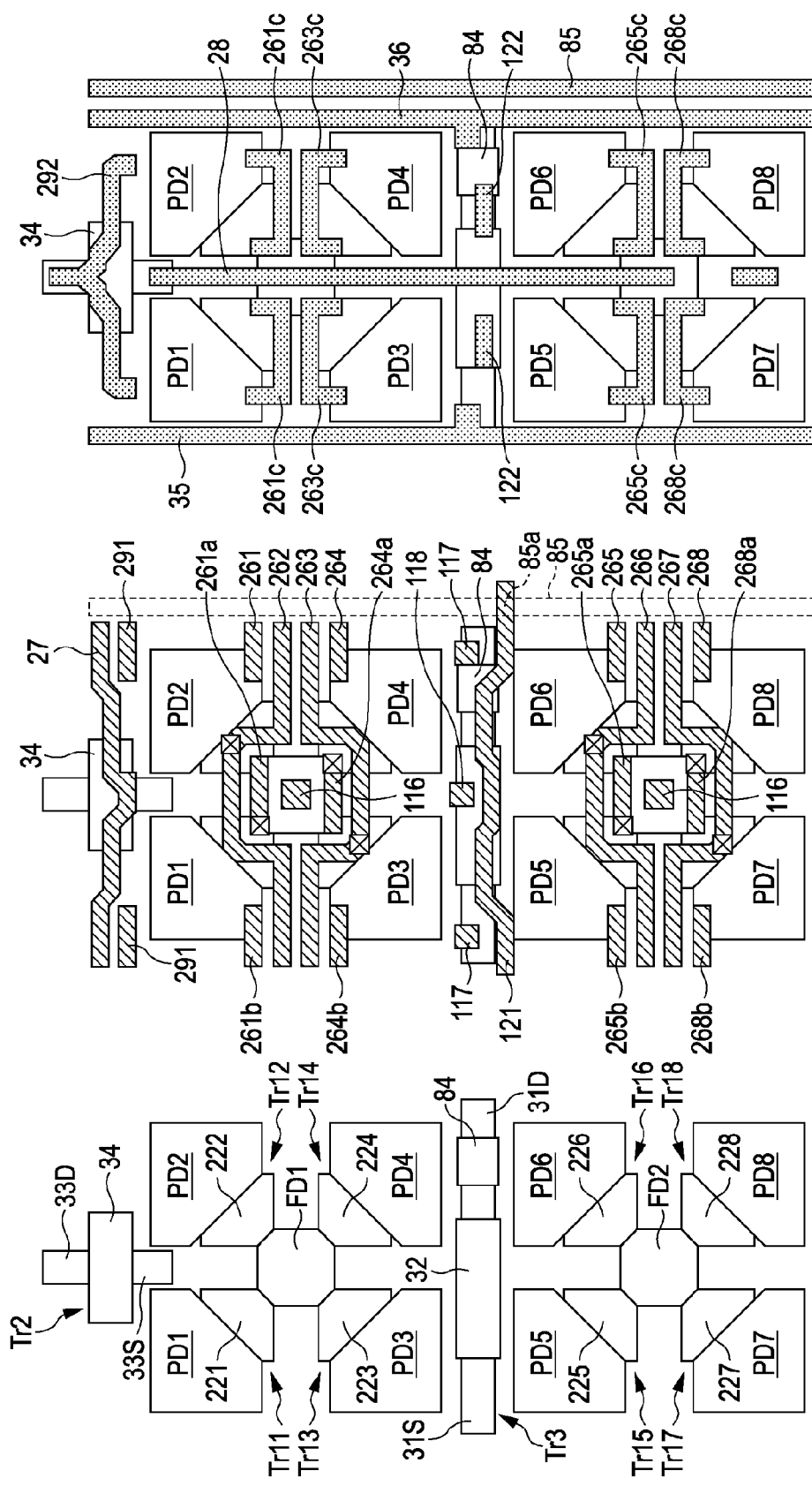
FIGS. 37A to 37C are exploded planar layout diagrams of one sharing unit according to Embodiment 17.

With reference to FIG. 36 and FIGS. 37A to 37C, a solid-state imaging device, namely an MOS solid-state imaging device, according to Embodiment 17 of the present invention is illustrated. FIG. 36 illustrates a main part of a layout of a pixel portion having a select transistor, which uses a two-layer wiring structure. FIGS. 37A to 37C are exploded planar views for understanding the patterns of first-layer wirings and second-layer wirings.

As illustrated in FIG. 36, a solid-state imaging device 125 according to Embodiment 17 includes one sharing unit 21 which includes photodiodes PD (PD1 to PD8) of 8 pixels in total (2 pixels by 4 pixels, respectively, in horizontal and vertical directions) and eleven pixel transistors. The pixel transistors are composed of eight readout transistors Tr11 to Tr18, one reset transistor Tr2, one amplification transistor Tr3, and one select transistor Tr4. The equivalent circuit of this solid-state imaging device 125 is the same as that described in FIG. 28. Such sharing units 21 are arranged in a two-dimensional array to form a pixel portion.

In one sharing unit 21, the amplification transistor Tr3 and the select transistor Tr4 are disposed between the first structural portion 23 and the second structural portion 25. The select transistor Tr4 includes a source region 83S, a drain region 83D, and a select gate electrode 84 and is connected to the amplification transistor Tr3. The source region 83S of the select transistor Tr4 is the same region as the drain region 31D of the amplification transistor Tr3.

The vertical signal line 35 is connected to the source region 31S of the amplification transistor Tr3, and the power supply wiring 36 is connected to the drain region 83D of the select transistor Tr4. The select gate electrode 84 of the select transistor Tr4 is connected to a select wiring 85 which extends in the longitudinal direction. The select gate electrode 84 of the select transistor Tr4 is connected to the longitudinal select wiring 85, which is formed by the second-layer metal wirings M2, via a horizontal connection line 85a which is formed by the first-layer metal wirings M1.

Since other configurations in FIG. 36 and FIGS. 37A to 37C are the same as those described in FIG. 33 and FIGS. 34A to 34C, corresponding portions will be denoted by the same reference numerals, and description thereof will be omitted.

According to the solid-state imaging device 125 of Embodiment 17, the same advantages as those of the solid-state imaging device of Embodiment 15 can be obtained since the solid-state imaging device 125 has the same configuration as that of Embodiment 15 except that the select transistor Tr4 is added.

Embodiment 18

Exemplary Configuration of Solid-State Imaging Device

Figure 38:
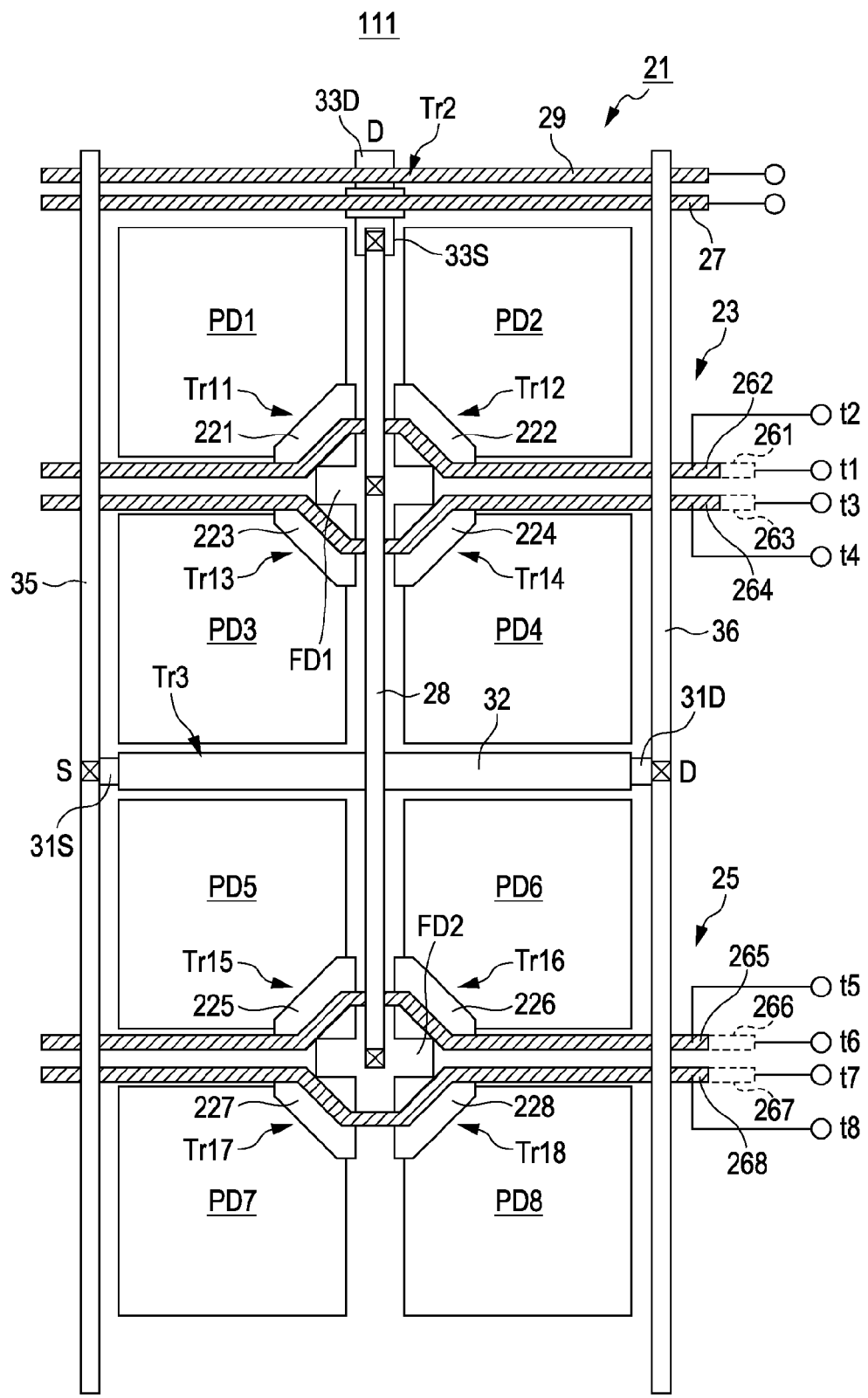
FIG. 38 is a layout diagram of one sharing unit in a pixel portion of a solid-state imaging device according to Embodiment 18.

With reference to FIG. 38 to FIGS. 40A and 40B, a solid-state imaging device, namely an MOS solid-state imaging device, according to Embodiment 18 of the present invention is illustrated. FIG. 38 illustrates a main part of a layout of a pixel portion using a three-layer wiring structure. FIGS. 39A and 39B and FIGS. 40A and 40B are exploded planar views for understanding the patterns of first-layer wirings, second-layer wirings, and third-layer wirings.

Similar to Embodiment 1, as illustrated in FIG. 38, a solid-state imaging device 111 according to Embodiment 18 includes one sharing unit 21 in which photodiodes PD (PD1 to PD8) of 8 pixels in total (2 pixels by 4 pixels, respectively, in horizontal and vertical directions) and ten pixel transistors are arranged. Such sharing units 21 are arranged in a two-dimensional array to form a pixel portion 3. The photodiodes PD1 to PD8 and the readout transistors Tr11 to Tr18 forming the pixel transistors have the same configuration as that of Embodiment 1.

Figure 39A:
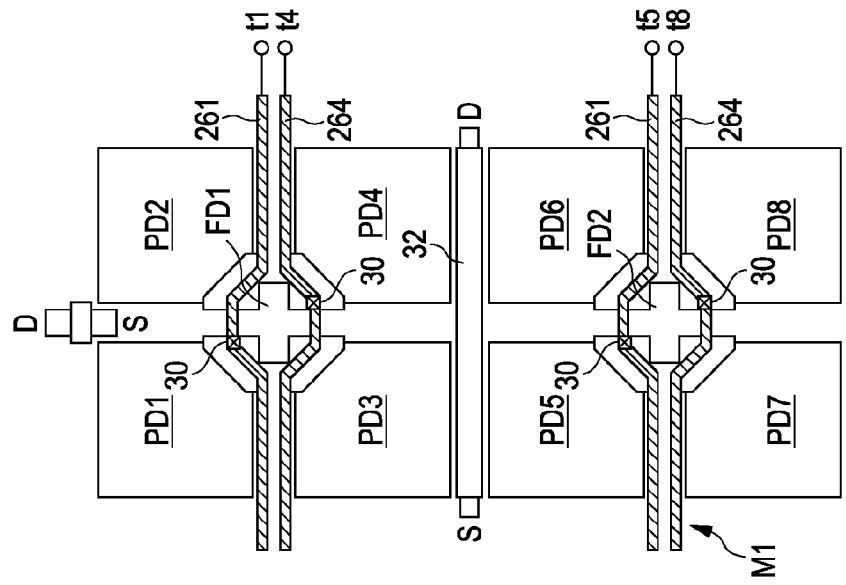
FIGS. 39A and 39B are first exploded planar layout diagrams of one sharing unit according to Embodiment 18.
Figure 39B:
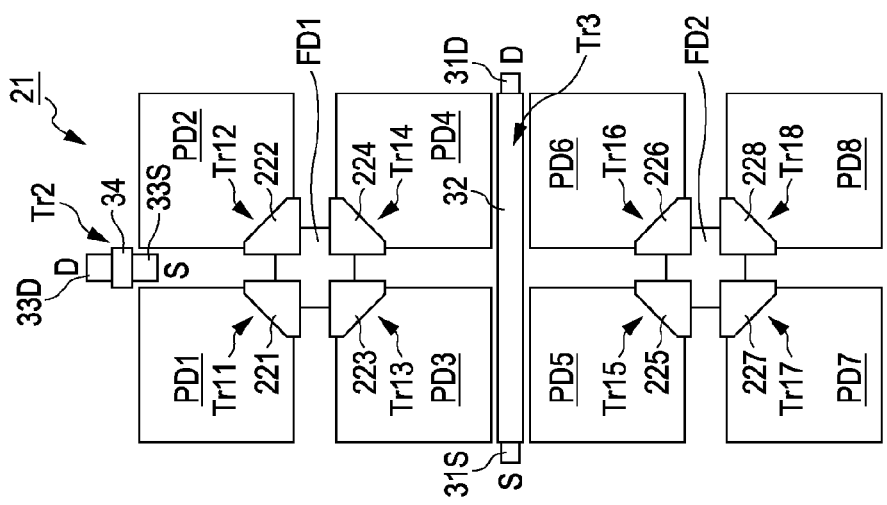

In this embodiment, in particular, as illustrated in FIGS. 39A and 39B and FIGS. 40A and 40B, the wirings are formed in a three-layer wiring structure; that is, the wirings are distributed to first-layer metal wirings M1, second-layer metal wirings M2, and third-layer metal wirings M3. First, as illustrated in FIG. 39A, one sharing unit 21 is formed including an array of photodiodes PD1 to PD8 corresponding to an arrangement of 2 pixels by 4 pixels. That is to say, an array of photodiodes PD1 to PD8, the floating diffusions FD1 and FD2, the readout transistors Tr11 to Tr18 having the readout gate electrodes 221 to 228, the reset transistor Tr2, and the amplification transistor Tr3 are formed. Next, as illustrated in FIG. 39B, four readout wirings 261, 264, 265, and 268 are formed by the first-layer metal wirings M1 so as to extend in the transverse direction and be connected to the readout gate electrodes 221, 224, 225, and 228, respectively.

Figure 40A:
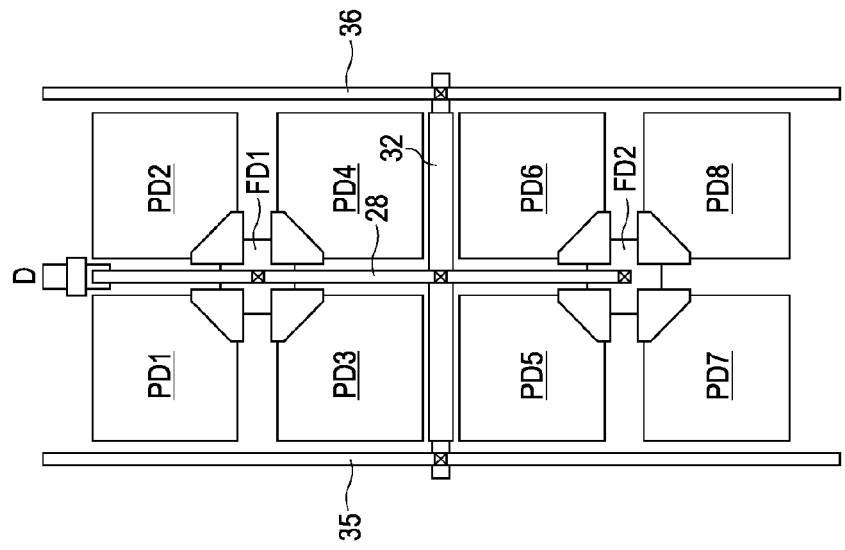
FIGS. 40A and 40B are second exploded planar layout diagrams of one sharing unit according to Embodiment 18.

Next, as illustrated in FIG. 40A, four readout wirings 26 (262, 263, 266, and 267) are formed by the second-layer metal wirings M2 so as to extend in the transverse direction and be connected to the readout gate electrodes 22 (222, 223, 226, and 227), respectively. The readout wirings 26 (262, 263, 266, and 267) formed by the second-layer metal wirings M2 are formed so as to overlap with the readout wirings 26 (261, 264, 265, and 268) formed by the first-layer metal wirings M1, respectively. Therefore, when observed in a top plan view, as illustrated in FIG. 38, two readout wirings 26 are disposed between the first-row photodiodes PD and the second-row photodiodes PD and between the third-row photodiodes PD and the fourth-row photodiodes PD, respectively. The spacing between the two readout wirings 26 which are disposed between the rows is set to a value equal to or smaller than the diffraction limit. Moreover, the reset wiring 27, which is connected to the reset gate electrode 34 of the reset transistor Tr2, and the power supply wiring 29, which is connected to the drain region 33S, are formed by the second-layer metal wirings M2 so as to extend in the transverse direction.

Figure 40B:
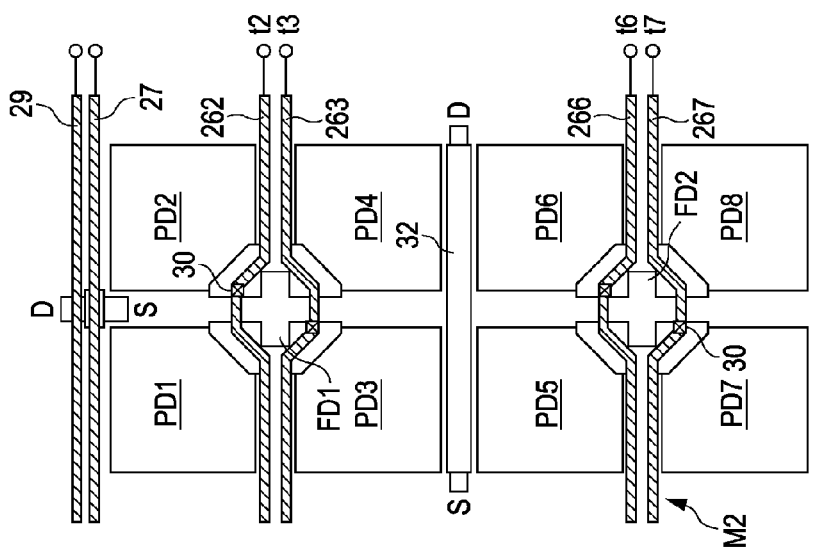

Next, as illustrated in FIG. 40B, the connection wiring 28, the vertical signal line 35, and the power supply wiring 36 which is connected to the drain region 31D of the amplification transistor are formed by the third-layer metal wirings M3 so as to extend in the longitudinal direction. The connection wiring 28 is a wiring that connects the floating diffusions FD1 and FD2, the amplification gate electrode 32, and the source region 33S of the reset transistor together.

Since other configurations are the same as those described in Embodiment 1, portions corresponding to those in FIG. 2 will be denoted by the same reference numerals, and description thereof will be omitted.

In Embodiment 18, a first readout pulse is applied through a terminal t1 to the readout wiring 261 which is formed by the first-layer metal wirings M1, whereby the readout transistor Tr11 is turned on, and signals are read from the photodiode PD1. A second readout pulse is applied through a terminal t2 to the readout wiring 262 which is formed by the second-layer metal wirings M2, whereby the readout transistor Tr12 is turned on, and signals are read from the photodiode PD2. A third readout pulse is applied through a terminal t3 to the readout wiring 263 which is formed by the second-layer metal wirings M2, whereby the readout transistor Tr13 is turned on, and signals are read from the photodiode PD3. A fourth readout pulse is applied through a terminal t4 to the readout wiring 264 which is formed by the first-layer metal wirings M1, whereby the readout transistor Tr14 is turned on, and signals are read from the photodiode PD4.

A fifth readout pulse is applied through a terminal t5 to the readout wiring 265 which is formed by the first-layer metal wirings M1, whereby the readout transistor Tr15 is turned on, and signals are read from the photodiode PD5. A sixth readout pulse is applied through a terminal t6 to the readout wiring 266 which is formed by the second-layer metal wirings M2, whereby the readout transistor Tr16 is turned on, and signals are read from the photodiode PD6. A seventh readout pulse is applied through a terminal t7 to the readout wiring 267 which is formed by the second-layer metal wirings M2, whereby the readout transistor Tr17 is turned on, and signals are read from the photodiode PD7. An eighth readout pulse is applied through a terminal t8 to the readout wiring 268 which is formed by the first-layer metal wirings M1, whereby the readout transistor Tr18 is turned on, and signals are read from the photodiode PD8.

According to the solid-state imaging device 111 of Embodiment 18, since the wirings are formed to be distributed to the first, second, and third-layer metal wirings M1, M2, and M3 that form a three-layer wiring structure, the parasitic capacitance connected to the floating diffusions FD1 and FD2 can be decreased. That is to say, since the connection wiring 28 connected to the floating diffusions FD1 and FD2 is formed by the third-layer metal wirings M3, the spacing between the connection wiring 28 and the semiconductor substrate can be increased. Therefore, the parasitic capacitance formed between the connection wiring 28 and the semiconductor substrate can be decreased, and the conversion efficiency can be improved. Furthermore, when observed in a top plan view, since two readout wirings 26 are disposed between the rows, the aperture area of each of the photodiodes PD1 to PD8 can be increased to be larger than that of Embodiment 1. Therefore, it is possible to improve the sensitivity of the solid-state imaging device 111. In addition to this, the same advantages as those described in Embodiment 1 can be obtained.

Embodiment 19

Exemplary Configuration of Solid-State Imaging Device

With reference to FIGS. 41 to 44, a solid-state imaging device, namely an MOS solid-state imaging device, according to Embodiment 19 of the present invention is illustrated.

Figure 41:
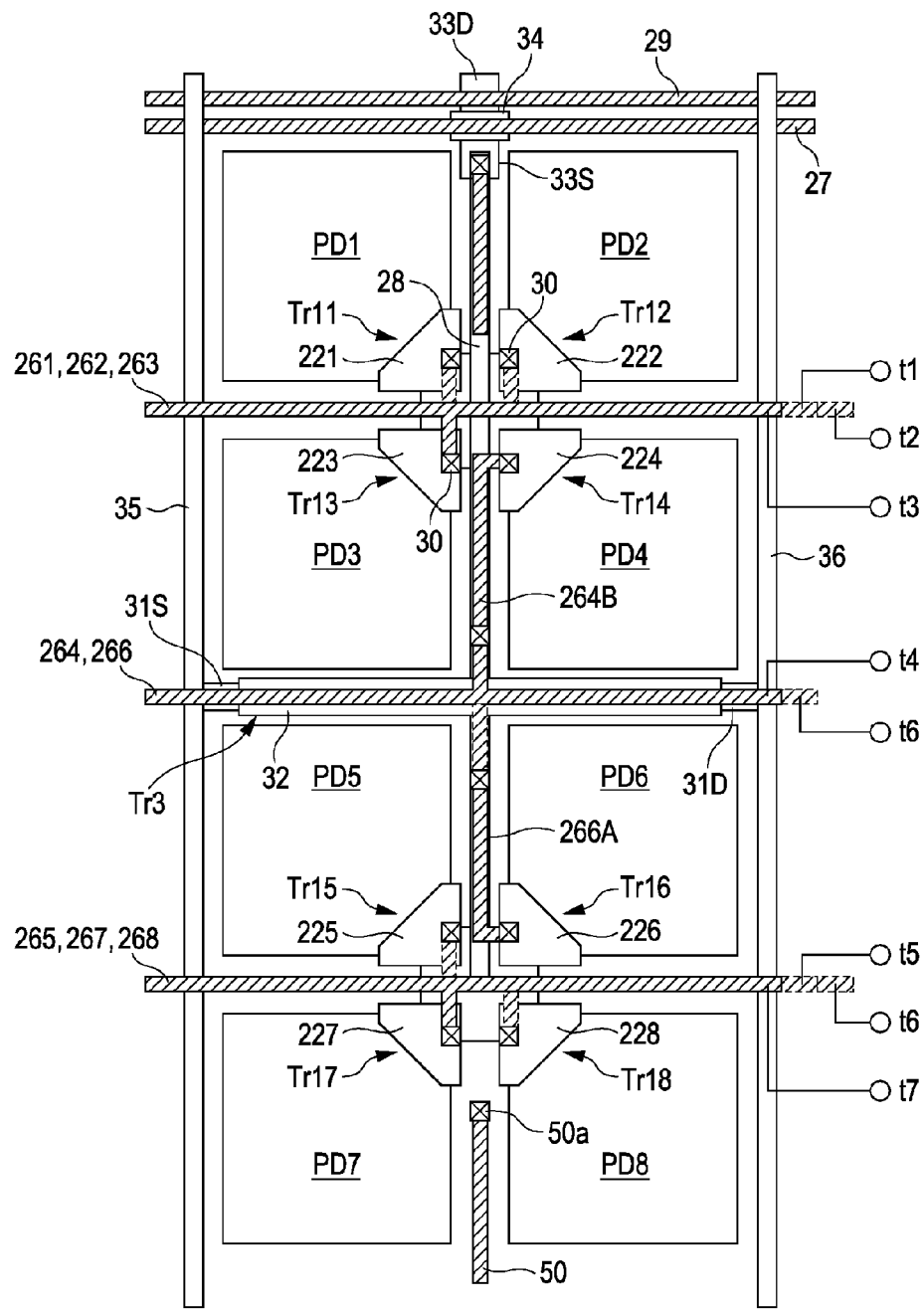
FIG. 41 is a layout diagram of one sharing unit in a pixel portion of a solid-state imaging device according to Embodiment 19.

FIG. 41 illustrates a main part of a layout of a pixel portion using a four-layer wiring structure. FIGS. 42A and 42B to FIG. 44 are exploded planar views for understanding the patterns of first-layer wirings, second-layer wirings, third-layer wirings, and fourth-layer wirings.

Similar to Embodiment 1, as illustrated in FIG. 41, a solid-state imaging device 112 according to Embodiment 19 includes one sharing unit 21 in which photodiodes PD (PD1 to PD8) of 8 pixels in total (2 pixels by 4 pixels, respectively, in horizontal and vertical directions) and ten pixel transistors are arranged. Such sharing units 21 are arranged in a two-dimensional array to form a pixel portion 3. The photodiodes PD1 to PD8 and the readout transistors Tr11 to Tr18 forming the pixel transistors have the same configuration as that of Embodiment 1.

Figure 42A:
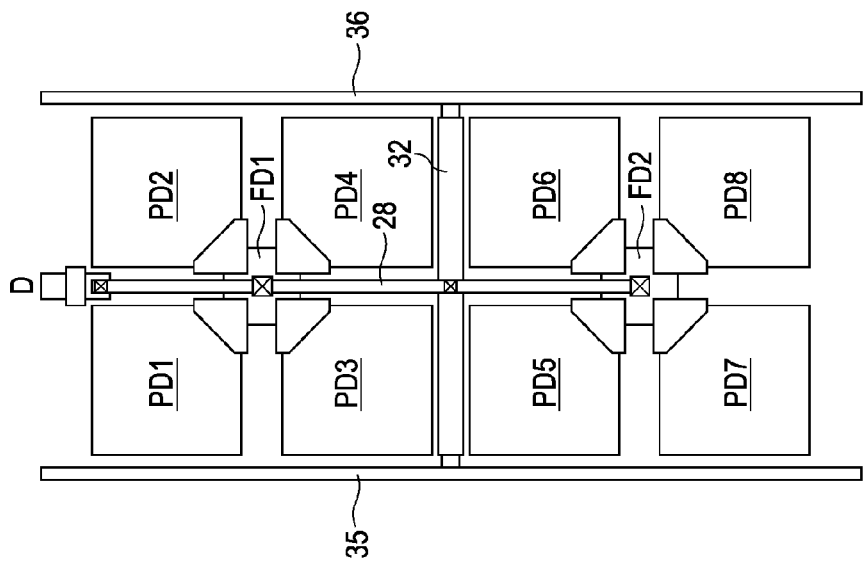
FIGS. 42A and 42B are first exploded planar layout diagrams of one sharing unit according to Embodiment 19.

In this embodiment, in particular, as illustrated in FIGS. 42A and 42B to FIG. 44, the wirings are formed in a four-layer wiring structure; that is, the wirings are distributed to first-layer metal wirings M1, second-layer metal wirings M2, third-layer metal wirings M3, and fourth-layer metal wirings M4. First, as illustrated in FIG. 42A, an array of photodiodes PD1 to PD8 corresponding to an arrangement of 2 pixels by 4 pixels and the readout transistors Tr11 to Tr18 having the readout gate electrodes 221 to 228 are formed. Furthermore, the reset transistor Tr2 and the amplification transistor Tr3 are formed, whereby one sharing unit 21 is obtained.

Figure 42B:
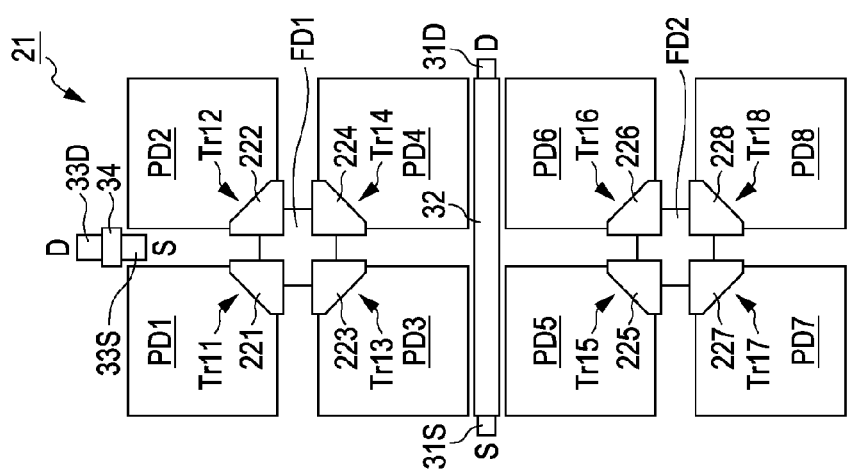

Next, as illustrated in FIG. 42B, the connection wiring 28, the vertical signal line 35, and the power supply wiring 36 which is connected to the drain region 31D of the amplification transistor are formed by the first-layer metal wirings M1 so as to extend in the longitudinal direction. The connection wiring 28 is a wiring that connects the floating diffusions FD1 and FD2, the amplification gate electrode 32, and the source region 33S of the reset transistor together.

Figure 43A:
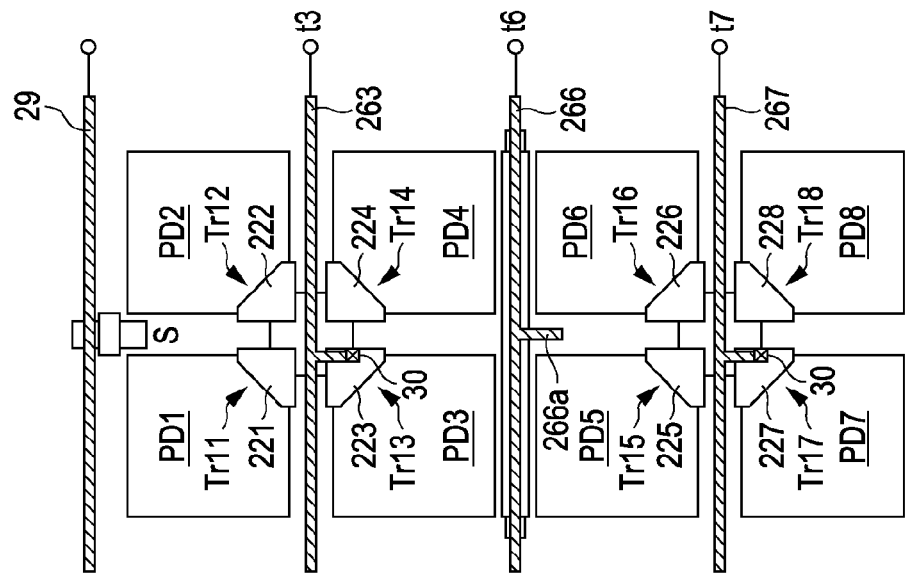
FIGS. 43A and 43B are second exploded planar layout diagrams of one sharing unit according to Embodiment 19.

Next, as illustrated in FIG. 43A, the readout wiring 262 for reading the photodiode PD2, the readout wiring 264 for reading the photodiode PD4, and the readout wiring 268 for reading the photodiode PD8 are formed by the second-layer metal wirings M2. These readout wirings 262, 264, and 268 are formed so as to extend in the transverse direction so that only one wiring appears between the rows. The readout wiring 262 is connected to the readout gate electrode 222. The readout wiring 268 is connected to the readout gate electrode 228. The readout wiring 264 is formed with a connection portion 264a which is formed at the center thereof so as to protrude upward in the figure. The reset wiring 27 connected to the reset gate electrode 34 is formed by the second-layer metal wirings M2 so as to extend in the transverse direction.

Figure 43B:
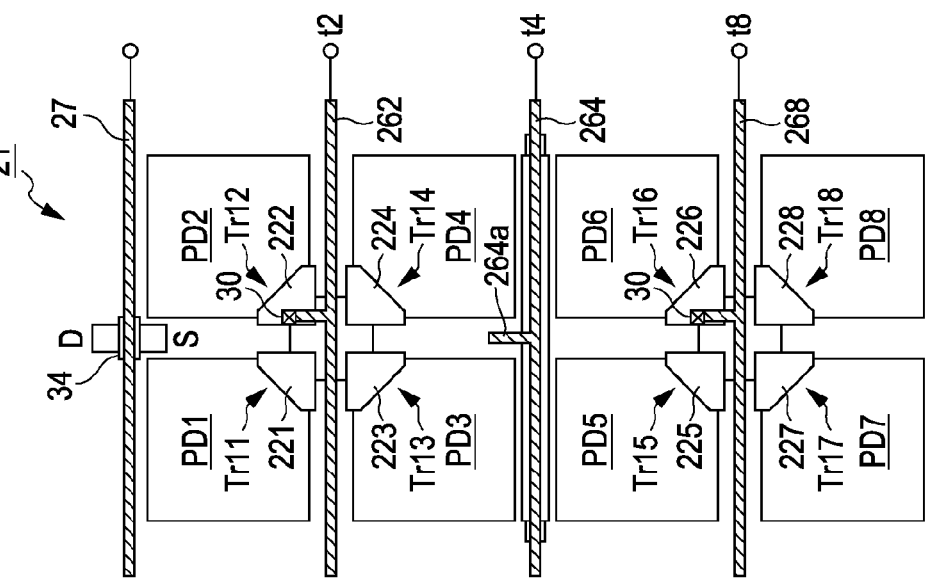

Next, as illustrated in FIG. 43B, the readout wiring 263 for reading the photodiode PD3, the readout wiring 266 for reading the photodiode PD6, and the readout wiring 267 for reading the photodiode PD7 are formed by the third-layer metal wirings M3. These readout wirings 263, 266, and 267 are formed so as to extend in the transverse direction and overlap with the readout wirings 262, 264, and 268, which are formed by the second-layer metal wirings M2, so that only one wiring appears between the rows. The readout wiring 263 is connected to the readout gate electrode 223. The readout wiring 267 is connected to the readout gate electrode 227. The readout wiring 266 is formed with a connection portion 266a which is formed at the center thereof so as to protrude downward in the figure. The power supply wiring 29 connected to the drain region 33D of the reset transistor Tr2 is formed by the third-layer metal wirings M3 so as to extend in the transverse direction.

Figure 44:
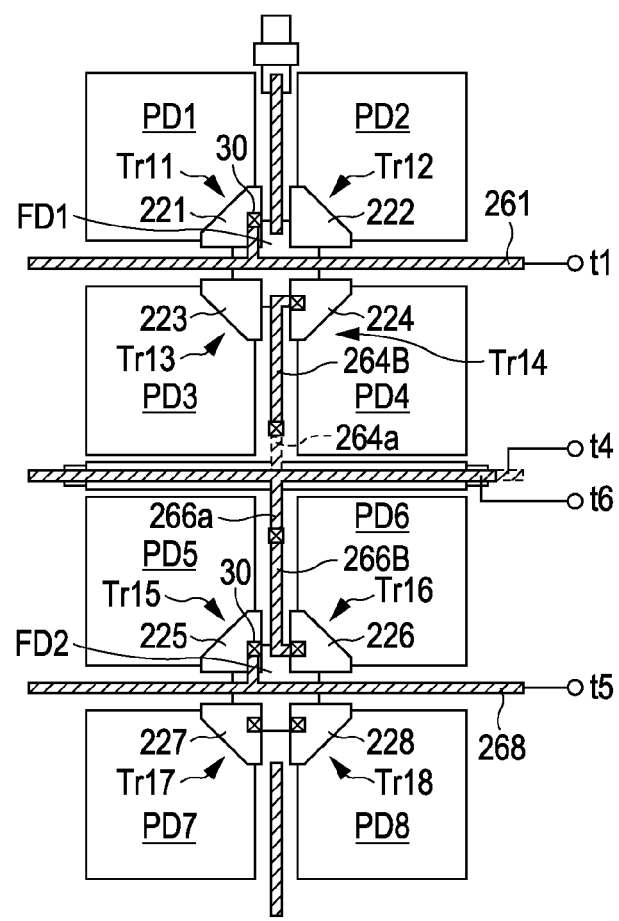
FIG. 44 is a third exploded planar layout diagram of one sharing unit according to Embodiment 19.

Next, as illustrated in FIG. 44, the readout wiring 261 for reading the photodiode PD1 and the readout wiring 265 for reading the photodiode PD5 are formed by the fourth-layer metal wiring M4. The readout wiring 261 is formed so as to extend in the transverse direction and overlap with the readout wiring 262 which is formed by the second-layer metal wirings M2 and the readout wiring 263 which is formed by the third-layer metal wirings M3. The readout wiring 261 is connected to the readout gate electrode 221 of the readout transistor Tr11 via the connection portions of the third-layer metal wirings M3 and the second-layer metal wirings M2. Moreover, a substrate contact wiring 50 which is connected to a substrate contact portion 50a is formed by the fourth-layer metal wirings M4. The substrate contact wiring 50 is used for applying a substrate voltage, namely a predetermined voltage to the semiconductor well region in which the photodiodes and the pixel transistors are formed. For example, when an n-type substrate is used, a voltage of 0 V is applied to a p-type semiconductor well region in which the photodiodes and the pixel transistors are formed.

The readout wiring 265 is formed so as to extend in the transverse direction and overlap with the readout wiring 268 which is formed by the second-layer metal wirings M2 and the readout wiring 267 which is formed by the third-layer metal wirings M3. The readout wiring 265 is connected to the readout gate electrode 225 of the readout transistor Tr15 via the connection portions of the third-layer metal wirings M3 and the second-layer metal wirings M2.

Furthermore, a connection line 264B is formed by the fourth-layer metal wirings M4 so as to connect the readout gate electrode 224 of the readout transistor Tr14 and a connection portion 264a of the readout wiring 264 which is formed by the second-layer metal wirings M2. One end of the connection line 264B is connected to the readout gate electrode 224 via the connection portions of the third-layer metal wirings M3, the second-layer metal wirings M2, and the first-layer metal wirings M1. The other end of the connection line 264B is connected to the connection portion 264a of the readout wiring 264 formed by the second-layer metal wirings M2 via the connection portion of the third-layer metal wirings M3. The connection line 264B is formed so as to overlap with the connection wiring 28 which is formed by the first-layer metal wirings M1. Furthermore, a connection line 266B is formed by the fourth-layer metal wirings M4 so as to connect the readout gate electrode 226 of the readout transistor Tr16 and a connection portion 266a of the readout wiring 266 which is formed by the third-layer metal wirings M3. One end of the connection line 266B is connected to the readout gate electrode 226 via the connection portion of the third-layer metal wirings M3, the second-layer metal wirings M2, and the first-layer metal wirings M1. The other end of the connection line 266B is connected to the connection portion 266a of the readout wiring 266 formed by the third-layer metal wirings M3. The connection line 266B is formed so as to overlap with the connection wiring 28 which is formed by the first-layer metal wirings M1.

In Embodiment 12, when observed in a top plan view, only one readout wiring is disposed between the rows of the photodiodes PD.

In Embodiment 19, a first readout pulse is applied through a terminal t1 to the readout wiring 261 which is formed by the fourth-layer metal wirings M4, whereby the readout transistor Tr11 is turned on, and signals are read from the photodiode PD1. A second readout pulse is applied through a terminal t2 to the readout wiring 262 which is formed by the second-layer metal wirings M2, whereby the readout transistor Tr12 is turned on, and signals are read from the photodiode PD2. A third readout pulse is applied through a terminal t3 to the readout wiring 263 which is formed by the third-layer metal wirings M3, whereby the readout transistor Tr13 is turned on, and signals are read from the photodiode PD3.

A fourth readout pulse is applied through a terminal t4 to the readout wiring 264 which is formed by the second-layer metal wirings M2, whereby the readout transistor Tr14 is turned on via the connection line 264B which is formed by the fourth-layer metal wirings M4, and signals are read from the photodiode PD4. A sixth readout pulse is applied through a terminal t6 to the readout wiring 266 which is formed by the third-layer metal wirings M3, whereby the readout transistor Tr16 is turned on via the connection line 266B which is formed by the fourth-layer metal wirings M4, and signals are read from the photodiode PD6.

A fifth readout pulse is applied through a terminal t5 to the readout wiring 265 which is formed by the fourth-layer metal wirings M4, whereby the readout transistor Tr15 is turned on, and signals are read from the photodiode PD5. A seventh readout pulse is applied through a terminal t7 to the readout wiring 267 which is formed by the third-layer metal wirings M3, whereby the readout transistor Tr17 is turned on, and signals are read from the photodiode PD7. An eighth readout pulse is applied through a terminal t8 to the readout wiring 268 which is formed by the second-layer metal wirings M2, whereby the readout transistor Tr18 is turned on, and signals are read from the photodiode PD8.

Although the order of reading the pixel signals is changed, the pixel signals can be rearranged by a post-processing circuit so that the pixel signals can be read out in units of rows.

According to the solid-state imaging device 112 of Embodiment 19, since only one readout wiring 26 is disposed between the rows as viewed in a top plan view thereof, the aperture area of each of the photodiodes PD1 to PD8 can be increased to be larger than that of Embodiment 1. Moreover, since the wirings are formed in a four-layer wiring structure, the connection lines 264B and 266B which are formed by the fourth-layer metal wirings M4 and are positioned farthest from the connection wiring 28 are formed on the connection wiring 28 which is formed by the first-layer metal wirings M1 and is connected to the floating diffusion FD1 and FD2. Therefore, the parasitic capacitance formed between the connection wiring 28 and the connection lines 264B and 266B can be decreased, and the conversion efficiency can be improved. Therefore, it is possible to improve the sensitivity of the solid-state imaging device 112. In addition to this, the same advantages as those described in Embodiment 1 can be obtained.

Embodiment 20

Exemplary Configuration of Solid-State Imaging Device

Figure 45:
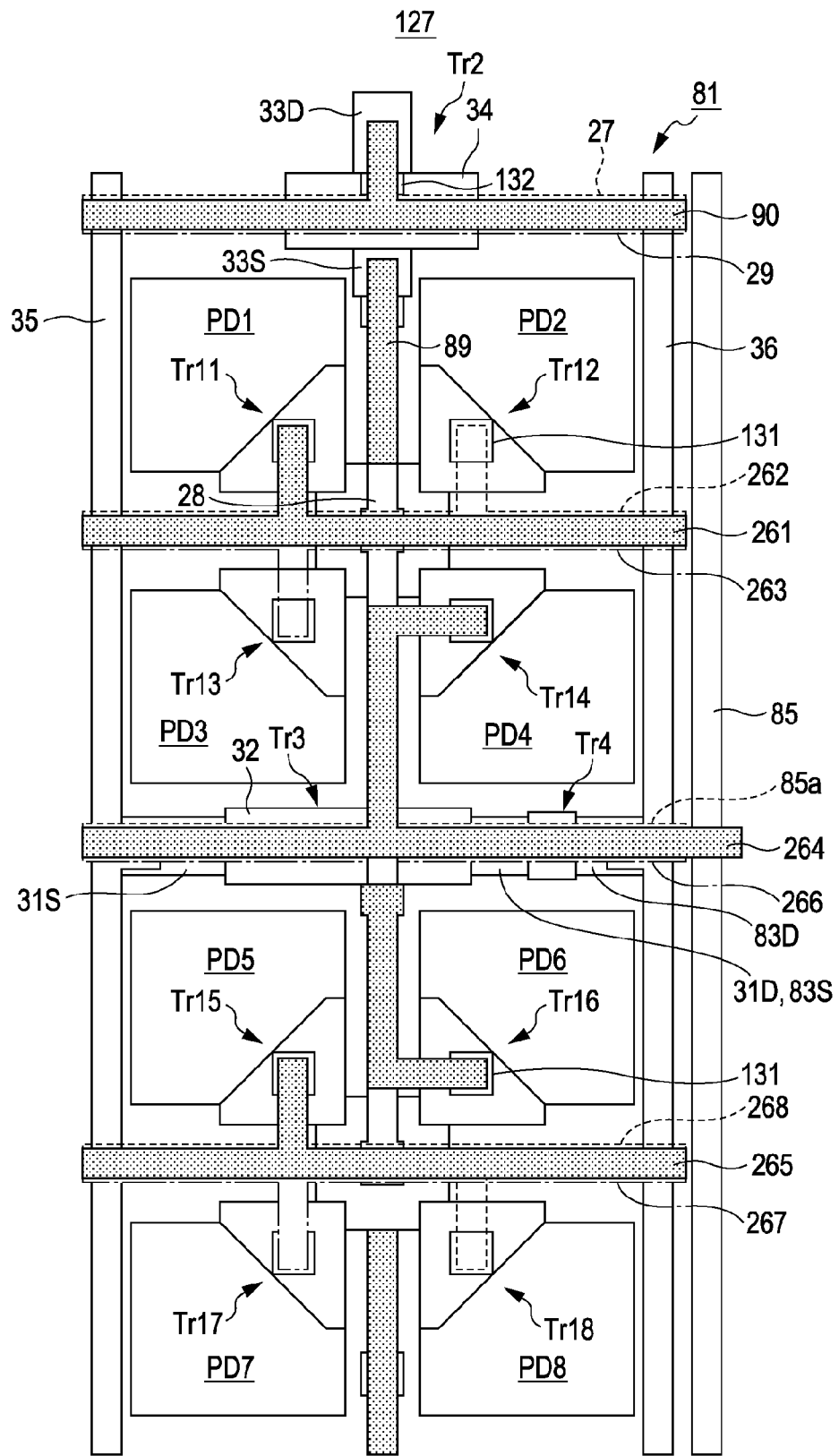
FIG. 45 is a layout diagram of one sharing unit in a pixel portion of a solid-state imaging device according to Embodiment 20.

With reference to FIG. 45 to FIGS. 47C and 47D, a solid-state imaging device, namely an MOS solid-state imaging device, according to Embodiment 20 of the present invention is illustrated. FIG. 45 illustrates a main part of a layout of a pixel portion using a four-layer wiring structure. FIGS. 46A and 46B and FIGS. 47C and 47D are exploded planar views for understanding the patterns of first-layer wirings, second-layer wirings, third-layer wirings, and fourth-layer wirings.

As illustrated in FIG. 45, a solid-state imaging device 127 according to Embodiment 20 includes one sharing unit 81 which includes photodiodes PD (PD1 to PD8) of 8 pixels in total (2 pixels by 4 pixels, respectively, in horizontal and vertical directions) and eleven pixel transistors. The pixel transistors are composed of eight readout transistors Tr11 to Tr18, one reset transistor Tr2, one amplification transistor Tr3, and one select transistor Tr4. The equivalent circuit of this solid-state imaging device 125 is the same as that described in FIG. 33. Such sharing units 81 are arranged in a two-dimensional array to form a pixel portion.

In one sharing unit 81, the amplification transistor Tr3 and the select transistor Tr4 are disposed between the first structural portion 23 and the second structural portion 25. The select transistor Tr4 includes a source region 83S, a drain region 83D, and a select gate electrode 84 and is connected to the amplification transistor Tr3. The source region 83S of the select transistor Tr4 is the same region as the drain region 31D of the amplification transistor Tr3.

As illustrated in FIGS. 46A and 46B and FIGS. 47C and 47D, the solid-state imaging device according to this embodiment has the same configuration as that of Embodiment 12 except for the select transistor Tr4.

First, as illustrated in FIG. 46A, an array of photodiodes PD1 to PD8 corresponding to an arrangement of 2 pixels by 4 pixels, the readout transistors Tr11 to Tr18 having the readout gate electrodes 221 to 228, and the reset transistor Tr2 are formed. Furthermore, the amplification transistor Tr3 and the select transistor Tr4 are formed, whereby one sharing unit 21 is obtained. Moreover, a connection wiring 35 is formed by the first-layer metal wirings M1 so as to connect the floating diffusions FD1 and FD2, the amplification gate electrode 32, and the source region 33S of the reset transistor together.

Furthermore, the wirings formed by the first-layer metal wirings M1 are formed. Specifically, the vertical signal line 35 which is connected to the source region 31S of the amplification transistor Tr3 and the power supply wiring 36 which is connected to the drain region 83D of the select transistor Tr4 are formed so as to extend in the longitudinal direction. Moreover, the select wiring 85 is formed in the longitudinal direction in parallel to the power supply wiring 36. At the same time, connection portions 131 connected to the readout gate electrodes 221 to 228, a connection portion 132 connected to the reset gate electrode 34, a connection portion 133 connected to the select gate electrode 84, and a connection portion 134 for substrate contact are formed by the first-layer metal wirings M1.

Next, as illustrated in FIG. 46B, the wirings formed by the second-layer metal wirings M2 are formed. Specifically, the reset wiring 27 is formed so as to be connected to the reset gate electrode 34 via the connection portion 132. Moreover, the connection line 85a is formed in the transverse direction so as to be connected to the select gate electrode 84 and the select wiring 85 via the connection portion 133. The connection line 85a is formed so as to cover the entire width of one sharing unit 21. Furthermore, the readout wiring 268 which is connected to the readout gate electrode 222 via the connection portion 131 and the readout wiring 268 which is connected to the readout gate electrode 228 via the connection portion 131 are formed in the transverse direction. The readout wiring 262 is formed between pixels which are adjacent to each other in the longitudinal direction of the first structural portion 23. The readout wiring 268 is formed between pixels which are adjacent to each other in the longitudinal direction of the second structural portion 25.

Next, as illustrated in FIG. 47C, the wirings formed by the third-layer metal wirings M3 are formed. Specifically, the power supply wiring 29 which is connected to the drain region 33D of the reset transistor Tr2 via the connection portion 131 of the first-layer metal wirings M1 and the connection portion (not illustrated) of the second-layer metal wirings M2 is formed so as to overlap with the reset wiring 27. Moreover, the readout wiring 263 which is connected to the readout gate electrode 223 via the connection portion 131 of the first-layer metal wirings M1 and the connection portion (not illustrated) of the second-layer metal wirings M2 is formed so as to overlap with the readout wiring 262. Furthermore, the readout wiring 267 which is connected to the readout gate electrode 227 via the connection portion 131 of the first-layer metal wirings M1 and the connection portion (not illustrated) of the second-layer metal wirings M2 is formed so as to overlap with the readout wiring 268. Furthermore, the readout wiring 266 which is connected to the readout gate electrode 226 in a subsequent step and partly extends between the photodiodes PD5 and PD6 is formed so as to overlap with the connection line 85a on the amplification transistor Tr3.

Next, as illustrated in FIG. 47D, the wirings formed by the fourth-layer metal wirings M4 are formed. Specifically, the readout wiring 261 which is connected to the readout gate electrode 221 via the connection portion 131 of the first-layer metal wirings M1 and the connection portions (not illustrated) of the second and third-layer metal wirings M2 and M3 is formed so as to overlap with the readout wiring 263. Moreover, the readout wiring 265 which is connected to the readout gate electrode 225 via the connection portion 131 of the first-layer metal wirings M1 and the connection portions (not illustrated) of the second and third-layer metal wirings M2 and M3 is formed so as to overlap with the readout wiring 268. Furthermore, the connection line 266a which connects the readout gate electrode 226 and the readout wiring 266 formed by the third-layer metal wirings M3 together via the connection portion 131 of the first-layer metal wirings M1 and the connection portions (not illustrated) of the second and third-layer metal wirings M2 and M3 is formed so as to overlap with the connection wiring 28. Furthermore, the readout wiring 264 which is connected to the readout gate electrode 224 via the connection portion 131 of the first-layer metal wirings M1 and the connection portions (not illustrated) of the second and third-layer metal wirings M2 and M3 is formed so as to overlap with the readout wiring 266 and the connection wiring 28.

In addition, the substrate contact wiring 50 is formed via the connection portion 131 of the first-layer metal wirings M1 and the connection portions (not illustrated) of the second and third-layer metal wirings M2 and M3. Moreover, a dummy wiring 89 that overlaps with the connection wiring 28 between the floating diffusion FD1 and the source region 33S of the reset transistor Tr2 and a dummy wiring 90 that overlaps with the power supply wiring 29 on the reset transistor Tr2 are formed from the consideration of wiring balance.

In Embodiment 20, a first readout pulse is applied through a terminal t1 to the readout wiring 261 which is formed by the fourth-layer metal wirings M4, whereby the readout transistor Tr11 is turned on, and signals are read from the photodiode PD1. A second readout pulse is applied through a terminal t2 to the readout wiring 262 which is formed by the second-layer metal wirings M2, whereby the readout transistor Tr12 is turned on, and signals are read from the photodiode PD2. A third readout pulse is applied through a terminal t3 to the readout wiring 263 which is formed by the third-layer metal wirings M3, whereby the readout transistor Tr13 is turned on, and signals are read from the photodiode PD3.

A fourth readout pulse is applied through a terminal t4 to the readout wiring 264 which is formed by the fourth-layer metal wirings M4, whereby the readout transistor Tr14 is turned on, and signals are read from the photodiode PD4. A sixth readout pulse is applied through a terminal t6 to the readout wiring 266 which is formed by the third-layer metal wirings M3, whereby the readout transistor Tr16 is turned on via the connection line 266a which is formed by the fourth-layer metal wirings M4, and signals are read from the photodiode PD6.

A fifth readout pulse is applied through a terminal t5 to the readout wiring 265 which is formed by the fourth-layer metal wirings M4, whereby the readout transistor Tr15 is turned on, and signals are read from the photodiode PD5. A seventh readout pulse is applied through a terminal t7 to the readout wiring 267 which is formed by the third-layer metal wirings M3, whereby the readout transistor Tr17 is turned on, and signals are read from the photodiode PD7. An eighth readout pulse is applied through a terminal t8 to the readout wiring 268 which is formed by the second-layer metal wirings M2, whereby the readout transistor Tr18 is turned on, and signals are read from the photodiode PD8.

Although the order of reading the pixel signals is changed, the pixel signals can be rearranged by a post-processing circuit so that the pixel signals can be read out in units of rows.

According to the solid-state imaging device 127 of Embodiment 20, similar to Embodiment 19 described above, since only one readout wiring 26 is disposed between the rows as viewed in a top plan view thereof, the aperture area of each of the photodiodes PD1 to PD8 can be increased to be larger than that of Embodiment 1. Moreover, since the wirings are formed in a four-layer wiring structure, the connection lines 264B and 266B which are formed by the fourth-layer metal wirings M4 and are positioned farthest from the connection wiring 28 are formed on the connection wiring 28 which is formed by the first-layer metal wirings M1 and is connected to the floating diffusion FD1 and FD2. Therefore, the parasitic capacitance formed between the connection wiring 28 and the connection lines 264B and 266B can be decreased, and the conversion efficiency can be improved. Therefore, it is possible to improve the sensitivity of the solid-state imaging device 127.

Moreover, the dummy wirings 89 and 90 are formed so as to surround each of the photodiodes PD1 to PD8 in a C shape together with the readout wirings 261, 264, 266a, and 225. Due to this configuration, the photodiodes PD1 to PD8 are surrounded by the metal wirings on the same layer with a good symmetry, and thus a color mixture due to diffraction of light can be prevented. In addition to this, the same advantages as those described in Embodiment 1 can be obtained.

Figure 48:
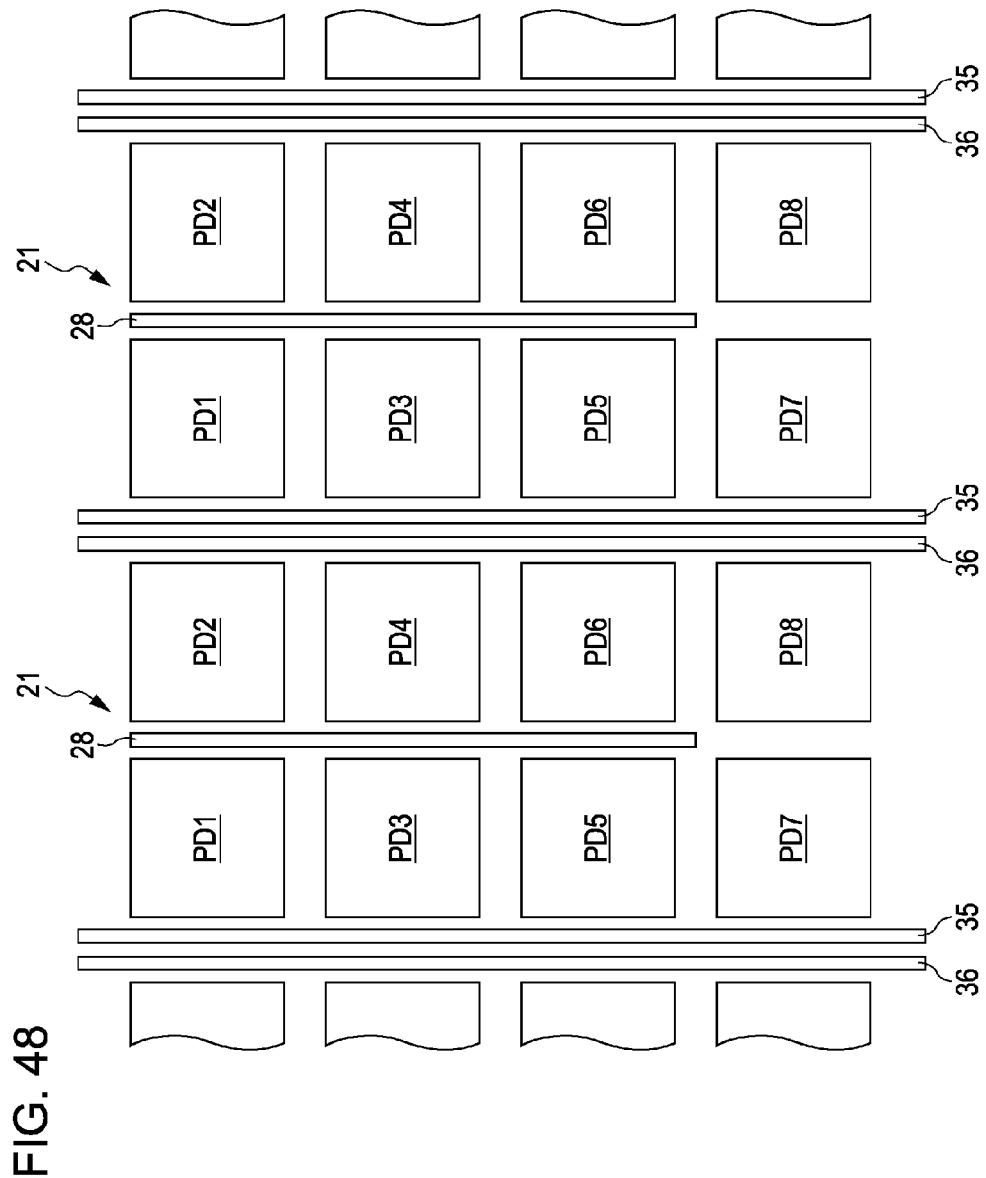
FIG. 48 is a plan view illustrating a schematic layout of a solid-state imaging device according to the embodiment of the present invention.

The above-described solid-state imaging device having a configuration in which one sharing unit 21 is composed of the photodiodes PD (PD1 to PD8) of 8 pixels in total (2 pixels by 4 pixels, respectively, in horizontal and vertical directions) and ten pixel transistors has a longitudinal wiring layout as illustrated in FIG. 48. That is to say, the solid-state imaging device of the embodiment of the present invention has a layout in which one longitudinal connection wiring 28 is disposed at the center of the array of photodiodes PD of eight pixels, and two wirings, i.e., the vertical signal line 35 and the power supply wiring 36, are disposed between the adjacent sharing units 21. Such a wiring layout is very simple.

Modification of Amplification Transistor

With reference to FIGS. 51 to 57, modified examples of the amplification transistor Tr3 which is disposed between the first structural portion 23 and the second structural portion 24 are illustrated.

Figure 51:
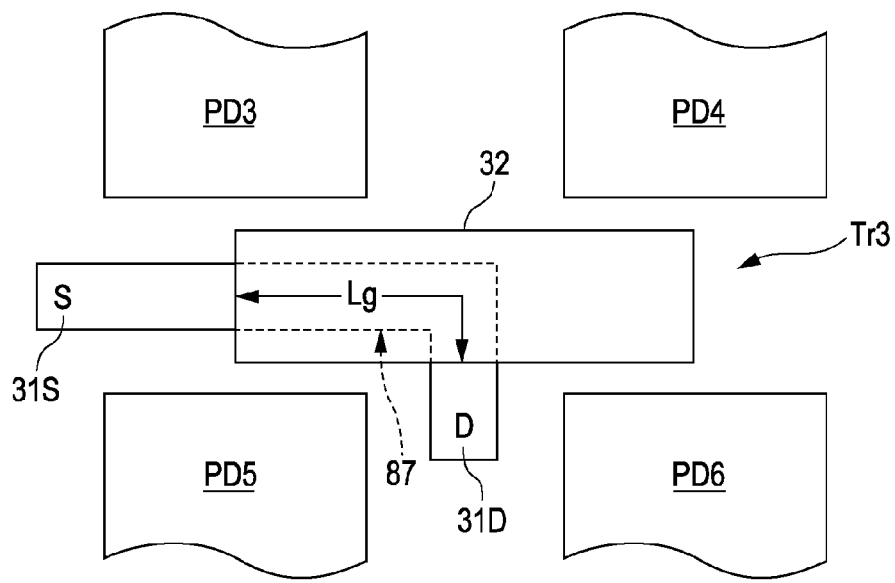
FIG. 51 is a layout diagram illustrating Modification 1 of an amplification transistor in the solid-state imaging device according to the embodiment of the present invention.

The amplification transistor Tr3 illustrated in FIG. 51 has a configuration such that an active region 87 extending from the source region 31S to the drain region 31D via a channel region is bent at a right angle, and the amplification gate electrode 32 is formed on a region including the bent portion. The active region 87 that is bent at a right angle into an L shape has one part thereof which is formed in the transverse direction between the rows of photodiodes PD and the other part thereof which is formed in the longitudinal direction between the columns of photodiodes PD. The amplification gate electrode 32 is formed in a straight-line shape in the transverse direction between the rows of photodiodes PD.

According to the amplification transistor Tr3 illustrated in FIG. 51, since the active region 87 is formed to be bent at a right angle, the gate length Lg increases, and thus the 1/f noise can be suppressed.

Figure 52:
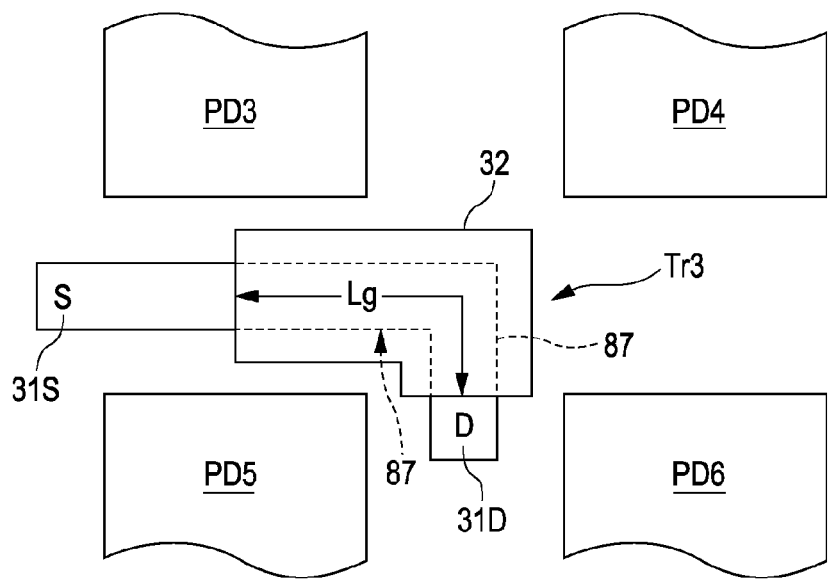
FIG. 52 is a layout diagram illustrating Modification 2 of an amplification transistor in the solid-state imaging device according to the embodiment of the present invention.

The amplification transistor Tr3 illustrated in FIG. 52 has a configuration such that an active region 87 extending from the source region 31S to the drain region 31D via a channel region is bent at a right angle, and the amplification gate electrode 32 is bent at a right angle so as to follow the bent active region 87. The active region 87 that is bent at a right angle into an L shape has one part thereof which is formed in the transverse direction between the rows of photodiodes PD and the other part thereof which is formed in the longitudinal direction between the columns of photodiodes PD. Similarly, the amplification gate electrode 32 that is bent at a right angle into an L shape has one part thereof which is formed in the transverse direction between the rows of photodiodes PD and the other part thereof which is formed in the longitudinal direction between the columns of photodiodes PD.

According to the amplification transistor Tr3 illustrated in FIG. 52, since the active region 87 is formed to be bent at a right angle, and the amplification gate electrode 32 is formed to be bent at a right angle so as to follow the active region 87, the gate length Lg increases further, and thus the 1/f noise can be suppressed. Here, as an element separation region around the active region 87, as described above, by using a flat element separation region which is formed in an impurity diffusion region (e.g., a p-type semiconductor region) and a flat insulating film is formed on a surface thereof, it is possible to prevent concentration of stress on the L-shaped bent portion of the active region 87. That is to say, generation of noise due to concentrated stress can be suppressed. However, when the element separation region has an STI structure, there is a concern that stress may be concentrated on the L-shaped bent portion of the active region 87, and thus noise may be generated due to the concentrated stress.

Figure 53:
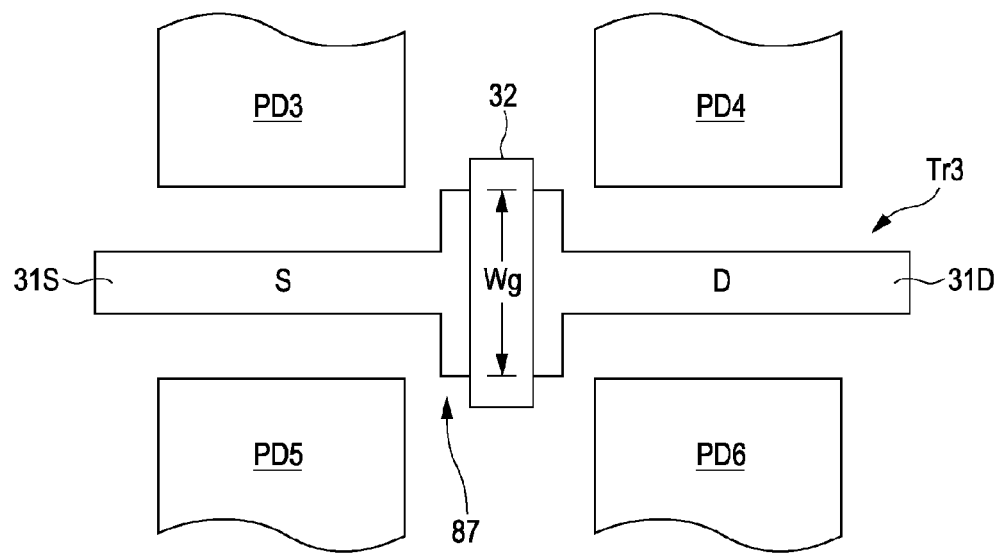
FIG. 53 is a layout diagram illustrating Modification 3 of an amplification transistor in the solid-state imaging device according to the embodiment of the present invention.

The amplification transistor Tr3 illustrated in FIG. 53 has a configuration such that an active region 87 including the source region 31S, the channel region, and the drain region 31D is formed in a cross shape, and the amplification gate electrode 32 is formed on the vertical portion of the channel region 87.

According to the amplification transistor Tr3 illustrated in FIG. 53, the gate width Wg increases, and thus the 1/f noise can be suppressed.

Figure 54:
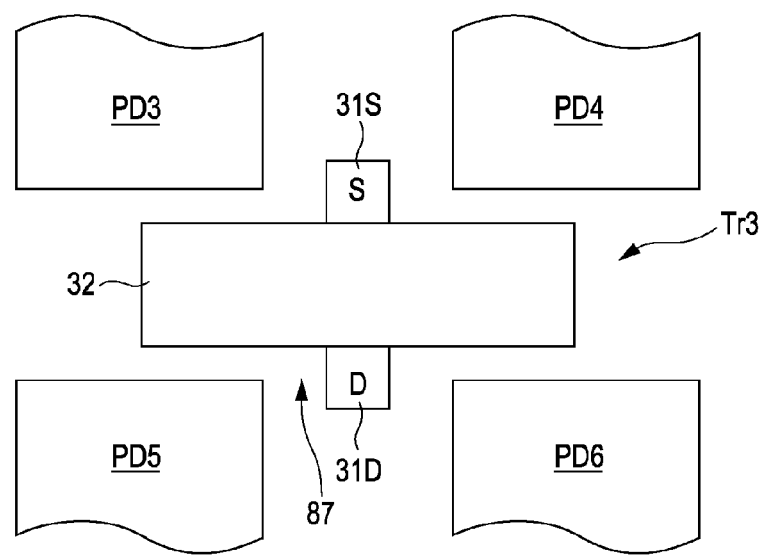
FIG. 54 is a layout diagram illustrating Modification 4 of an amplification transistor in the solid-state imaging device according to the embodiment of the present invention.

The amplification transistor Tr3 illustrated in FIG. 54 has a configuration such that an active region 87 including the source region 31S, the channel region, and the drain region 31D is in a straight-line ship in the longitudinal direction to be positioned between the columns of photodiodes PD. The amplification gate electrode 32 is formed in a straight-line shape in the transverse direction to be positioned between the rows of photodiodes PD with the source region 31S and the drain region 31D being extended from the active region 87.

Figure 55:
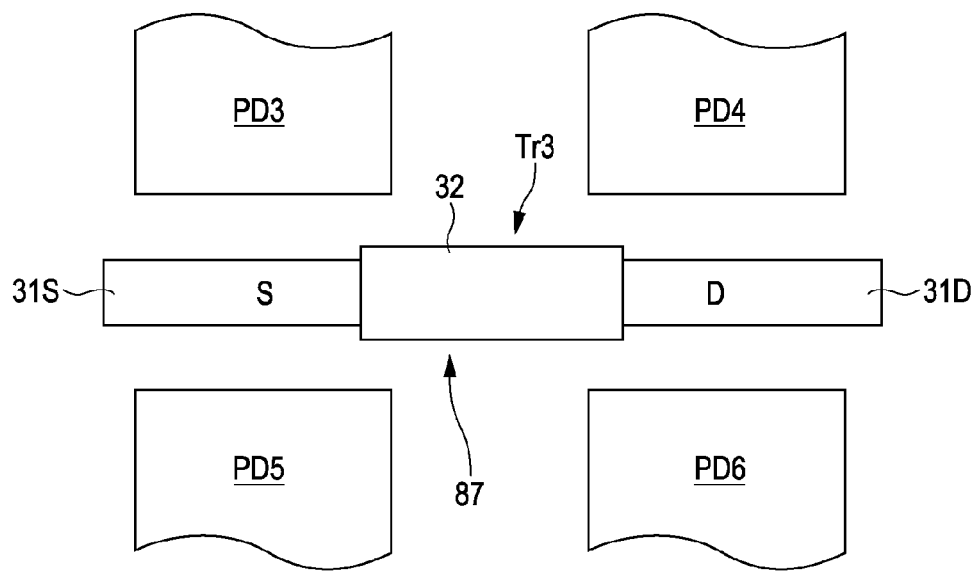
FIG. 55 is a layout diagram illustrating Modification 5 of an amplification transistor in the solid-state imaging device according to the embodiment of the present invention.

The amplification transistor Tr3 illustrated in FIG. 55 has a configuration such that an active region 87 which is positioned between the rows of photodiodes PD and includes the source region 31S, the channel region, and the drain region 31D is formed with a length of two pixel pitches, and the amplification gate electrode 32 is formed with a length smaller than two pixel pitches. Although the length in the gate length direction of the amplification gate electrode 32 is preferably set to be equal to or larger than one pixel pitch, it may be formed to be smaller than one pixel pitch.

Figure 56:
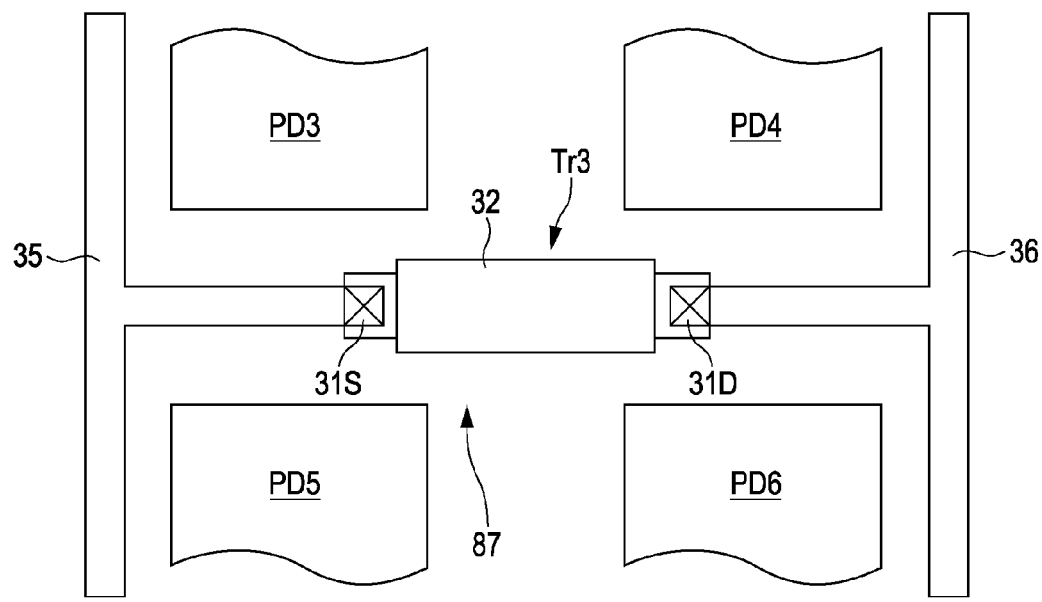
FIG. 56 is a layout diagram illustrating Modification 6 of an amplification transistor in the solid-state imaging device according to the embodiment of the present invention.

The amplification transistor Tr3 illustrated in FIG. 56 has a configuration such that an active region 87 which is positioned between the rows of photodiodes PD and includes the source region 31S, the channel region, and the drain region 31D is formed with a length smaller than two pixel pitches, and the amplification gate electrode 32 is formed on the channel region 87. The vertical signal line 35 and the power supply wiring 36 which are connected to the source region 31S and the drain region 31D, respectively, are formed so as partly to extend between the rows of photodiodes PD.

Figure 57:
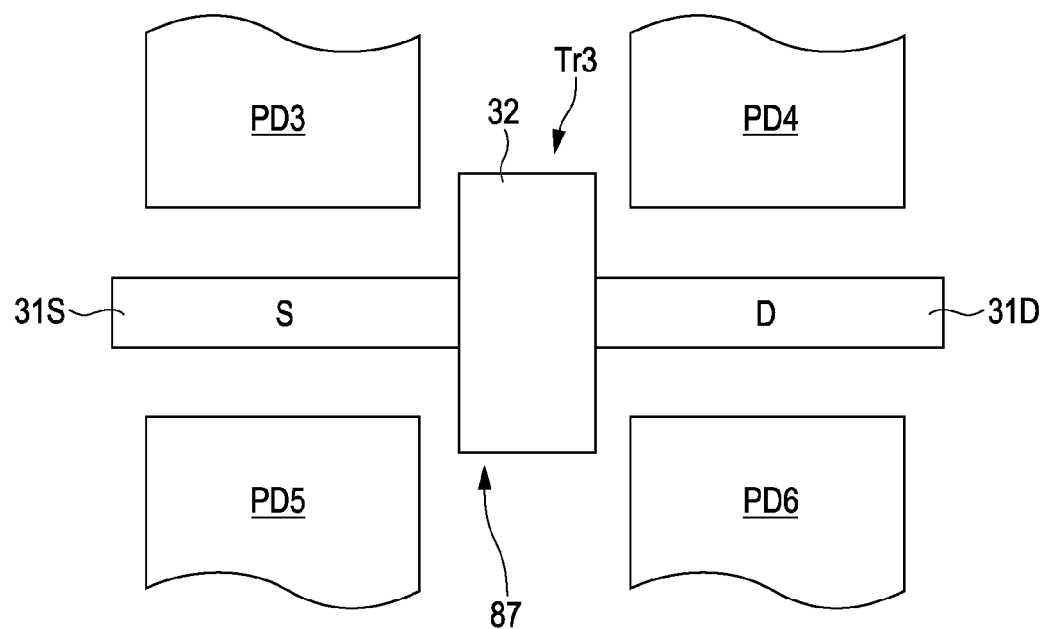
FIG. 57 is a layout diagram illustrating Modification 7 of an amplification transistor in the solid-state imaging device according to the embodiment of the present invention.

The amplification transistor Tr3 illustrated in FIG. 57 has a configuration such that an active region 87 which includes the source region 31S, the channel region, and the drain region 31D is formed in the transverse direction with a length of two pixel pitches, and the amplification gate electrode 32 is formed in the longitudinal direction to be vertical to the active region 87. The active region 87 is formed between the rows of photodiodes PD, and the amplification gate electrode 32 is formed between the columns of photodiodes PD.

These layouts of the amplification transistors Tr3 illustrated in FIGS. 51 to 57 can be applied to the solid-state imaging device according to the above-described embodiments of the present invention. Since the amplification transistor Tr3 is formed at the central portion of one sharing unit, the degree of freedom of the layout of the amplification transistor Tr3 can be increased as illustrated in FIG. 2 and FIGS. 51 to 57.

Modification of Reset Transistor

Figure 58:
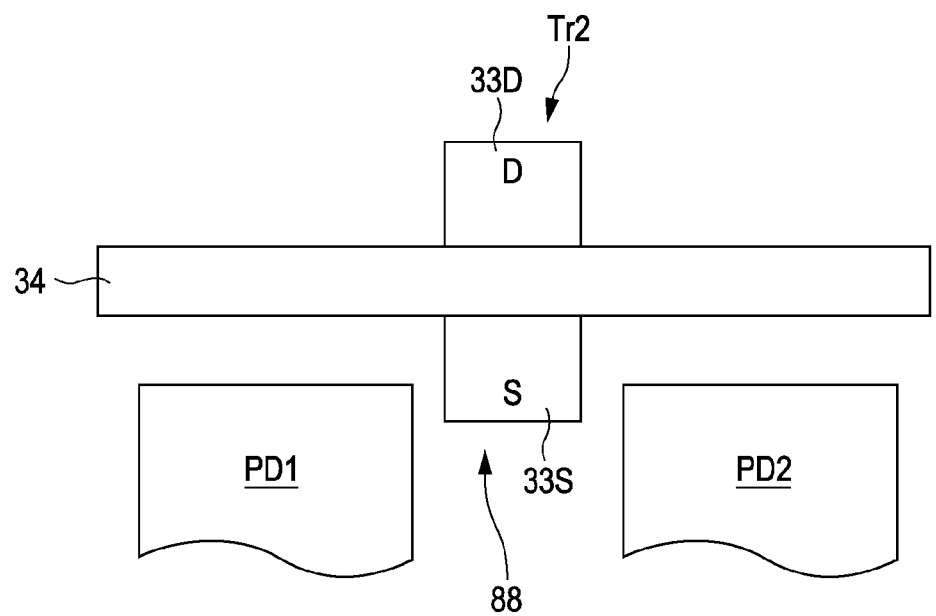
FIG. 58 is a layout diagram illustrating Modification 1 of a reset transistor in the solid-state imaging device according to the embodiment of the present invention.
Figure 59:
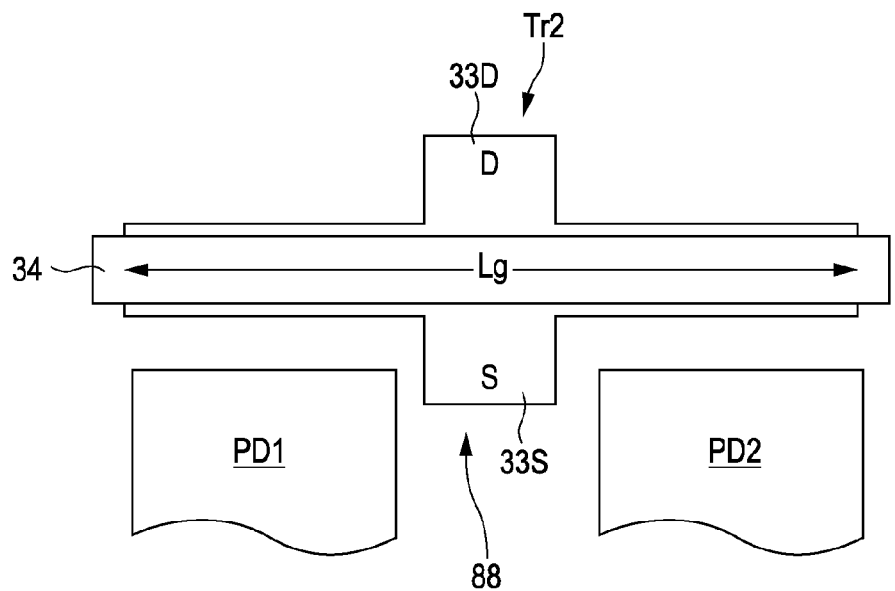
FIG. 59 is a layout diagram illustrating Modification 2 of a reset transistor in the solid-state imaging device according to the embodiment of the present invention.

With reference to FIGS. 58 and 59, modified examples of the reset transistor Tr3 are illustrated. The reset transistor Tr2 illustrated in FIG. 58 has a configuration such that an active region 88 including the source region 33S, the channel region, and the drain region 33D is formed in the longitudinal direction, and the reset gate electrode 34 is formed in the transverse direction with a length of two pixel pitches to be vertical to the active region 88.

According to the reset transistor Tr2 illustrated in FIG. 58, the reset gate electrode 34 is formed with a length of two pixel pitches. The reset transistor Tr2 can be well balanced with the amplification transistor Tr3 when it is combined with the amplification transistor Tr3 having the amplification gate electrode 32 with a length of two pixel pitches.

The reset transistor Tr2 illustrated in FIG. 59 has a configuration such that an active region 88 is formed in a cross shape having the channel region extending in the transverse direction and the source region 33S and the drain region 33D extending in the longitudinal direction, and the reset gate electrode 34 is formed in the transverse direction with a length of two pixel pitches.

According to the reset transistor Tr2 illustrated in FIG. 59, it is possible to increase the channel width Wg. Moreover, since the reset gate electrode 34 is formed with a length of two pixel pitches, it can be well balanced with the amplification transistor Tr3 when it is combined with the amplification transistor Tr3 having the amplification gate electrode 32 with a length of two pixel pitches.

These layouts of the reset transistors Tr2 illustrated in FIGS. 58 and 59 can be applied to the solid-state imaging device according to the above-described embodiments of the present invention. Since the reset transistor Tr2 is formed at the upper central portion of one sharing unit, the degree of freedom of the layout of the reset transistor Tr2 can be increased as illustrated in FIG. 2, FIG. 31, and FIGS. 58 and 59.

Although not illustrated in the figure, the above-described characteristic configurations of each embodiment can be combined with each other to form a solid-state imaging device.

In the examples above, the amplification transistor Tr3 is disposed at the center of the sharing unit 21, and the reset transistor Tr2 is disposed on the upper portion of the sharing unit 21. However, the transistors Tr2 and Tr3 may be disposed at reverse positions; that is, the reset transistor Tr2 may be disposed at the center of the sharing unit 21, and the amplification transistor Tr3 may be disposed on the upper portion of the sharing unit 21. However, the configuration in which the amplification transistor Tr3 is disposed at the center of the sharing unit 21, and the reset transistor Tr2 is disposed on the upper portion thereof is advantageous because the connection wiring does not intersect the readout wirings, and accordingly, the floating capacitance associated with the floating diffusions can be reduced.

In the examples above, one sharing unit includes an array of photodiodes of 8 pixels in total with 2 pixels by 4 pixels, respectively, in horizontal and vertical directions. However, one sharing unit may include an array of photodiodes of 2 pixels by 4n pixels (n is a positive integer), respectively, in horizontal and vertical directions, such as, for example, an array of photodiodes of 12 pixels in total with 2 pixels by 6 pixels, and an array of photodiodes of 16 pixels in total with 2 pixels by 8 pixels.

Embodiment 21

Exemplary Configuration of Solid-State Imaging Device

A solid-state imaging device according to the embodiment of the present invention can be applied to electronic apparatuses such as cameras and camcorders equipped with a solid-state imaging device, or other apparatuses equipped with a solid-state imaging device. In particular, since pixels can be miniaturized, a camera equipped with a small solid-state imaging device can be manufactured.

Figure 60:
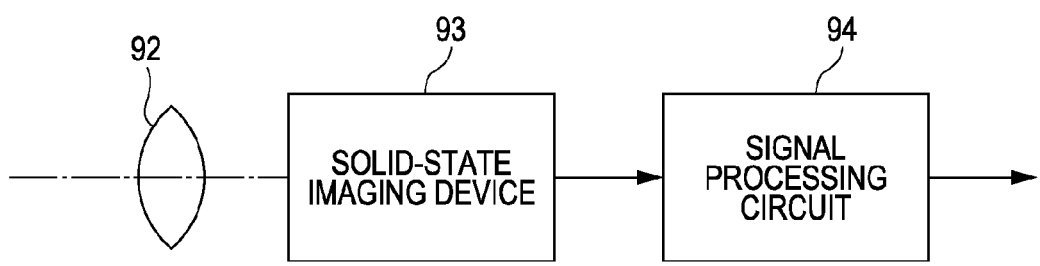
FIG. 60 is a diagram illustrating a schematic configuration of an electronic apparatus according to an embodiment of the present invention.

With reference to FIG. 60, an embodiment of a camera is illustrated as an example of an electronic apparatus according to the present invention. A camera 91 according to the present embodiment includes an optical system (optical lens) 92, a solid-state imaging device 93, and a signal processing circuit 94. The solid-state imaging device 93 is a solid-state imaging device according to any one of the above-described embodiments. The optical system 92 causes an image light (incident light) from a subject to be focused on an imaging surface of the solid-state imaging device 93. In this way, signal charges are accumulated for a predetermined period in photodiodes which are photoelectric conversion units of the solid-state imaging device 93. The signal processing circuit 94 performs various signal processing on the output signals from the solid-state imaging device 93 and outputs processed signals. The camera 91 of the present embodiment may take the form of a camera module in which the optical system 92, the solid-state imaging device 93, and the signal processing circuit 94 are integrated.

In the present invention, the configuration of the camera illustrated in FIG. 60 or camera which is represented by mobile phones, for example, and equipped with a camera module may be implemented as a so-called imaging function module that is a module with imaging capabilities in which the optical system 92, the solid-state imaging device 93, and the signal processing circuit 94 are integrated. The present invention may be applied to an electronic apparatus which is equipped with such an imaging function module.

According to the electronic apparatus of the present embodiment, even when pixels are miniaturized to realize higher definition, and thus a solid-state imaging device is further miniaturized, since the sensitivity of the solid-state imaging device can be improved, it is possible to provide a high-quality electronic apparatus capable of providing higher image quality and higher resolution.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device having a layout in which one sharing unit includes an array of photodiodes of 2 pixels by 4×n pixels, respectively, in first and second directions, where n is a positive integer, the sharing unit comprising:
   a first structural portion and a second structural portion which are arranged in the first direction of a pixel portion, each of the first and second structural portions including four readout gate electrodes and one floating diffusion with respect to four photodiodes;
   an amplification transistor which has at least a portion thereof disposed between the first structural portion and the second structural portion, the amplification transistor comprising a source region and a drain region;
   a select transistor which has at least a portion thereof disposed between the first structural portion and the second structural portion, the select transistor comprising a source region and a drain region; and
   a reset transistor comprising a source region and a drain region;
   wherein the source region of the select transistor is the same as the drain region of the amplification transistor,
   wherein a first connection wiring connects the first floating diffusion, the second floating diffusion, an amplification gate electrode of the amplification transistor, and the source region of the reset transistor,
   wherein a signal line connected to the source region of the amplification transistor and a first power wiring connected to the drain region of the select transistor both extend in a longitudinal direction in parallel to a select wiring,
   wherein a second connection wiring is formed in a transverse direction to connect with the select wiring, and
   wherein the second connection wiring covers an entire width of the sharing unit.

2. The solid-state imaging device according to claim 1, wherein readout wirings which are connected to the readout gate electrodes are formed in the transverse direction.

3. The solid-state imaging device according to claim 2, wherein the readout wirings are formed between adjacent pixels.

4. The solid-state imaging device according to claim 1, wherein the amplification transistor has an active region comprising the source region of the amplification transistor, the drain region of the amplification transistor, and a channel region,
   wherein the active region extends from the source region to the drain region of the amplification transistor via the channel region,
   wherein the active region is formed in a cross shape, and
   wherein the amplification gate electrode is formed on a vertical portion of the channel region.

5. The solid-state imaging device according to claim 1, wherein the reset transistor has an active region comprising the source region of the reset transistor, the drain region of the reset transistor, and a channel region,
   wherein the active region extends from the source region to the drain region of the reset transistor via the channel region,
   wherein the active region is formed in a cross shape having the channel region extending in the transverse direction and the source region and the drain region of the reset transistor extending in the longitudinal direction.

6. The solid-state imaging device according to claim 5, wherein a reset gate electrode of the reset transistor is formed in the transverse direction with a length of two pixel pitches.

7. The solid-state imaging device according to claim 2, wherein the first connection wiring, the second connection wiring, the first power wiring, the select wiring, and the readout wirings are formed in a four-layer wiring structure.

8. The solid-state imaging device according to claim 1, wherein dummy wirings are formed so as to sandwich the photodiodes.

9. An electronic apparatus comprising:
   a solid-state imaging device;
   an optical system that guides incident light to photodiodes of the solid-state imaging device; and
   a signal processing circuit that processes output signals from the solid-state imaging device;
   wherein the solid-state imaging device has a layout in which one sharing unit includes an array of photodiodes of 2 pixels by 4×n pixels, respectively, in first and second directions, where n is a positive integer, and the sharing unit comprises:
   a first structural portion and a second structural portion which are arranged in the first direction of a pixel portion, each of the first and second structural portions including four readout gate electrodes and one floating diffusion with respect to four photodiodes;
   an amplification transistor which has at least a portion thereof disposed between the first structural portion and the second structural portion, the amplification transistor comprising a source region and a drain region;
   a select transistor which has at least a portion thereof disposed between the first structural portion and the second structural portion, the select transistor comprising a source region and a drain region; and
   a reset transistor comprising a source region and a drain region;
   wherein the source region of the select transistor is the same as the drain region of the amplification transistor,
   wherein a first connection wiring connects the first floating diffusion, the second floating diffusion, an amplification gate electrode of the amplification transistor, and the source region of the reset transistor,
   wherein a signal line connected to the source region of the amplification transistor and a first power wiring connected to the drain region of the select transistor both extend in a longitudinal direction in parallel to a select wiring,
   wherein a second connection wiring is formed in a transverse direction to connect with the select wiring, and
   wherein the second connection wiring covers an entire width of the sharing unit.

10. The electronic apparatus according to claim 9, wherein readout wirings which are connected to the readout gate electrodes are formed in the transverse direction.

11. The electronic apparatus according to claim 10, wherein the readout wirings are formed between adjacent pixels.

12. The electronic apparatus according to claim 9, wherein the amplification transistor has an active region comprising the source region of the amplification transistor, the drain region of the amplification transistor, and a channel region, wherein the active region extends from the source region to the drain region of the amplification transistor via the channel region, wherein the active region is formed in a cross shape, and wherein the amplification gate electrode is formed on a vertical portion of the channel region.

13. The electronic apparatus according to claim 9, wherein the reset transistor has an active region comprising the source region of the reset transistor, the drain region of the reset transistor, and a channel region, wherein the active region extends from the source region to the drain region of the reset transistor via the channel region, wherein the active region is formed in a cross shape having the channel region extending in the transverse direction and the source region and the drain region of the reset transistor extending in the longitudinal direction.

14. The electronic apparatus according to claim 13, wherein a reset gate electrode of the reset transistor is formed in the transverse direction with a length of two pixel pitches.

15. The electronic apparatus according to claim 10, wherein the first connection wiring, the second connection wiring, the first power wiring, the select wiring, and the readout wirings are formed in a four-layer wiring structure.

16. The electronic apparatus according to claim 9, wherein dummy wirings are formed so as to sandwich the photodiodes.

* * * * *